United States Patent
Fukumoto et al.

(10) Patent No.: US 7,742,263 B2
(45) Date of Patent: *Jun. 22, 2010

(54) MAGNETORESISTANCE DEVICE WITH A DIFFUSION BARRIER BETWEEN A CONDUCTOR AND A MAGNETORESISTANCE ELEMENT AND METHOD OF FABRICATING THE SAME

(75) Inventors: Yoshiyuki Fukumoto, Tokyo (JP); Ken-ichi Shimura, Tokyo (JP); Atsushi Kamijo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/138,158

(22) Filed: Jun. 12, 2008

(65) Prior Publication Data
US 2008/0278867 A1 Nov. 13, 2008

Related U.S. Application Data
(62) Division of application No. 10/697,124, filed on Oct. 31, 2003, now Pat. No. 7,394,626.

(30) Foreign Application Priority Data
Nov. 1, 2002 (JP) .............................. 2002-319928

(51) Int. Cl.
*G11B 5/39* (2006.01)
(52) U.S. Cl. ................ 360/324.2; 360/322; 360/324.11
(58) Field of Classification Search ................. 360/322, 360/324.1, 324.11, 324.12, 324.2
See application file for complete search history.

(56) References Cited

U.S. PATENT DOCUMENTS 5,764,567 A * 6/1998 Parkin .................. 365/173

5,986,858 A 11/1999 Sato et al.

(Continued)

FOREIGN PATENT DOCUMENTS

EP 1 202 357 A2 5/2002

(Continued)

OTHER PUBLICATIONS

Z. Zhang et al., "Annealing effect of magnetic tunnel junctions with one FeOx layer inserted at the $Al_2O_3$/COFe interface", Applied Physics Letters, vol. 78, No. 19, May 7, 2001, pp. 2911-2913.

(Continued)

*Primary Examiner*—Jefferson Evans
(74) *Attorney, Agent, or Firm*—Sughrue Mion, PLLC

(57) ABSTRACT

A magnetoresistance device is provided for improving thermal stability of a magnetoresistance element by preventing inter-diffusion between a conductor (such as a via and an interconnection) for connecting the magnetoresistance element to another element and layers constituting the magnetoresistance element. A magnetoresistance device is composed of a magnetoresistance element, a non-magnetic conductor providing electrical connection between the magnetoresistance element to another element, and a diffusion barrier structure disposed between the conductor and the magnetoresistance element, the magnetoresistance element including a free ferromagnetic layer having reversible spontaneous magnetization, a fixed ferromagnetic layer having fixed spontaneous magnetization, and a tunnel dielectric layer disposed between the free and fixed ferroelectric layers.

8 Claims, 40 Drawing Sheets

U.S. PATENT DOCUMENTS

| | | | |
|---|---|---|---|
| 5,998,016 | A | 12/1999 | Sasaki et al. |
| 6,347,049 | B1 * | 2/2002 | Childress et al. ............ 365/173 |
| 6,469,926 | B1 * | 10/2002 | Chen ........................ 365/158 |
| 6,544,801 | B1 | 4/2003 | Slaughter et al. |
| 6,611,405 | B1 | 8/2003 | Inomata et al. |
| 6,710,987 | B2 | 3/2004 | Sun et al. |
| 6,801,414 | B2 | 10/2004 | Amano et al. |
| 6,897,532 | B1 | 5/2005 | Schwarz et al. |
| 6,903,909 | B2 | 6/2005 | Sharma et al. |
| 7,009,266 | B2 | 3/2006 | Shi et al. |
| 7,078,776 | B2 | 7/2006 | Nishinohara et al. |
| 7,180,141 | B2 | 2/2007 | Eliason et al. |
| 7,205,564 | B2 | 4/2007 | Kajiyama |
| 7,215,566 | B2 | 5/2007 | Kanegae |
| 7,264,974 | B2 | 9/2007 | Horng et al. |
| 7,371,587 | B2 * | 5/2008 | Drewes et al. ................ 438/3 |
| 7,379,280 | B2 * | 5/2008 | Fukumoto et al. ........ 360/324.2 |
| 7,576,956 | B2 * | 8/2009 | Huai ..................... 360/324.2 |
| 2002/0044396 | A1 | 4/2002 | Amano et al. |
| 2002/0102828 | A1 | 8/2002 | Schlosser |
| 2003/0134096 | A1 | 7/2003 | Chen et al. |
| 2003/0179601 | A1 | 9/2003 | Seyyedy et al. |
| 2004/0156232 | A1 | 8/2004 | Saito et al. |
| 2005/0219769 | A1 | 10/2005 | Shimura et al. |
| 2005/0276099 | A1 | 12/2005 | Horng et al. |

FOREIGN PATENT DOCUMENTS

| | | |
|---|---|---|
| JP | 62-132211 A | 6/1987 |
| JP | 2-195284 A | 8/1990 |
| JP | 3-268216 A | 11/1991 |
| JP | 10-65232 A | 3/1998 |
| JP | 10-261209 A | 9/1998 |
| JP | 10-269532 A | 10/1998 |
| JP | 11-316916 A | 11/1999 |
| JP | 2000-20922 A | 1/2000 |
| JP | 2000-144305 A | 5/2000 |
| JP | 2001-14843 A | 1/2001 |
| JP | 2001-84756 A | 3/2001 |
| JP | 2001-237471 A | 8/2001 |
| JP | 2002-25013 A | 1/2002 |
| JP | 2002-74627 A | 3/2002 |
| JP | 2002-094142 A | 3/2002 |
| JP | 2002-158381 A | 5/2002 |
| JP | 2002-163810 A | 6/2002 |
| JP | 2002-329903 A | 11/2002 |
| JP | 2003-188439 A | 7/2003 |
| JP | 2003-273420 A | 9/2003 |
| JP | 2003-324187 A | 11/2003 |
| JP | 2004-519859 A | 7/2004 |
| WO | 01/71735 A1 | 9/2001 |

OTHER PUBLICATIONS

K. Matsuda et al., "Reduced magnetoresistance in magnetic tunnel junctions caused by geometrical artifacts", Applied Physics Letters, vol. 77, No. 19, Nov. 6, 2000, pp. 3060-3062.

J.S. Moore et al., "Geometrically enhanced magnetoresistance in ferromagnet-insulator-ferromagnet tunnel junctions", Applied Physics Letters, vol. 69, No. 5, Jul. 29, 1996, pp. 708-710.

S. Ohnuma et al., "Soft Magnetic Films with High Electrical Resistivity", Journal of the Magnetics Society of Japan, vol. 19, No. 1, 1995, pp. 19-26.

J.J. Sun et al., "Low resistance and high thermal stability of spin-dependent tunnel junctions with synthetic antiferromagnetic CoFe/Ru/CoFe pinned layers", Applied Physics Letters, Apr. 24, 2000, vol. 76, No. 17, pp. 2424-2426.

S. Cardoso et al., "Influence of Ta antidiffusion barriers on the thermal stability of tunnel junctions", Applied Physics Letters, Jun. 19, 2000, vol. 76, No. 25, pp. 3792-3794.

T. Ochiai et al., "Improved Thermal Stability of Ferromagnetic Tunnel Junctions With a CoFe/CoFeOx/CoFe Pinned Layer", IEEE Transactions on Magnetics, Sep. 2003, vol. 39, No. 5, pp. 2797-2799.

\* cited by examiner

12': BOTTOM CONTACT LAYER

Fig. 21

| | LAYER CORRESPONDING TO OXIDE LAYER 13 | THERMAL TREATMENT TEMPERATURE AND SHEET RESISTANCE AFTER THERMAL TREATMENT (Ω/□) | | | |
|---|---|---|---|---|---|
| | | NO | 300°C | 350°C | 400°C |
| COMPARATIVE EXAMPLE 2 | NO | 4.5 | 6.2 | 44.3 | 53.5 |
| EXAMPLE 2 | $Al_2O_3$ (1nm) | 4.3 | 4.2 | 4 | 5.1 |
| EXAMPLE 3 | Mgo (1nm) | 4.7 | 4.2 | 4.5 | 5.1 |

Fig. 25

| | LAYER CORRESPONDING TO OXIDE LAYER 14 | THERMAL TREATMENT TEMPERATURE AND SATURATED MAGNETIZATION AFTER THERMAL TREATMENT (emu/cc) | | | | |
|---|---|---|---|---|---|---|
| | | NO | 200°C | 300°C | 380°C | 400°C |
| COMPARATIVE EXAMPLE 4 | NO | 744 | 736 | 692 | 455 | 35 |
| COMPARATIVE EXAMPLE 5 | NO | 748 | 744 | 724 | 633 | 610 |
| EXAMPLE 5 | $Al_2O_3$ (1nm) | 783 | 787 | 775 | 771 | 772 |
| EXAMPLE 6 | MgO (1nm) | 775 | 771 | 775 | 774 | 773 |

K1//K2//K3

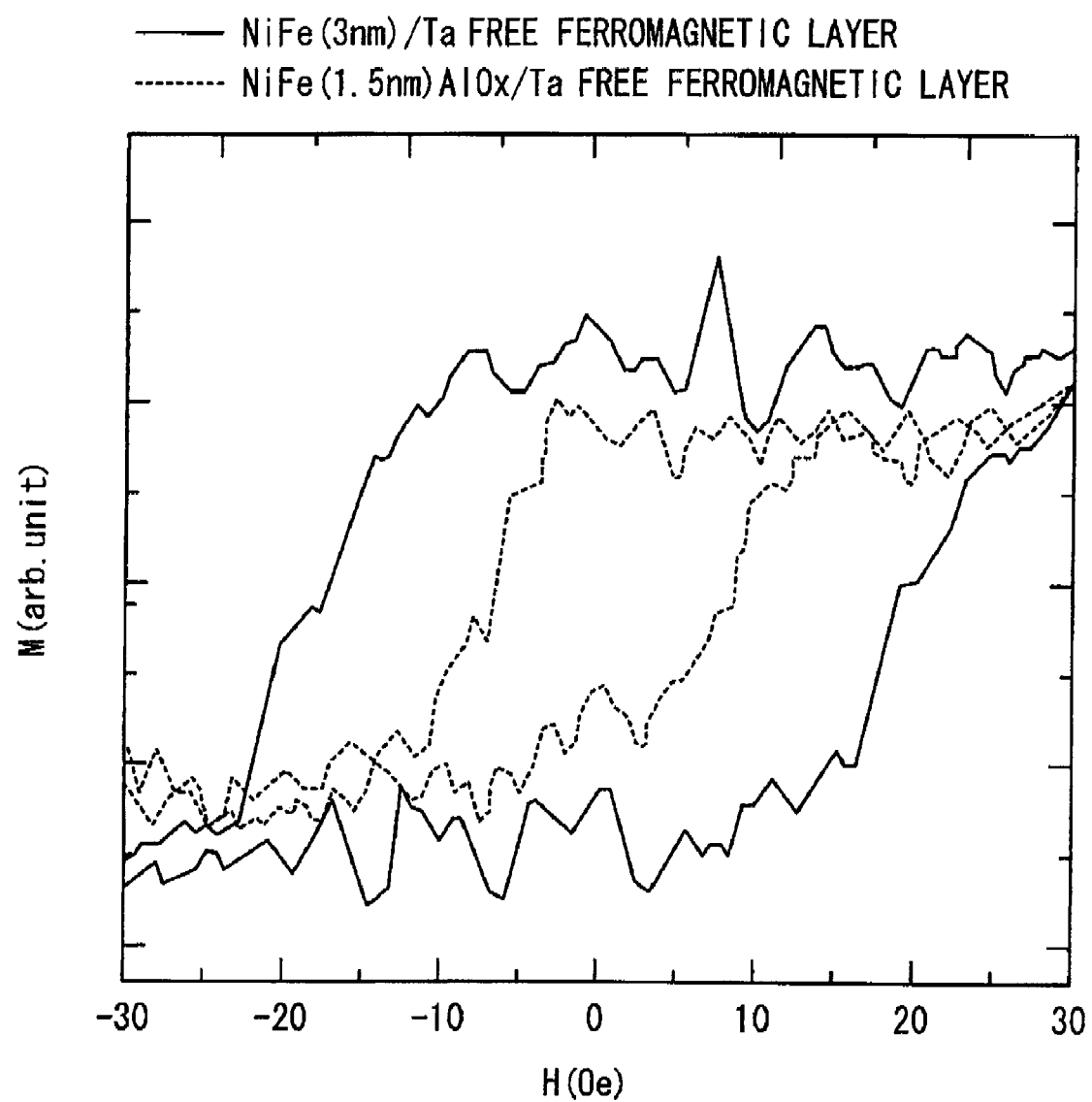

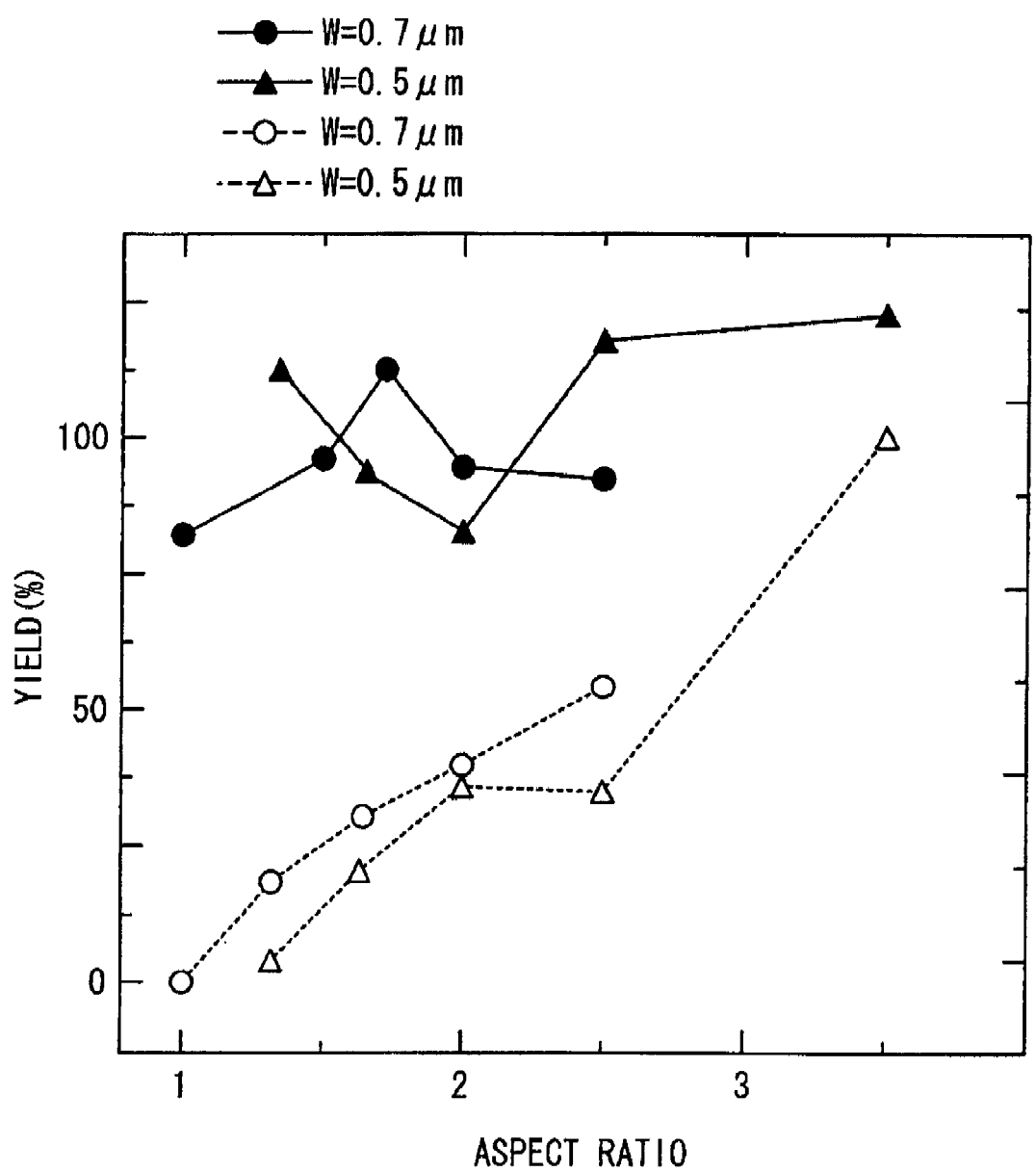

MAGNETORESISTANCE DEVICE WITH A DIFFUSION BARRIER BETWEEN A CONDUCTOR AND A MAGNETORESISTANCE ELEMENT AND METHOD OF FABRICATING THE SAME

This application is a divisional of U.S. application Ser. No. 10/697,124, filed Oct. 31, 2003, and is related to U.S. application Ser. No. 10/539,373, filed Jun. 16, 2005, now U.S. Pat. No. 7,379,280, issued May 27, 2008.

BACKGROUND OF THE INVENTION

1. Field of the Invention

The present invention is related to a magnetoresistance device and method of fabricating the same, particularly, to a magnetoresistance device including a magnetic tunnel junction (MTJ), which exhibits a tunneling magnetoresistance effect (TMR), and method of fabricating the same.

2. Description of the Related Art

A resistance of a magnetic tunnel junction, which consists of two ferromagnetic layers and a tunnel barrier layer (or a tunnel dielectric layer) disposed therebetween, changes depending on the relative direction of the magnetizations of the magnetic tunnel junction. Such phenomenon is known as a tunnel magnetoresistance effect. Measuring the resistance of the magnetic tunnel junction allows the detection of the direction of the ferromagnetic layers. Making use of such characteristics of the magnetic tunnel junction, magnetoresistance devices including magnetic tunnel junctions are used for magnetic random access memories (MRAMs), which store data in a non-volatile fashion, and magnetic read heads for hard disc drives.

Magnetoresistance elements, which include a magnetic tunnel junction, are typically composed of a fixed magnetic layer, a free ferromagnetic layer, and a tunnel dielectric layer disposed between the fixed and free magnetic layers. The fixed magnetic layer has spontaneous magnetization whose direction is fixed, while the free magnetic layer has spontaneous magnetization whose direction is reversible.

In order to tightly fix spontaneous magnetization, fixed ferromagnetic layers are often formed to be in contact with antiferromagnetic layers. Exchange interaction provided by an antiferromagnetic layer tightly fixes the spontaneous magnetization of a fixed ferromagnetic layer. In general, antiferromagnetic layers are formed of manganese-including antiferromagnetic materials, such as IrMn, and PtMn.

Furthermore, a free ferromagnetic layer is often composed of hard and soft ferromagnetic layers, the hard ferromagnetic layer being made of ferromagnetic materials having high spin polarization ratios, and the soft magnetic layer being made of soft ferromagnetic materials. Such structure of a free ferromagnetic layer reduces the coercive force of the spontaneous magnetization of the free ferromagnetic layer with an increased magnetoresistance ratio (MR ratio) of the magnetic tunnel junction. Hard ferromagnetic layers are generally made of cobalt-including ferromagnetic materials, such as Co and CoFe, while soft ferromagnetic layers are generally made of nickel-including ferromagnetic materials, such as NiFe.

One of the issues of magnetoresistance elements is thermal stability. Subjecting magnetoresistance elements to a high temperature causes interdiffusion between layers incorporated therein. This interdiffusion deteriorates the characteristics of the magnetoresistance elements, especially the magnetoresistance ratio. Patent document 1 presents a problem concerning interdiffusion between hard and soft ferromagnetic layers. The essential point is that nickel included in the soft ferromagnetic layer is diffused into the hard ferromagnetic layer. Diffusion of nickel into a hard ferromagnetic layer deteriorates the magnetoresistance element. Japanese Open Laid Patent Application No. P2000-20922A discloses that an oxide or nitride layer for preventing interdiffusion is disposed between hard and soft ferromagnetic layers. Japanese Open Laid Patent Application No. Jp-A 2002-158381 addresses a problem that manganese from manganese-including antiferromagnetics diffuses into fixed ferromagnetic layers. This documents discloses a technique for avoiding diffusion of manganese into a fixed ferromagnetic layer by incorporating two ferromagnetic layers and a dielectric or amorphous layer disposed therebetween into the fixed magnetic layer. Japanese Open Laid Patent Application No. Jp-A 2001-237471 discloses a technique for improving thermal stability of magnetoresistance elements by inserting magnetic oxide layers into fixed and free ferromagnetic layers. Japanese Open Laid Patent Application No. Jp-A-Heisei 10-65232 addresses a problem of interdiffusion between a free ferromagnetic layer and a buffer layer disposed under the free ferromagnetic layer. This document discloses a technique for reducing the thermally induced diffusion into the buffer layer and thereby improving thermal stability by disposing an atomic diffusion barrier layer formed of oxides, nitrides, carbides, borides, or fluorides between the free ferromagnetic layer and the buffer layer.

Japanese Open Laid Patent Application No. Jp-A 2002-74627 discloses a technique for increasing electron reflectivity and thereby improving thermal stability by disposing a high conductivity layer and an electron reflection layer which is substantially crystalline, and mainly includes an element different from the main element used for the high conductivity layer. This document also discloses that the electron reflection layer includes a first layer close to the free magnetic layer, and a second layer far from the free magnetic layer, the first layer consisting of an oxide of an element that is more easily oxidized than that consisting of the second layer.

Another issue of magnetoresistance elements is reduction in coercive forces of free ferromagnetic layers. A free ferromagnetic layer composed of a layered structure including hard and soft ferromagnetic layers may not have the coercive force reduced sufficiently in the case that an increased MR ratio is required.

Reduction of the coercive force can be achieved by reducing the product of magnetization $M_s$ and thickness t of the free ferromagnetic layer (which is referred to as "the product $M_s \cdot t$", hereinafter). An explanation of the reason is given in the following. For a uniaxial free ferromagnetic layer, the coercive field thereof depends on a total anisotropy field of the free ferromagnetic layer. For the magnetoresistance element having the size of the sub-micron order, a total anisotropy field of the free ferromagnetic layer mostly arises from the shape-induced anisotropy field of the free ferromagnetic layer. Therefore, the coercive force of the ferromagnetic layer is approximately equal to the shape-induced anisotropy field $H_a$. For this case, the anisotropy field $H_a$ is represented by the following equation (1):

$$H_a = 4\pi M_s (N_x - N_y), \tag{1}$$

where $M_s$ is the saturated magnetization of the free ferromagnetic layer, and $N_x$ and $N_y$ are demagnetization factors of the magnetoresistance element in the directions along the long and short sides, respectively. For a given thickness of the free ferromagnetic layer, $N_x - N_y$ increases as an increase in the ratio of the long side to the short side (or the aspect ratio), and this results in an increase in the shape-induced anisotropy field $H_a$. Furthermore, the reduction in the size of the free ferromagnetic layer increases the anisotropy field $H_a$, because of the increase in the demagnetization factors as the reduction in the size of the free ferromagnetic layer. For a fixed aspect ratio, the anisotropy field $H_a$ is approximately described by the following equation (2):

$$H_a \cong 4\pi M_s \cdot t/W, \quad (2)$$

where W is the length of the short side of the free ferromagnetic layer, and t is the thickness of the free ferromagnetic layer. The equation (2) indicates that the coercive force of the free ferromagnetic layer can be reduced by reducing the product $M_s \cdot t$. In general, reducing the thickness t of the free ferromagnetic layer achieves the reduction in product $M_s \cdot t$, and thereby reduces the coercive force of the free ferromagnetic layer.

Additionally, Zhang et al. discloses a magnetic tunnel junction including an $FeO_x$ layer disposed between an $Al_2O_3$ layer and a CoFe layer, in Applied Physics Letters vol. 89, No. 19, 7 May 2001, pp. 2911-2913.

Furthermore, Matsuda et al. discloses that magnetoresistances of magnetic tunnel junctions are reduced by a geometrical structure of the junctions in Applied Physics Letters, vol. 77, No. 19, 6 Nov. 2000, pp. 3060-3062.

In addition, Moodera et al. discloses magnetoresistances of magnetic tunnel junctions are increased by a geometrical structure of the junctions in Applied Physics Letters, vol. 69, No. 5, 29 Jul. 1996, pp. 708-710.

Also, Ohnuma et al. discloses a technique for forming a highly resistive soft magnetic film with granular metal consisting of cobalt base alloy, iron base alloy, and a non-magnetic oxide or nitride.

The inventor of the present invention has discovered that interdiffusion between a magnetoresistance element and a conductor electrically connecting the magnetoresistance element to other elements causes an undesirable influence on the characteristics of the magnetoresistance element. Operating a magnetoresistance element requires electrical connections of the magnetoresistance element with other elements (such as transistors). Therefore, a magnetoresistance element is connected to conductors such as via contacts and interconnections that are electrically connected to other elements. In general, such conductors are formed of aluminum, copper, tungsten, or titan nitride, as is the case of other semiconductor integrated circuits. Tantalum, ruthenium, zirconium, or molybdenum may be used for a conductor providing electrical connections between magnetoresistance elements and other elements. The interdiffusion between a magnetoresistance element and a conductor that electrically connects the magnetoresistance element to other elements causes the following three influences.

Firstly, the diffusion of material included in the conductor into the magnetic tunnel junction reduces the MR ratio thereof. For a conductor including aluminum, diffusion of aluminum into the magnetic tunnel junction is especially serious, because aluminum is diffused by applying relatively low temperature. In another aspect, the diffusion of the material of the conductor is essential because the diffusion of material included in the conductor, especially aluminum, into the antiferromagnetic layer and the soft ferromagnetic layer promotes the diffusion of manganese from the antiferromagnetic layer and nickel from the soft ferromagnetic layer into the tunnel barrier layer.

Secondly, the diffusion of material included in the magnetoresistance element into the conductor, which electrically connects the magnetoresistance element with other elements, increases the resistance of the conductor. The increase in the resistance of the conductor deteriorates the SN ratio for detecting the resistance of the magnetic tunnel junction. Especially, since manganese included in the antiferromagnetic layer, and nickel in the soft ferromagnetic layer are diffused by relatively low temperature, the increase in the resistance caused by the diffusion of manganese and nickel is of significance.

Thirdly, thermal diffusion of material of the free ferromagnetic layer into the conductor that electrically connects the free ferromagnetic layer with other elements makes it difficult to achieve reduction in the coercive force through reducing the thickness t of the free ferromagnetic layer. This is because diffusion caused by a thermal treatment causes a large change in the characteristics thereof, and thus reduces operation reliability of the magnetoresistance element when the free ferromagnetic layer is decreased in the thickness. FIG. 26 is a graph illustrating influences caused by thermal treatments on $4\pi M_s \cdot t$ of free ferromagnetic layers having reduced thicknesses t. The characteristics of the free ferromagnetic layers are obtained under the condition described in the following; the structure of the samples is sub./Ta(10 nm)/$AlO_x$/$Ni_{81}Fe_{19}$/Ta(10 nm). The $AlO_x$ films are formed through oxidizing aluminum films having a thickness of 1.5 nm. The thicknesses of the $Ni_{81}Fe_{19}$ films are selected out of the values of 3.0 nm, 2.6 nm, and 2.2 nm. The $Ni_{81}Fe_{19}$ films deposited through sputtering. The temperature of the thermal treatment ranges between 250° and 400° C., and the duration is 30 minutes. Magnetizations $M_s$ are measured with a vibration magnetometer.

As illustrated in FIG. 26, thermal treatment on the $Ni_{81}Fe_{19}$ films having thicknesses t less than 30 nm causes drastic changes in $4\pi M_s \cdot t$ thereof; furthermore $4\pi M_s \cdot t$ is remarkably decreased as the decrease in the thickness t and the increase of the temperature of the thermal treatment. These samples exhibit poor repeatability. As thus-described, thermal treatment destabilizes $4\pi M_s \cdot t$ of the free ferromagnetic layer when the thickness thereof is reduced down to 3 nm. Such instability prevents reduction of the thickness t of free ferromagnetic layers.

There is a need for providing a technique for reducing interdiffusion between a magnetoresistance element and a conductor providing electrical connections between the magnetoresistance element and other elements.

SUMMARY OF THE INVENTION

An object of the present invention is to provide a technology for further improving thermal stability of a magnetoresistance element.

Another object of the present invention is to provide a technology for further improving thermal stability of a magnetoresistance element through preventing interdiffusion between layers incorporated within the magnetoresistance element and a conductor (such as a via contact and an interconnection) that electrically connects the magnetoresistance element with other elements.

Still another object of the present invention is to provide a technology for preventing a phenomenon in which a resistivity of a conductor that provides electrical connections between a magnetoresistance element and other elements is increased by diffusion of material included in layers incorporated within the magnetoresistance element, especially nickel and manganese, into the conductor.

Still another object of the present invention is to provide a technology for a phenomenon in which characteristics of a magnetoresistance element is deteriorated by diffusion of material included in a conductor that electrically connects the magnetoresistance element with other elements into the magnetoresistance element.

Still another object of the present invention is to provide a technology which prevents a phenomenon in which characteristics of a magnetoresistance element is deteriorated by diffusion of manganese or nickel, which are included in the magnetoresistance element, into the tunnel dielectric layer of the magnetoresistance element, while maintaining magnetic or electrical coupling within the fixed and free ferromagnetic layers of the magnetoresistance element.

Still another object of the present invention is to provide a technology for achieving reduction in the thickness of a free ferromagnetic layer to thereby reduce the coercive force thereof.

Still another object of the present invention is to provide a technology for reducing the thickness of the free ferromagnetic layer, and reducing the coercive force thereof through preventing diffusion of material included in a free ferromagnetic layer.

Still another object of the present invention is to provide a technology for reducing a coercive force with superior rectangularity of the magnetoresistance curve of a free ferromagnetic layer and reduced variances of the coercive force, and thereby achieving reduction in an aspect ratio and size of the magnetoresistance element.

In one aspect of the present invention, a magnetoresistance device in accordance with the present invention is composed of a magnetoresistance element, a non-magnetic conductor that electrically connects the magnetoresistance element with another element, and a diffusion barrier structure disposed between the conductor and the magnetoresistance element, wherein the magnetoresistance element includes a free ferromagnetic layer having reversible free spontaneous magnetization, a fixed ferromagnetic layer having fixed spontaneous magnetization, and a tunnel dielectric layer disposed between the free and fixed ferromagnetic layers. The conductor which electrically connects the magnetoresistance element is typically composed of a via contact and an interconnection layer.

The diffusion barrier structure is designed to have a function for preventing at least one material of the conductor from being diffused into the magnetoresistance element. Furthermore, the diffusion barrier structure is designed to have a function for preventing at least one material of the magnetoresistance element from being diffused into the magnetoresistance element.

It is important to design the diffusion barrier structure for preventing both diffusions from the conductor into the magnetoresistance element and from the magnetoresistance element into the conductor. One of the diffusions from the conductor into the magnetoresistance element and from the magnetoresistance element into the conductor causes another diffusion. Therefore, the fact that an oxidization layer prevents both of these diffusions is quite preferable in terms of improvement of the magnetoresistance element.

Such structure is effective in the case that the conductor includes at least one element selected from among the group consisting of Al, Cu, Ta, Ru, Zr, Ti, Mo, and W.

The diffusion barrier structure is preferably formed of material selected among from the group consisting of oxides, nitrides, and oxynitrides. These materials are easy to be formed densely, and thus provide an improved diffusion barrier. The formation of the diffusion barrier structure with conductive nitrides desirably reduces the resistance thereof, and thereby improves SN ratio of the magnetoresistance element. The diffusion barrier structure preferably consists of oxide of element having a free energy of oxide formation less than those of elements included in layers connected on top and bottom surfaces of the diffusion barrier structure. The diffusion barrier structure preferably consists of nitride of element having a free energy of nitride formation less than those of elements included in layers connected on top and bottom surfaces of the diffusion barrier structure. Correspondingly, the diffusion barrier structure preferably consists of oxynitride of element having free energies of oxide and nitride formations less than those of elements included in layers connected on top and bottom surfaces of the diffusion barrier structure. In detail, the diffusion barrier structure is preferably formed of material selected from among the group consisting of $AlO_x$, $MgO_x$, $SiO_x$, $TiO_x$, $CaO_x$, $LiO_x$, $HfO_x$, AlN, AlNO, SiN, SiNO, TiN, TiNO, BN, TaN, HfNO, and ZrN.

In the case that the diffusion barrier structure is formed of oxide, it would be preferable if the tunnel dielectric layer and the diffusion barrier structure are formed of the same material. Such structure effectively reduces the cost required for depositing the tunnel dielectric layer and the diffusion barrier layer. In this case, the diffusion barrier layer is preferably thinner than the tunnel dielectric layer. Additionally, in order to increase the SN ratio of detecting the direction of the spontaneous magnetization of the free ferromagnetic layer, the through-thickness resistance of the oxide layer is preferably smaller than that of the tunnel dielectric layer.

When the conductor includes first and second conductors, the first conductor being electrically connected to the fixed ferromagnetic layer without involving the tunnel dielectric layer, and the second conductor being electrically connected to the free ferromagnetic layer without involving the tunnel dielectric layer, the diffusion barrier structure preferably includes first and second diffusion barrier layers, the first diffusion barrier layer being disposed between the first conductor and the fixed ferromagnetic layer, and the second diffusion barrier layer being disposed between the second conductor and the free ferromagnetic layer. Such structure effectively prevents both of the two kinds of interdiffusions: one between the fixed ferromagnetic layer and the first conductor, and the other between the free ferromagnetic layer and the second conductor. The first and second diffusion barrier layers are preferably formed of material selected from among the group consisting of oxides, nitrides, and oxynitrides.

The magnetoresistance device may include a manganese-including layer. A layer formed of antiferromagnetic layer such as PtMn, and IrMn is a typical manganese-including layer. In this case, the oxide layer is preferably disposed between the manganese-including layer and the conductor. In another embodiment, the magnetoresistance device may include a nickel-including layer. A layer formed of magnetically soft ferromagnetic material such as NiFe is a typical nickel-including layer. In this case, the oxide layer is preferably disposed between the nickel-including layer and the conductor.

When the conductor includes a first conductor electrically connected to the fixed ferromagnetic layer without involving the tunnel dielectric layer, the oxide layer includes a first oxide layer formed of oxide and disposed between the fixed ferromagnetic layer, and the magnetoresistance element includes a manganese-including antiferromagnetic layer connected to the fixed ferromagnetic layer, then the antiferromagnetic layer is preferably positioned between the fixed ferromagnetic layer and the first oxide layer. This structure effectively prevents the diffusion of manganese from the antiferromagnetic layer to the first conductor.

It would be preferable if the fixed ferromagnetic layer includes a ferromagnetic layer directly contacted with the tunnel dielectric layer, and a composite magnetic layer disposed between the ferromagnetic and antiferromagnetic layers, the composite magnetic layer being formed of mixture of non-oxidized metal ferromagnetic material as main material and oxide of non-magnetic element more reactive to oxygen than the metal ferromagnetic material as sub material. The composite magnetic layer having this structure effectively prevents the diffusion of manganese included in the antiferromagnetic layer into the tunnel dielectric layer while allowing exchange interaction from the antiferromagnetic layer to the ferromagnetic layer. This results in that the composite magnetic layer and the ferromagnetic layer functions as the fixed ferromagnetic layer, and that deterioration of the magnetic tunnel junction, which is potentially caused by diffusion of manganese, is reduced. The ferromagnetic layer and the metal ferromagnetic material included in the composite magnetic layer preferably are formed of metal ferromagnetic alloy mainly consisting of cobalt. Cobalt has a high spin polarization ratio and exhibits high oxidization-resistance, while being hard to be diffused because of its thermally stability.

The free ferromagnetic layer preferably includes a ferromagnetic layer directly contacted with the tunnel dielectric layer and a composite magnetic layer connected to the ferromagnetic layer, wherein the composite magnetic layer is formed of mixture of non-oxidized metal ferromagnetic material as main material, and oxide material as sub material, the oxide material being oxide of non-magnetic element more reactive to oxygen than the metal ferromagnetic material. The composite magnetic layer having this structure is relatively magnetically soft because of its reduced crystalline magnetic anisotropy, and thus allows the free ferromagnetic layer to be magnetically soft without including nickel.

In the case that the free ferromagnetic layer includes nickel and the conductor includes a second conductor electrically connected to the free ferromagnetic layer without involving the tunnel dielectric layer, the oxide layer preferably includes a second oxide layer disposed between the free ferromagnetic layer and the second conductor. This structure effectively prevents the diffusion of material included in the second conductor into the magnetoresistance element while preventing the diffusion of nickel included in the free ferromagnetic layer into the second conductor.

In this case, the second oxide layer is preferably in direct contact with a nickel-including ferromagnetic layer incorporated within the free ferromagnetic layer. This structure avoids the change in the composition of the nickel-including ferromagnetic layer, and thereby improves the characteristics of the magnetoresistance element.

It is also preferable that the free ferromagnetic layer includes a first nickel-free ferromagnetic layer, a composite magnetic layer, and a nickel-including second ferromagnetic layer, the first ferromagnetic layer being directly contacted with the tunnel dielectric layer, wherein the composite magnetic layer is formed of mixture of non-oxidized metal ferromagnetic material as main material, and oxide material as sub material, the oxide material being oxide of non-magnetic element more reactive to oxygen than the metal ferromagnetic material, and the second ferromagnetic layer being connected to the composite magnetic layer and magnetically softer that the composite magnetic layer and the first ferromagnetic layer. The composite magnetic layer prevents diffusion of nickel from the second ferromagnetic layer into the tunnel dielectric layer, while allowing the second ferromagnetic layer to effect exchange interaction on the first ferromagnetic layer. This achieves a magnetically soft magnetic resistance device with reduced nickel diffusion into the tunnel dielectric layer. The metal ferromagnetic material included in the first ferromagnetic layer and the composite magnetic layer preferably consists of metal ferromagnetic alloy mainly consisting of cobalt. Cobalt has a high spin polarization ratio and exhibits high oxidization-resistance, while being hard to be diffused because of its thermally stability.

The free ferromagnetic layer preferably includes a first ferromagnetic layer directly connected to the tunnel dielectric layer, a first composite magnetic layer connected to the first ferromagnetic layer, a second composite magnetic layer, and a non-magnetic layer disposed between the first and second composite magnetic layer to provide antiferromagnetically coupling therebetween, the first and second composite magnetic layer includes mixture of non-oxidized metal ferromagnetic material and non-magnetic metal oxide. The non-magnetic layer keeps the spontaneous magnetization of the second composite magnetic layer antiparallel to those of the first composite magnetic layer and the first ferromagnetic layer, and thereby makes the free ferromagnetic layer magnetically softer. This structure allows the free ferromagnetic layer to be magnetically soft without including nickel.

In order to make the free ferromagnetic layer magnetically softer, it is preferable that the free ferromagnetic layer further includes a second ferromagnetic layer connected to the second composite magnetic layer, which includes nickel and is magnetically softer than the first and second composite magnetic layers and the first ferromagnetic layer. Nickel included in the second ferromagnetic layer makes the free ferromagnetic layer magnetically softer. It should be noted that the first and second composite magnetic layers avoid a problem that nickel is potentially diffused into the tunnel dielectric layer. The first ferromagnetic layer, the metal ferromagnetic material included in the first and second composite magnetic layers are preferably formed of metal ferromagnetic alloy mainly consisting of cobalt. Cobalt has a high spin polarization ratio and exhibits high oxidization-resistance, while being hard to be diffused because of its thermally stability.

For the free ferromagnetic layer including the first and second composite magnetic layers and the non-magnetic layer, it is preferable that the free ferromagnetic layer further includes a third ferromagnetic layer disposed between the first composite magnetic layer and the non-magnetic layer, and a fourth ferromagnetic layer disposed between the second composite magnetic layer and the non-magnetic layer, the third and fourth ferromagnetic layers being formed of metal ferromagnetic layers mainly consisting of cobalt.

When the magnetoresistance device further includes a magnetic bias element providing the free ferromagnetic layer with a bias magnetic field, the magnetic bias element being composed of a magnetic bias ferromagnetic layer, and a magnetic bias antiferromagnetic layer including manganese and connected to the magnetic biasing ferromagnetic layer, then the oxide layer preferably includes a first oxide layer disposed between the magnetic bias element and the free ferromagnetic layer, and a second oxide layer disposed between the magnetic bias element and the second conductor.

In the case that the conductor includes a second conductor electrically connected to the free ferroelectric layer without involving the tunnel dielectric layer, the diffusion barrier structure preferably includes a second diffusion barrier layer between the free ferroelectric layer and the second conductor.

It is preferable that the second diffusion barrier layer is directly contacted with the free ferroelectric layer and the free ferroelectric layer has a thickness less than 3 nm; especially, it is preferable that the product of the saturated magnetization and thickness of the free ferroelectric layer is less than 3 (T·nm).

Preferably, the free ferroelectric layer includes a nickel-including ferroelectric film and the second diffusion layer is directly contacted with the nickel-including ferroelectric film.

The free ferroelectric layer preferably includes a ferroelectric layer directly connected to the tunnel dielectric layer, and a magnetization control structure composed of non-magnetic element and ferromagnetic material included in the ferroelectric layer.

The magnetization control structure is preferably non-magnetic.

The magnetization control structure preferably consists of oxide or nitride of the ferroelectric material included in the ferroelectric layer.

The non-magnetic material preferably consists of one or more elements selected from Ru, Pt, Hf, Pd, Al, W, Ti, Cr, Si, Zr, Cu, Zn, Nb, V, Cr, Mg, Ta, and Mo. It is also preferable that the non-magnetic material is segregated at grain boundaries of the ferromagnetic material.

The free ferromagnetic layer is preferably formed so that the stress-induced and shape-induced magnetic anisotropies exhibit the axes of easy magnetization in the same direction.

Specifically, it is preferable that the free ferromagnetic layer extends in a first direction and has a positive magnetostriction constant with a compressive stress exerted thereon in a second direction perpendicular to the first direction. Alternatively, a tensile stress is preferably exerted on the free ferromagnetic layer in the first direction.

In the case that the free ferromagnetic layer has a negative magnetostriction constant, a compressive stress is preferably exerted on the free ferromagnetic layer in the first direction; instead, a tensile stress is preferably exerted in the second direction perpendicular to the first direction.

Control of the stress may be achieved by a relative direction of the major axis of the free ferroelectric layer and a lower interconnection. Specifically, in the case that the free ferromagnetic layer has a positive magnetostriction constant and the free ferroelectric layer extend in a first direction, the lower interconnection is formed to extend in the first direction.

In the case that the free ferromagnetic layer has a negative magnetostriction constant and the free ferroelectric layer and tunnel dielectric layer contact with each other on a contact interface extending in the first direction, which is perpendicular to the second direction, then the lower interconnection is formed to extend in the second direction.

The free ferromagnetic layer preferably has a stress-induced magnetic anisotropy larger than the shape-induced magnetic anisotropy thereof. Such characteristics of the free ferromagnetic layer is especially preferable for the case that the free ferromagnetic layer has major and minor axes, the minor axis being perpendicular to the major axis, and an aspect ratio, which is defined as the ratio of the major axis to the minor axis, is equal to or more than 1.0 and equal to or less than 2.0.

BRIEF DESCRIPTION OF THE DRAWINGS

FIG. 5 is a cross sectional view illustrating a fourth modification of the magnetoresistance device in this embodiment, in which a fixed ferroelectric layer 8 includes a composite magnetic layer 8a;

FIGS. 6A and 6B are cross sectional view illustrating the structure of the composite magnetic layer 8a;

FIG. 21 is a table illustrating changes in MR ratios of magnetic tunnel junctions depending on thermal treatment temperature obtained from Comparative Example 2, and Examples 2 and 3;

FIG. 25 is a table illustrating changes in saturated magnetizations of free ferromagnetic layers obtained from Comparative Examples 4 and 5, and Examples 5 and 6;

FIG. 38 illustrates magnetization curves of free ferromagnetic layers of Comparative Example 7 and Example 11;

FIG. 40 is a graph illustrating relations between aspect ratios and yields obtained from Comparative Example 9 and Example 12.

DESCRIPTION OF THE PREFERRED EMBODIMENTS

Figure 1:
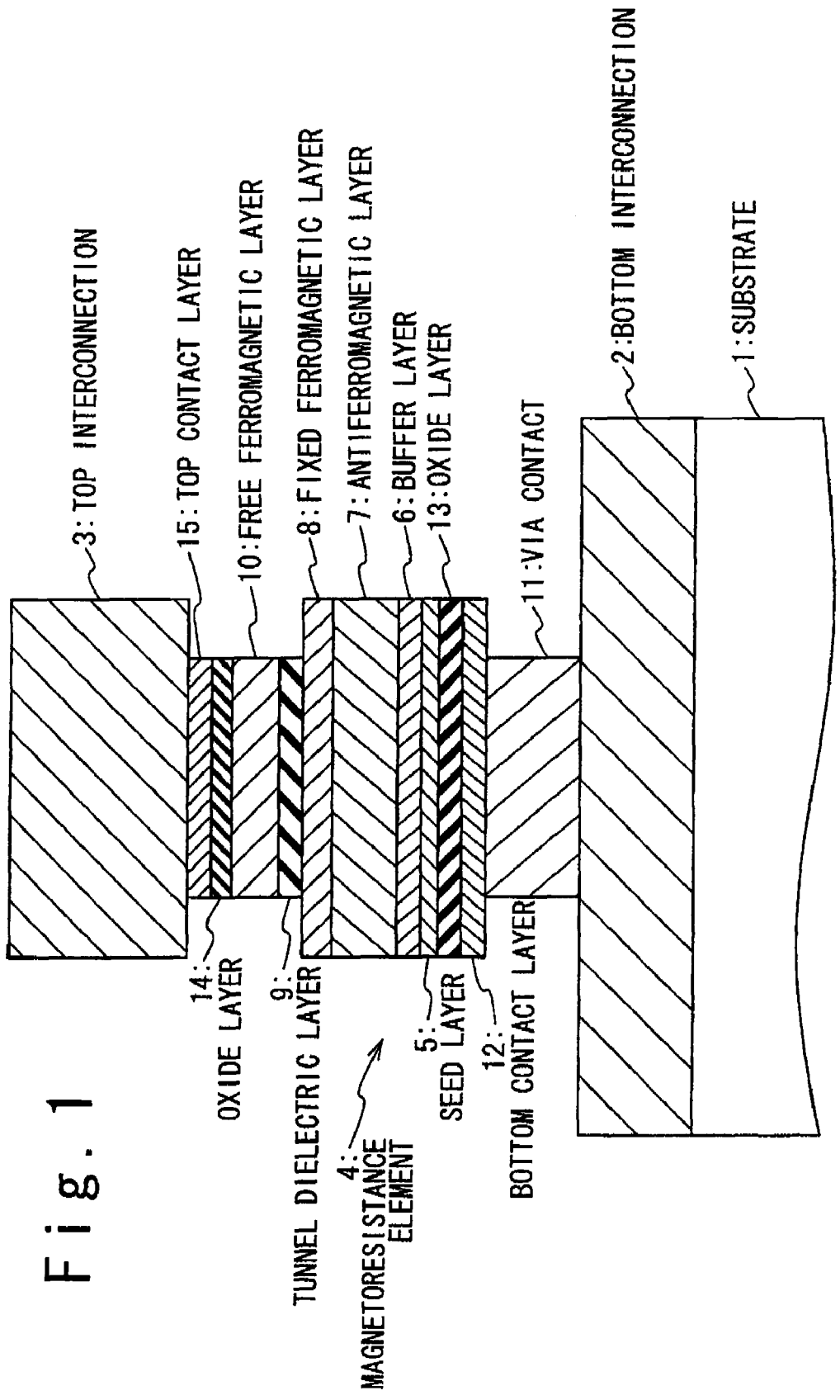
FIG. 1 is a cross sectional view illustrating one embodiment of the magnetoresistance device in accordance with the present invention.

As shown in FIG. 1, one embodiment of the present invention addresses a cross-point cell type MRAM. In a first embodiment, bottom and top interconnections 2 and 3 are provided on an upper side of a substrate 1. The bottom and top interconnections 2 and 3 are formed of $Al_{90}Cu_{10}$.

A magnetoresistance element 4, which functions as a memory cell of an MRAM, is disposed between the bottom and top interconnections 2 and 3. The magnetoresistance element 4 includes a seed layer 5, a buffer layer 6, an antiferromagnetic layer 7, a fixed ferromagnetic layer 8, a tunnel dielectric layer 9, and a free ferromagnetic layer 10. The fixed ferromagnetic layer 8, the tunnel dielectric layer 9, and the free ferromagnetic layer 10 within the magnetoresistance element 4 form a magnetic tunnel junction.

The fixed ferromagnetic layer 8 is formed of metal ferromagnetic alloy having a high spin polarization ratio, typically CoFe. CoFe alloy is relatively magnetically hard ferromagnetic material; the term "hard" means to have a large coercive force. As described later, spontaneous magnetization of the fixed ferromagnetic layer 8 is fixed by exchange interaction from the antiferromagnetic layer 7.

The free ferromagnetic layer 10 is formed of relatively magnetically soft ferromagnetic material; the term "soft" means to have a small coercive force. The free ferromagnetic layer 10 is formed to allow the direction of spontaneous magnetization thereof to be reversible in the directions parallel and antiparallel to that of the fixed ferromagnetic layer 8. The magnetoresistance element 4, in which the spontaneous magnetization of the free ferromagnetic layer 10 is reversible, stores therein data of one bit as the direction of the spontaneous magnetization of the free ferromagnetic layer 10.

The free ferromagnetic layer 10, which has reversible spontaneous magnetization, is formed of nickel-including ferromagnetic material, typically, NiFe. In general, nickel-including ferromagnetic material is relatively magnetically soft, and thus is preferable for providing the free ferromagnetic layer 10 having reversible spontaneous magnetization. The free ferromagnetic layer 10 may be composed of a CoFe layer formed on the tunnel dielectric layer 9, and a NiFe layer formed on the CoFe layer. The CoFe layer, having a high spin polarization ratio, improves an MR ratio of the magnetic tunnel junction, while the NiFe layer makes the CoFe layer magnetically soft to reduce the coercive force. The layered structure composed of the CoFe layer and NiFe layer achieves a magnetic tunnel junction that has easily reversible spontaneous magnetization and has a high MR ratio.

The tunnel dielectric layer 9 is formed of non-magnetic dielectric having a thin thickness to allow a tunnel current to flow therethrough. The tunnel dielectric layer 9 is typically formed of $AlO_x$, $AlN_x$, or $MgO_x$; the thickness thereof is adjusted on the basis of the resistance required for the magnetoresistance element 4, typically, 1.2 to 2 nm. Because of the tunnel magnetoresistance effect (TMR effect), the through-thickness resistance of the tunnel dielectric layer 9 depends on whether the spontaneous magnetizations of the fixed and free ferromagnetic layers 8 and 10 are parallel or antiparallel. Data stored in the magnetoresistance element 4 can be distinguished on the basis of the through-thickness resistance of the tunnel dielectric layer 9.

The seed layer 5 and buffer layer 6 controls the orientation of the antiferromagnetic layer 7, which is disposed thereon, to stabilize the antiferromagnetic phase of the antiferromagnetic layer 7. The seed layer 5 is typically formed of Ta or Cr, while the buffer layer 6, disposed on the seed layer 5, is typically formed of NiFe or CoFe.

The antiferromagnetic layer 7 is formed of manganese-including antiferromagnetic material, typically PtMn, or IrMn. The antiferromagnetic layer 7 fixes the spontaneous magnetization of the fixed ferromagnetic layer 8 with exchange interaction thereon.

A via contact 11, a bottom contact layer 12, and an oxide layer 13 are disposed between the magnetoresistance element 4 and the bottom interconnection 2. The fixed ferromagnetic layer 13 within the magnetoresistance element 4 is electrically connected to the bottom interconnection 2 through the via contact 11, the bottom contact layer 12, and the oxide layer 13. The via contact 11 is connected to the bottom interconnection 2 to extend in a direction perpendicular to the major surface of the substrate 1. The via contact 11 is typically formed of tungsten, copper, or molybdenum.

The bottom contact layer 12 is disposed on the via contact 11. The bottom contact layer 12 functions as a superior adhesive layer onto the via contact 11, and also improves the film quality of the oxide layer 13 disposed thereon. Additionally, the bottom contact layer 12 provides a superior electrical connection between the via contact 11 and the oxide layer 13. The bottom contact layer 12 is typically formed of TiN, Ta, Ru, W, Zr, or Mo.

The oxide layer 13 effectively prevents interdiffusion between the magnetoresistance element 4 and the underlying structure: the bottom interconnection 2, the via contact 11, and the bottom contact layer 12. That is, the oxide layer 13 effectively prevents the magnetoresistance element 4 from being diffused with aluminum or copper from the bottom interconnection 2, tungsten, copper or molybdenum from the via contact 11, TiN, Ta, Ru, W, Zr, or Mo from the bottom contact layer 12. Furthermore, the oxide layer 13 effectively prevents the bottom interconnection 2 from being diffused with Ni from the buffer layer 6, and Mn from the antiferromagnetic layer 7. The oxide layer 13 formed of oxide, which is easily fine-structured, effectively prevents the interdiffusion.

It is essential that the oxide layer 13 has a function for preventing both diffusions from the bottom interconnection 2, the via contact 11, and the bottom contact layer 12 into the magnetoresistance element 4 and from the magnetoresistance element 4 into the bottom interconnection 2, the via contact 11, and the bottom contact layer 12; one of the diffusions causes the other diffusion. Therefore, the fact that the oxide layer 13 prevents both of these diffusions is preferable in terms of improvement of the characteristics of the magnetoresistance element 4.

The oxide layer 13 is preferably formed of oxide of Al, Mg, Si, Hf, Li, Ca, or Ti. Forming the oxide layer 13 with oxide of any of these elements allows the oxide layer 13 to be highly fine-structured and thermally stable because of the strong reaction with oxygen; this effectively suppresses the interdiffusion.

The use of a film of oxide is especially preferable for effectively suppressing the diffusion of manganese. Because manganese is highly reactive to oxygen, manganese diffused into the oxide layer 13, formed of oxide, reacts with oxygen to be stabilized and fixed within the oxide layer 13. Stabilizing manganese in the oxygen layer 13 effectively prevents the diffusion of manganese into the bottom interconnection 2.

The oxide layer 13 is preferably formed of oxide of material more reactive to oxygen than material included in layers in contact with the bottom and top surfaces of the oxide layer 13 (that is, the bottom contact layer 12 and the seed layer 5), the bottom surface designating the surface on the side of the substrate 1. The use of oxide of material not satisfying this requirement causes diffusion of oxygen into the layers in contact with the bottom and top surfaces of the oxide layer 13 and thereby destabilizes the oxide layer 13; this undesirably invalidates the anti-diffusion effect of the oxide layer 13. In the case that tantalum is used for the bottom contact layer 12, and tantalum or chromium is used for the seed layer 5, the oxide layer 13 is preferably formed of oxide of aluminum, magnesium, silicon, hafnium, lithium, calcium, or titanium; these elements have larger free energies of oxide formation.

In order to improve an SN ratio for detecting the resistance of the tunnel dielectric layer 9, the resistance of the oxide layer 13 in the thickness direction is preferably minimized. The resistance of the oxide layer 13 in the thickness direction reduces the SN ratio of detecting the resistance of the tunnel dielectric layer 9, because the oxide layer 13 is connected in series to the magnetic tunnel junction. Accordingly, the resistance of the oxide layer 13 in the thickness direction is preferably small, more specifically, preferably smaller than that of the tunnel dielectric layer 9.

It is preferable that the oxide layer 13, which functions as a diffusion barrier layer, is thin even when the resistivity thereof is small (that is, even if the oxide layer 13 is allowed to have a large thickness). Thickly depositing the oxide layer 13 enlarges the lattice distortion of the oxide layer 13, and thereby undesirably exerts stress on the free ferromagnetic layer 10. The stress exerted on the free ferromagnetic layer 10 changes the magnetic anisotropy of the free ferromagnetic layer 10, and thereby causes difficulties in preferably controlling the characteristics of the free ferromagnetic layer 10. Specifically, the oxide layer 13 preferably has a thickness less than 5 nm.

Additionally, reducing the thickness of oxide layer 13 below 1 nm in preferable because it substantially eliminates the resistance of the oxide layer 13 in the thickness direction. Reducing the thickness of oxide layer 13 below 1 nm extremely reduces the resistance of the oxide layer 13 through the tunneling phenomenon.

It is preferable to form the tunnel dielectric layer 9 and the oxide layer 13 with the same material because this allows the formation of the tunnel dielectric layer 9 and the oxide layer 13 using the same apparatus and material, and thus reduces the fabrication cost of the MRAM. For the formation of the tunnel dielectric layer 9 and the oxide layer 13 through sputtering, for example, the formation of the tunnel dielectric layer 9 and the oxide layer 13 with the same material allows the deposition of the tunnel dielectric layer 9 and the oxide layer 13 with the same sputtering target.

In the case that the tunnel dielectric layer 9 and the oxide layer 13 are formed with the same material, the thickness of the oxide layer 13 is preferably thinner than that of the tunnel dielectric layer 9. This reduces the resistance of the oxide layer 13 in the thickness direction below that of the tunnel dielectric layer 9, and thereby improves the SN ratio for detecting the resistance of the tunnel dielectric layer 9.

An oxide layer 14 and a top contact layer 15 are disposed between the top interconnection 3 and the magnetoresistance element 4. The oxide layer 14 is formed on the free ferromagnetic layer 10 of the magnetoresistance element 4. The top contact layer 14 is formed on the oxide layer 14 to be in contact with the top interconnection 3. The free ferromagnetic layer 10 of the magnetoresistance element 4 is electrically connected to the oxide layer 14 and the top contact layer 15.

The top contact layer 15 protects the layers underlying below it from damages caused by the element fabrication process, and also provides an improved electrical connection between the oxide layer 14 and the top interconnection 3. The top contact layer 15 is typically formed of TiN, Ta, Ru, W, Zr, or Mo.

The oxide layer 14 effectively prevents the interdiffusion between the top interconnection 3 and the magnetoresistance element 4. In other words, the oxide layer 14 prevents the magnetoresistance element 4 from being diffused with aluminum and copper included in the top interconnection 3, and also prevents the top interconnection 3 from being diffused with nickel included in the free ferromagnetic layer 10. Reducing the diffusion of nickel into the top interconnection 3 avoids an increase in the resistance of the top interconnection 3. The oxide layer 14, formed of oxide, is easily fine-structured, and thus effectively prevents the interdiffusion. As is the case of the oxide layer 13, the oxide layer 14, formed of oxide, is desirably reduces the diffusion of nickel, effectively.

It is of importance that the oxide layer 14, which is directly connected to the free ferromagnetic layer 10, prevents the top interconnection 3 from being diffused with nickel from the free ferromagnetic layer 10, because this allows the free ferromagnetic layer 10 to have a reduced thickness t, and thereby to exhibit a reduced $M_s \cdot t$. Especially in the case that the free ferromagnetic layer 10 has a reduced thickness t, the diffusion of nickel from the free ferromagnetic layer 10 causes a change in the composition of the free ferromagnetic layer 10, and thus destabilizes the characteristics of the free ferromagnetic layer 10. Disposing the oxide layer 14 avoids nickel being diffused from the free ferromagnetic layer 10, and thereby enables the composition of the free ferromagnetic layer to be regulated to a desired value. This is especially effective for the case that the free ferromagnetic layer 10 has a reduced thickness t.

As is the case of the oxide layer 13, it is of importance that the oxide layer 14 has a function of preventing both diffusions from the top interconnection 3 into the free ferromagnetic layer 10 and from the free ferromagnetic layer 10 into the top interconnection 3. It is extremely preferable that the oxide layer 13 prevents both of these diffusions in terms of improvement of the characteristics of the magnetoresistance element 4.

Characteristics required for the oxide layer 14 are identical to those for the oxide layer 13; the preferred materials and structures for the oxide layer 13 are also preferable for the oxide layer 14. Firstly, in order to be fine-structured, to exhibit thermal stability for high temperature, and to thereby provide an improved interdiffusion-resistance, the oxide layer 14 is preferably formed of oxide of aluminum, magnesium, silicon, hafnium, lithium, calcium, or titanium. Furthermore, the oxide layer 14 preferably has a resistance in the thickness direction smaller than that of the tunnel dielectric layer 9. Additionally, reducing the thickness of the oxide layer 14, especially below 5 nm, is preferable for the suppression of the influences of the stress on the free ferromagnetic layer 10. Finally, the tunnel dielectric layer 9 and the oxide layer 14 are preferably formed with the same material, because this allows the deposition of the tunnel dielectric layer 9 and the oxide layer 14 with the same apparatus and material, and thereby reduces the fabrication cost of the MRAM.

In the case that the free ferromagnetic layer 10 is formed with a nickel-including ferromagnetic layer (typically NiFe layer), or composed of a layered structure of a nickel-including ferromagnetic layer and another ferromagnetic layer (typically a layered structure of CoFe and NiFe layers), the oxide layer 14 is preferably formed to be directly connected with the nickel-including ferromagnetic layer. Changes in the composition of nickel-including ferromagnetic layers from the optimized composition cause severe deterioration of the characteristics thereof. Saturated magnetization, for example, remarkably depends on the concentration of nickel. Disposing the oxide layer 14 directly on the nickel-including ferromagnetic layer eliminates the diffusion route of nickel upward from the ferromagnetic layer, and thereby effectively prevents the change in the composition of the nickel-including ferromagnetic layer. The inventors' experiments have proved that the nickel-including ferromagnetic layer experiences the diffusion into the layers connected with the top surface thereof (that is, the top contact layer 15 and the top interconnection 3) more remarkably than the diffusion into the layers connected with the bottom surface thereof (that is, the tunnel dielectric layer 9 or the aforementioned other ferromagnetic layer); therefore, disposing the oxide layer 14 directly on the nickel-including ferromagnetic layer is especially effective for reducing diffusion.

As thus described, this embodiment provides the oxide layer 13 between the bottom interconnection 2 and magnetoresistance element 4, and thereby effectively prevents the interdiffusion between the bottom interconnection 2 and magnetoresistance element 4. Additionally, this embodiment provides the oxide layer 14 between the top interconnection 3 and magnetoresistance element 4, and thereby effectively prevents the interdiffusion between the top interconnection 3 and magnetoresistance element 4. The use of the oxide layers 13 and 14 are also effective for the case that the bottom and top interconnections 2 and 3 are formed with copper.

Furthermore, this embodiment provides the oxide layer 14 on the free ferromagnetic layer 10, and thereby effectively prevents the diffusion of material of the free ferromagnetic layer 10, especially, nickel. This enables the reduction of the product $M_s \cdot t$ of the magnetization $M_s$ and thickness t of the free ferromagnetic layer 10 down to a small value even if the thickness t of the free ferromagnetic layer 10 is reduced. As described above, the reduction in the product $M_s \cdot t$ is effective for reducing and stabilizing the coercive force of the free ferromagnetic layer 10. The structure described in this embodiment is especially effective for reducing the thickness t of the free ferromagnetic layer 10 below 3 nm, and the product $M_s \cdot t$ below 3 (T·nm).

In this embodiment, the oxide layers 13 and 14 may be replaced with nitride layers. Nitride layers or oxynitride layers are easily fine-structured, and thus effectively prevent the interdiffusion. As is the case of the oxide layers 13 and 14, the nitride layers preferably have a thickness equal to or less than 5 nm. Increase in the thickness of the nitride layers is not desirable because stress-induced magnetic anisotropy may cause deterioration of the magnetic characteristics.

Forming the aforementioned nitride layers with conductive nitride desirably reduces the resistance of the nitride layers in the thickness direction, and thereby improves the SN ratio for detecting the resistance of the tunnel dielectric layer 9. The resistance of the nitride layers in the thickness direction is preferably reduced, specifically, reduced below the resistance of the tunnel dielectric layer 9 in the thickness direction.

The nitride layers are preferably formed with nitride of material having a free energy of nitride formation smaller than that of material included in the layers connected on the bottom and top surfaces thereof; the bottom surface designates the surface on the side of the substrate 1. The use of nitride material not satisfying this requirement undesirably destabilizes the nitride layers through the diffusion of nitrogen into the layers connected on the bottom and top surfaces of the nitride layers, and thus degrades the diffusion-resistance of the nitride layers. The preferable nitride used for the nitride layers includes AlN, SiN, TiN, BN, TaN, and ZrN.

Alternatively, the oxide layers 13 and 14 may be replaced with oxynitrides layers formed with oxynitride in this embodiment. Oxynitride layers are easily fine-structured, and thus effectively prevent the interdiffusion. As is the case of the nitride layers, the oxynitride layers preferably have a thickness equal to or less than 5 nm. Increase in the thickness of the nitride layers is not desirable because stress-induced magnetic anisotropy may cause deterioration of the magnetic characteristics.

The oxynitride layers are preferably formed with oxynitride of material having free energies of oxide and nitride formations smaller than those of material included in the layers connected on the bottom and top surfaces thereof; the bottom surface designates the surface on the side of the substrate 1. The use of oxynitride material not satisfying this requirement undesirably destabilizes the oxynitride layers through the diffusion of oxygen and/or nitrogen into the layers connected on the bottom and top surfaces of the oxynitride layers, and thus degrades the diffusion-resistance of the oxynitride layers. The preferable nitride used for the oxynitride layers includes AlN, SiN, TiN, BN, TaN, and ZrN.

As described above, disposing the oxide layer 14 (or the nitride or oxynitride layer) on the free ferromagnetic layer 10 achieves the reduction of the thickness t of the free ferromagnetic layer 10, and thereby achieves the reduction of the product $M_s \cdot t$ of the magnetization $M_s$ and thickness t of the free ferromagnetic layer 10; however, there is a limit to stably reduce the product $M_s \cdot t$ of the magnetization $M_s$ and thickness t of the free ferromagnetic layer 10 only through the reduction of the thickness t of the free ferromagnetic layer 10. This is because extremely reducing the thickness t of the free ferromagnetic layer 10 undesirably causes free ferromagnetic layer 10 to exhibit an island-like structure, and to be discontinuous.

This problem can be solved by forming the free ferromagnetic layer 10 to have a sufficient thickness and modifying a portion of the free ferromagnetic layer 10 to reduce the magnetization of the modified portion. This method achieves the reduction in the effective thickness and magnetization of the free ferromagnetic layer 10 with the free ferromagnetic layer 10 having a continuous structure, and thereby reduces the product $M_s \cdot t$. This does not causes the decrease in the MR ratio, because this does not influence the ferromagnetic properties of a contact portion of the free ferromagnetic layer 10, the contact portion being in contact with the tunnel dielectric layer 9. The free ferromagnetic layer 10 is modified so that the modified portion becomes non-magnetic. Modifying the modified portion to be non-magnetic reduces the effective thickness of the free ferromagnetic layer 10, and thereby further effectively reduces the product $M_s \cdot t$.

Figure 27:
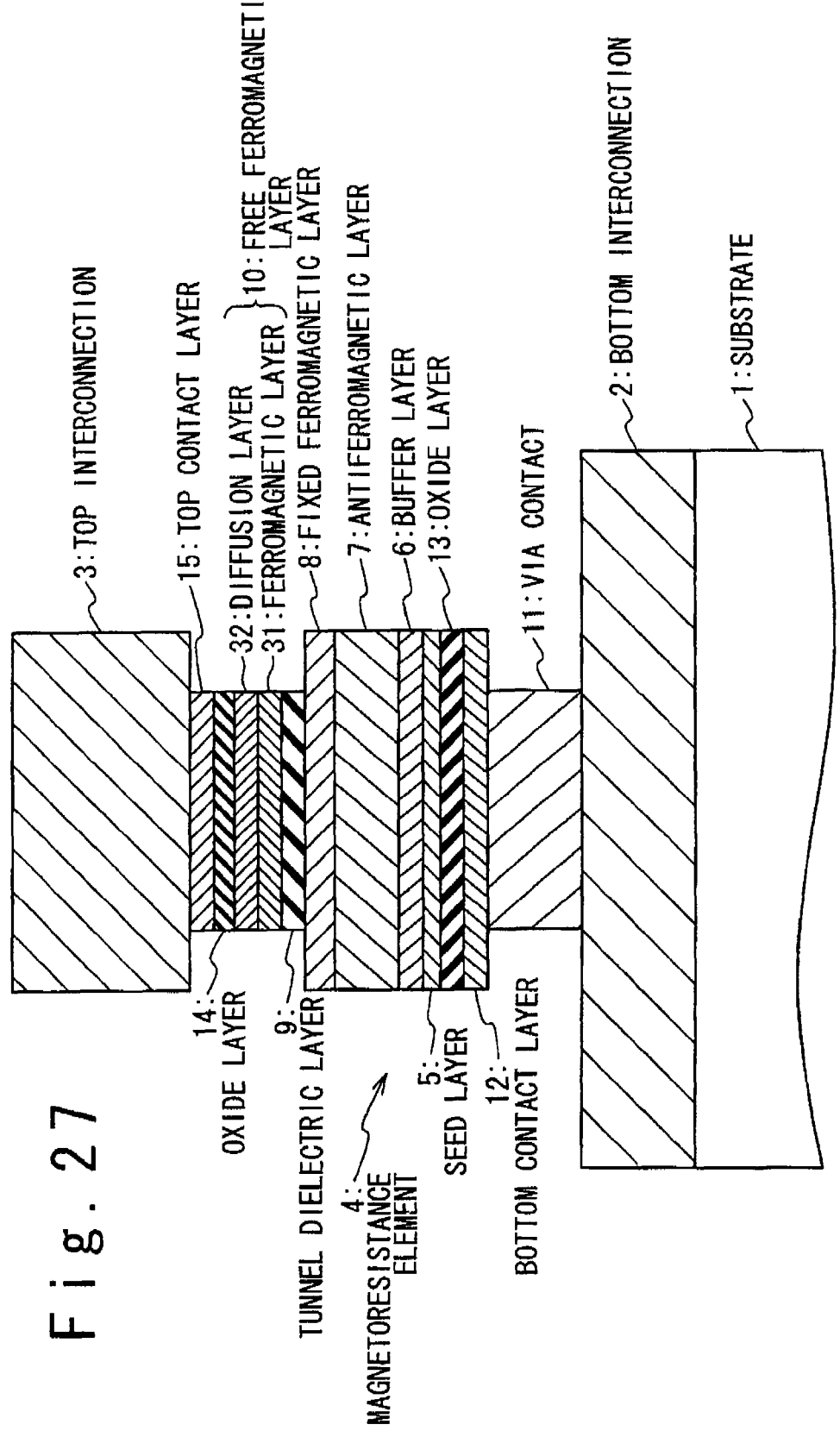
FIG. 27 is a cross sectional view illustrating a structure of a free ferromagnetic layer for reducing the product $4\pi M_s \cdot t$.

Specifically, the formation of the free ferromagnetic layer 10 so as to exhibit a reduced product $M_s \cdot t$ and a continuous structure may be achieved by methods described below; as shown in FIG. 27, a first method involves forming the free ferromagnetic layer 10 with a ferromagnetic layer 31 of ferromagnetic material, and a diffusion layer 32 of non-magnetic metal. The ferromagnetic layer 31 is deposited on the tunnel dielectric layer 9, and the diffusion layer 32 is deposited on the ferromagnetic layer 31; the oxide layer 14 is deposited on the diffusion layer 31. The ferromagnetic layer 9 is typically formed with NiFe. The non-magnetic layer is typically formed with Ru, Pt, Hf, Pd, Al, W, Ti, Cr, Si, Zr, C, Zn, V, Cr, or Mo. Thermal treatment causes diffusion between the ferromagnetic layer 31 and the diffusion layer 32, and a portion of the ferromagnetic layer 31 is modified to reduce the magnetization $M_s$. This allows the free ferromagnetic layer 10 to exhibit a reduced product $M_s \cdot t$ and a continuous structure. The free ferromagnetic layer 10 having such structure makes it easy to adjust the degree of the reduction in the magnetization by the thickness of the diffusion layer 32. Furthermore, this structure stabilizes the product $M_s \cdot t$ of the free ferromagnetic layer 10 because the oxide layer 14 prevents the top contact layer 15 from absorbing the material included in the free ferromagnetic layer 10.

The diffusion layer 32 is not required to be a continuous "layer". The diffusion layer 32 may be formed to be extremely thin so that the diffusion layer 32 exhibits an island-like structure.

Figure 28:
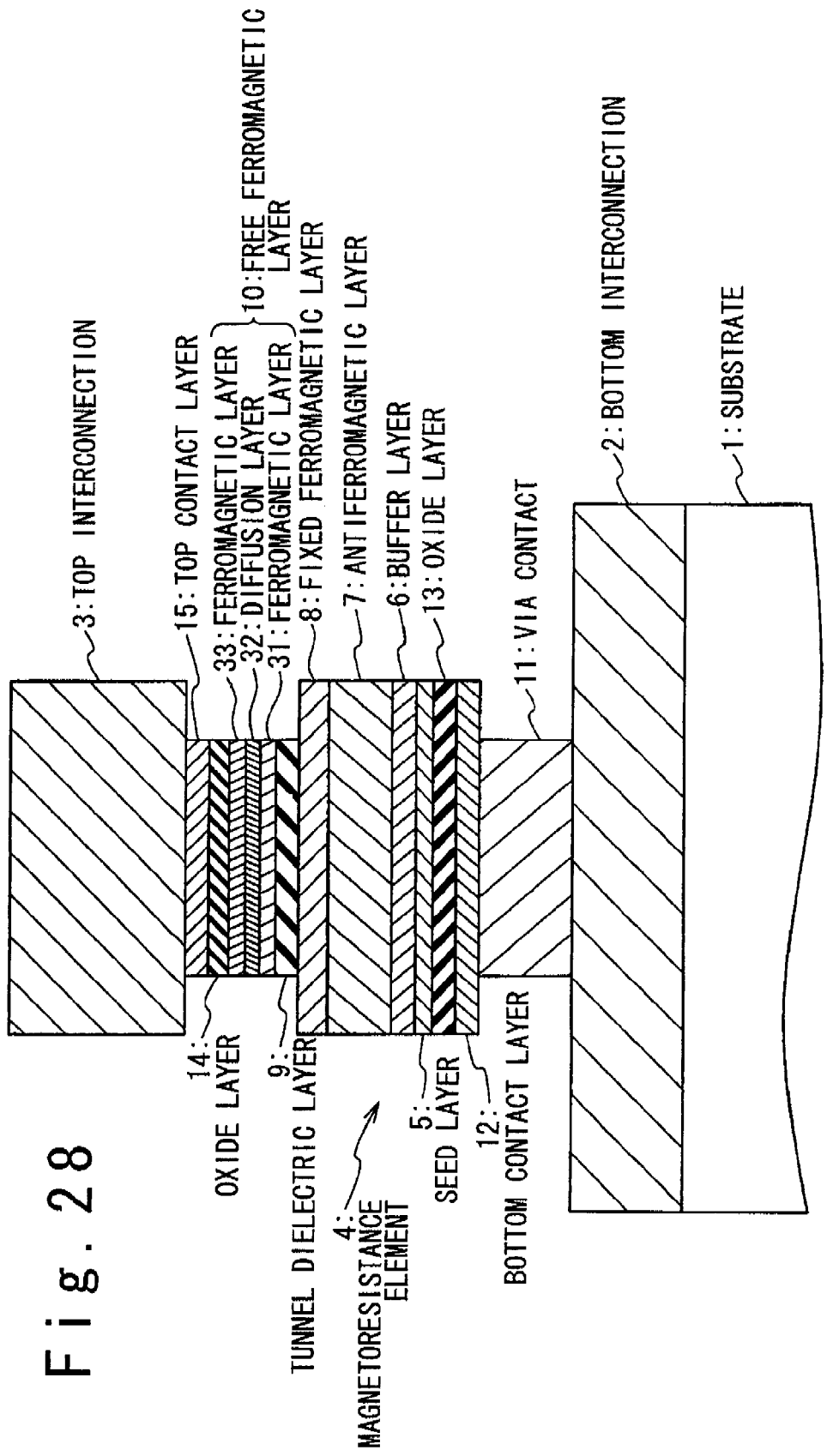
FIG. 28 is a cross sectional view illustrating another structure of a free ferromagnetic layer for reducing the product $4\pi M_s \cdot t$.

The diffusion layer 32 may be disposed in the free ferromagnetic layer 10 or positioned at such an arbitrary position that the diffusion layer 32 is in contact with the free ferromagnetic layer 10 under the conditions that the diffusion layer 32 is not directly contacted with the tunnel dielectric layer 9. As shown in FIG. 28, for example, the free ferromagnetic layer 10 may include ferromagnetic layers 31 and 33, and a diffusion layer 32 disposed therebetween. Disposing the diffusion layer 32 so as to be in direct contact with the tunnel dielectric layer 9 undesirably reduces the MR ratio. A heat treatment causes the interdiffusion between the diffusion layer 32 and the ferromagnetic layers 31 and 33, and thereby forms the free ferromagnetic layer 10 exhibiting a reduced product $M_s \cdot t$ and a continuous structure. It should be noted that the diffusion layer 32 is not required to be a continuous "layer" for this case.

Figure 29:
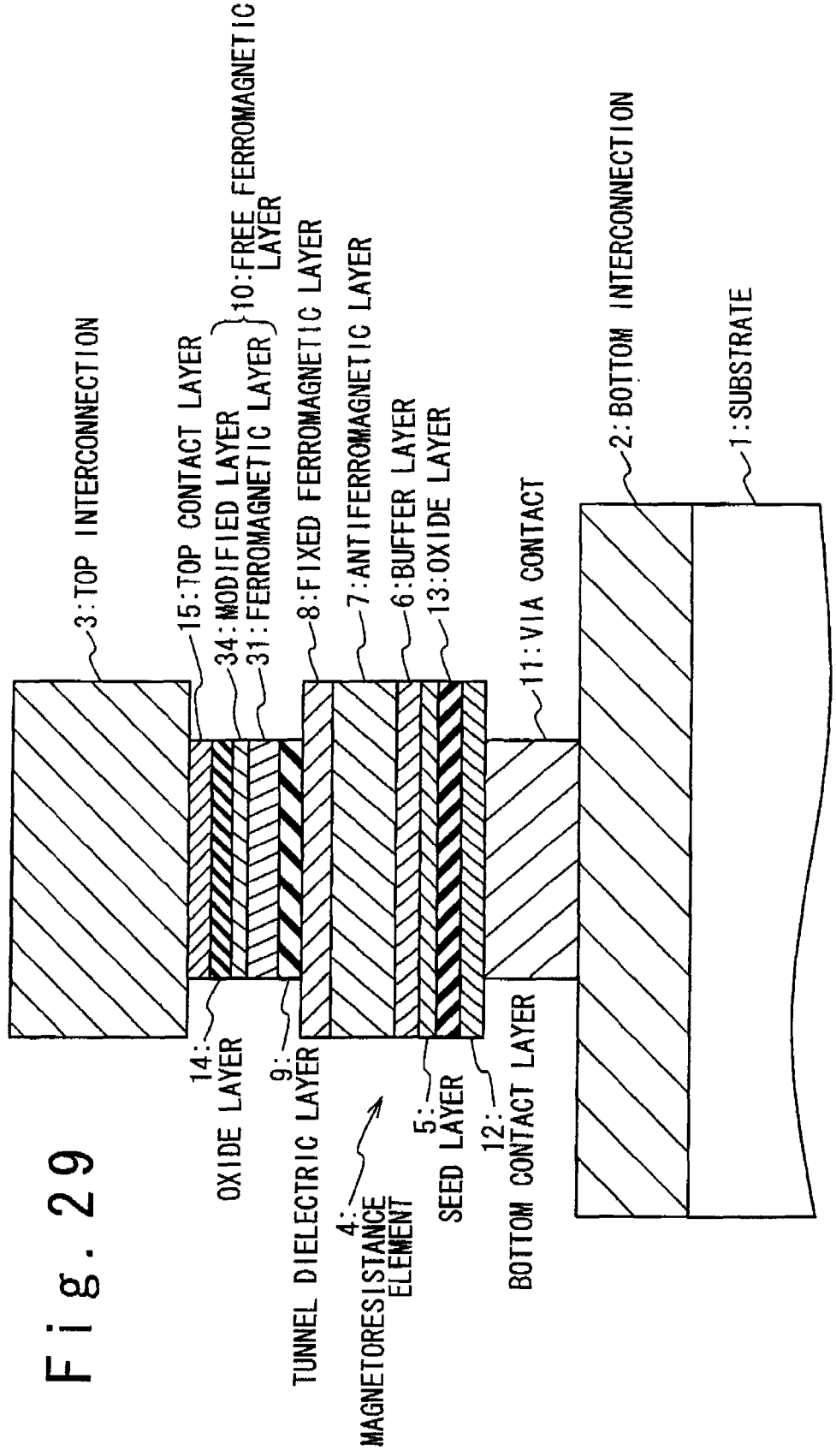
FIG. 29 is a cross sectional view illustrating still another structure of a free ferromagnetic layer for reducing the product $4\pi M_s \cdot t$.

As shown in FIG. 29, a second method involves forming a ferromagnetic layer 31 on the tunnel dielectric layer 9 followed by forming a modified layer 34 through nitrizing or oxidizing a surface portion thereof. The remainder portion of the ferromagnetic layer 31 and the modified layer 34 constitutes the free ferromagnetic layer 10. Nitrizing and oxidizing the portion of the ferromagnetic layer 31 may be achieved by subjecting the upper surface of the ferromagnetic layer 31 to nitrogen plasma and oxygen plasma, respectively. Nitrizing or oxidizing the portion of the ferromagnetic layer 31 eliminates or reduces the magnetization of the nitrized or oxidized portion, and thereby achieves the formation of the free ferromagnetic layer 10 so that it exhibits a reduced product $M_s \cdot t$ and a continuous structure. The portion of the ferromagnetic layer 31 may be boronized, chlorized, or carbonized instead of nitrized or oxidized.

For forming the modified layer 34 with oxide, the modified layer 34 and the oxide layer 14 are concurrently formed through a method described below. After the formation of the ferromagnetic layer 31 on the tunnel dielectric layer 9, a metal film is deposited thereon for forming the oxide layer 14. The upper surface of the metal film is subjected to oxygen plasma. The subjection to the oxygen plasma is continued after completing the oxidization of the metal film, and thereby achieves oxidization of a portion of the ferromagnetic layer 31. The thickness of the oxidized portion within the ferromagnetic layer 31 can be adjusted by duration of the subjection to the oxygen plasma. This is equivalent to the adjustment of the effective thickness of the free ferromagnetic layer 10.

For the formation of the modified layer 34 with nitride, the modified layer 34 and the oxide layer 14 are concurrently formed through a method described below. After the formation of the ferromagnetic layer 31 on the tunnel dielectric layer 9, a metal film is deposited thereon for forming the oxide layer 14. The upper surface of the metal film is subjected to nitrogen plasma. The subjection to the nitrogen plasma is continued after completing the nitrization of the metal film, and thereby achieves nitrization of a portion of the ferromagnetic layer 31. This is followed by the oxidization of the nitrized metal film to complete the oxide layer 14. The nitrized portion of the free ferromagnetic layer 10 is not oxidized because of the difference in the reactivity to oxygen.

Figure 30:
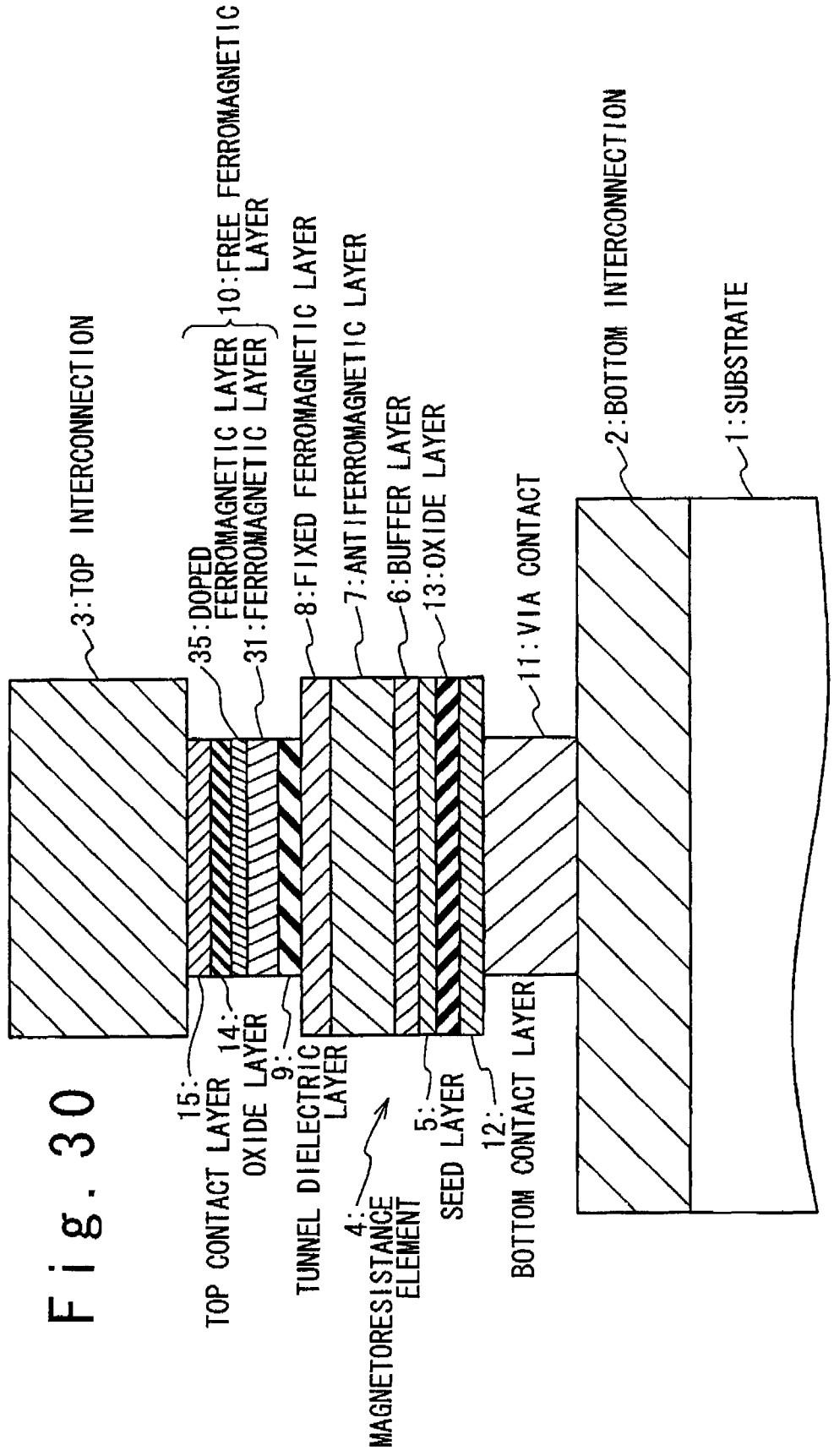
FIG. 30 is a cross sectional view illustrating still another structure of a free ferromagnetic layer for reducing the product $4\pi M_s \cdot t$.

The formation of the free ferromagnetic layer 10 so as to exhibit a reduced product $M_s \cdot t$ and a continuous structure is achieved by a structure shown in FIG. 30. A ferromagnetic layer 31 is formed with ferromagnetic material on the tunnel dielectric layer 9. A doped ferromagnetic layer 35 which is formed of the same ferroelectric material as the ferromagnetic layer 31, and doped with non-magnetic metal, is deposited on the ferromagnetic layer 31. The ferromagnetic layer 31 and the doped ferromagnetic layer 35 function as the free ferromagnetic layer 10. The non-magnetic metal is segregated at the grain boundaries of the ferromagnetic crystals. Doping non-magnetic metal reduces the magnetization of the doped ferromagnetic layer 35, and achieves the formation of the free ferromagnetic layer 10 so as to exhibit a reduced product $M_s \cdot t$ and a continuous structure.

As described below in detail, the technique is useful for the control of the stress-induced magnetic anisotropy of the free ferromagnetic layer 10, which technique controls the composition of the free ferromagnetic layer 10 to desired values through the suppression of the interdiffusion between the top interconnection 3 and the free ferromagnetic layer 10 by disposing the oxide layer 14 (or the nitride or oxynitride layer). The intensity of the anisotropy field $H_s$ is represented by the following equation (3):

$$H_s = 3(\lambda \cdot \sigma)/M_s, \quad (3)$$

Where $\lambda$ is the magnetostriction constant of the free ferromagnetic layer, and $\sigma$ is the stress exerted on the free ferromagnetic layer 10. The magnetostriction constant $\lambda$ depends on the composition of the free ferromagnetic layer 10. The oxide layer 14, on the other hand, effectively reduces the variations of the compositions of the free ferromagnetic layers 10 within different magnetoresistance elements 4, and the variation of the composition of each free ferromagnetic layer 10. This implies that disposing the oxide layer 14 enables control of the magnetostriction constant $\lambda$ of the free ferromagnetic layer 10, and thereby enables control of the stress-induced magnetic anisotropy.

Figure 31:
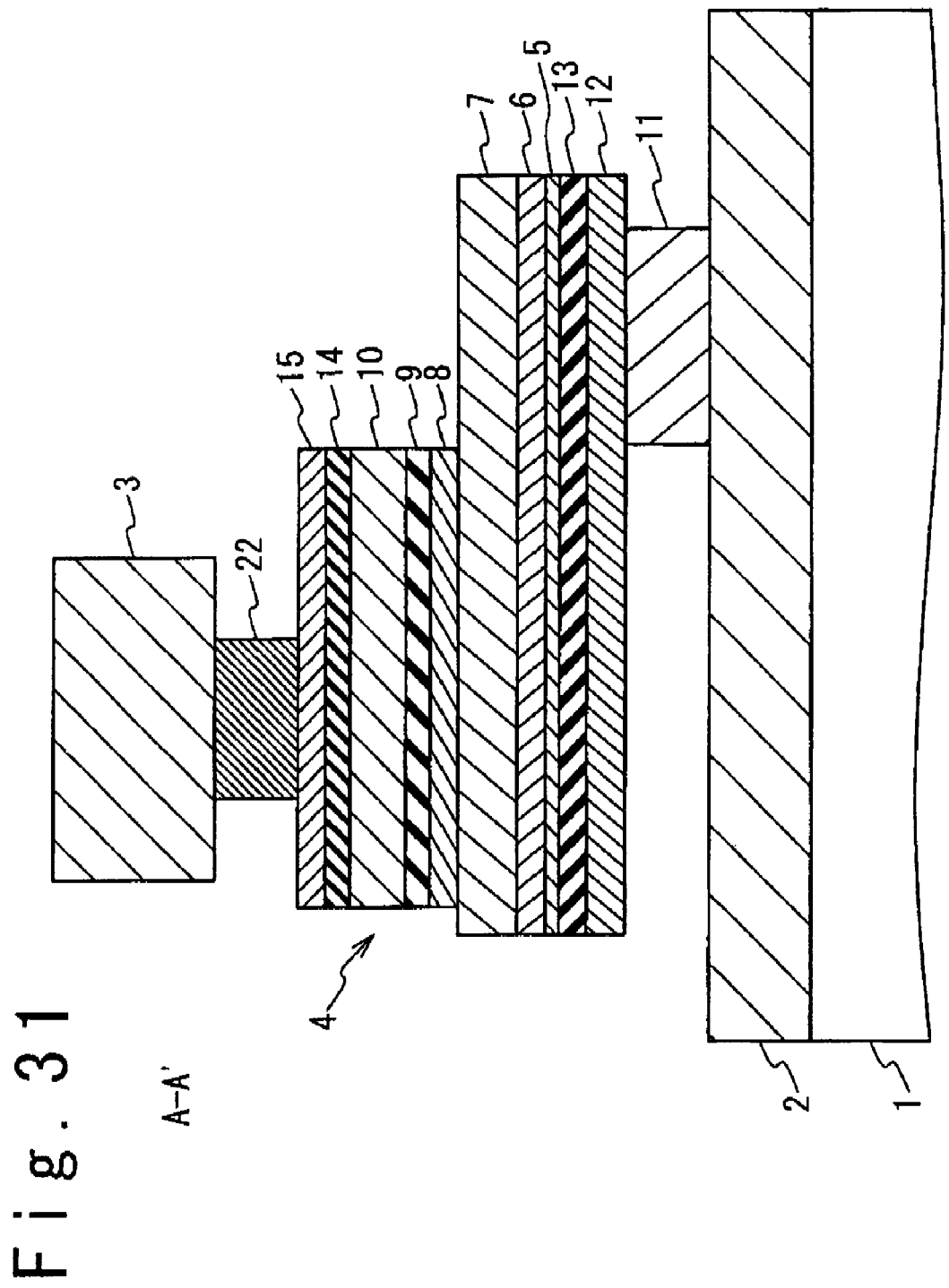
FIG. 31 is a cross sectional view illustrating an MRAM structure for allowing shape-induced and stress-induced magnetic anisotropies to exhibit axes of easy magnetization in the same direction.
Figure 32:
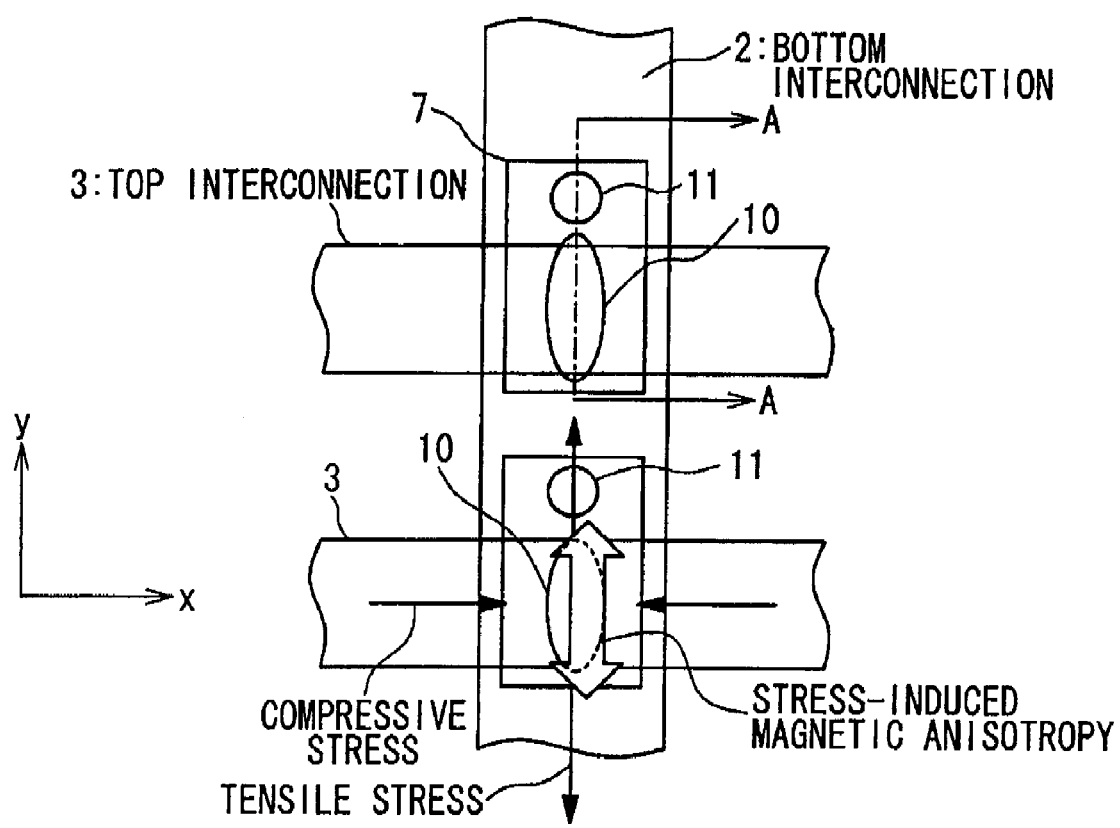
FIG. 32 is a plan view illustrating the MRAM structure for allowing shape-induced and stress-induced magnetic anisotropies to exhibit axes of easy magnetization in the same direction.

FIGS. 31 and 32 illustrates an MRAM structure for achieving control of the stress-induced magnetic anisotropy. As shown in FIG. 31, the bottom electrode 2 is formed with metal such as Al, Cu, AlCu, on the substrate 1. As shown in FIG. 32, the bottom electrode 2 extends in the y-axis direction, while the top interconnection 3 extends in the x-axis direction. The free ferromagnetic layer 10 has a minor axis in the x-direction and a major axis in the y-direction. This shape provides the free ferromagnetic layer 10 having a shape-induced magnetic anisotropy with the easy axis in the y-axis direction. As shown in FIG. 31, the contact layer 12, the oxide layer 13, the seed layer 5, the buffer layer 6, and the antiferromagnetic layer 7 are deposited in series over the bottom electrode 2. The bottom contact layer 12 is connected to the bottom electrode 2 through the via contact 11. The fixed ferromagnetic layer 8, the tunnel dielectric layer 9, and the free ferromagnetic layer 10 are deposited in series over the antiferromagnetic layer 7. The oxide layer 14 and the top contact layer 15 are deposited in series over the free ferromagnetic layer 10, and the top contact layer 15 is connected to the top interconnection 3 through the via contact 22. The composition of the free ferromagnetic layer 10 is selected so that the magnetostriction constant $\lambda$ of the free ferromagnetic layer 10 is positive. In the case that the free ferromagnetic layer 10 is formed with $Ni_xFe_{1-x}$, the magnetostriction constant $\lambda$ is adjusted to a positive value through controlling the parameter x below 0.82.

Figure 33:
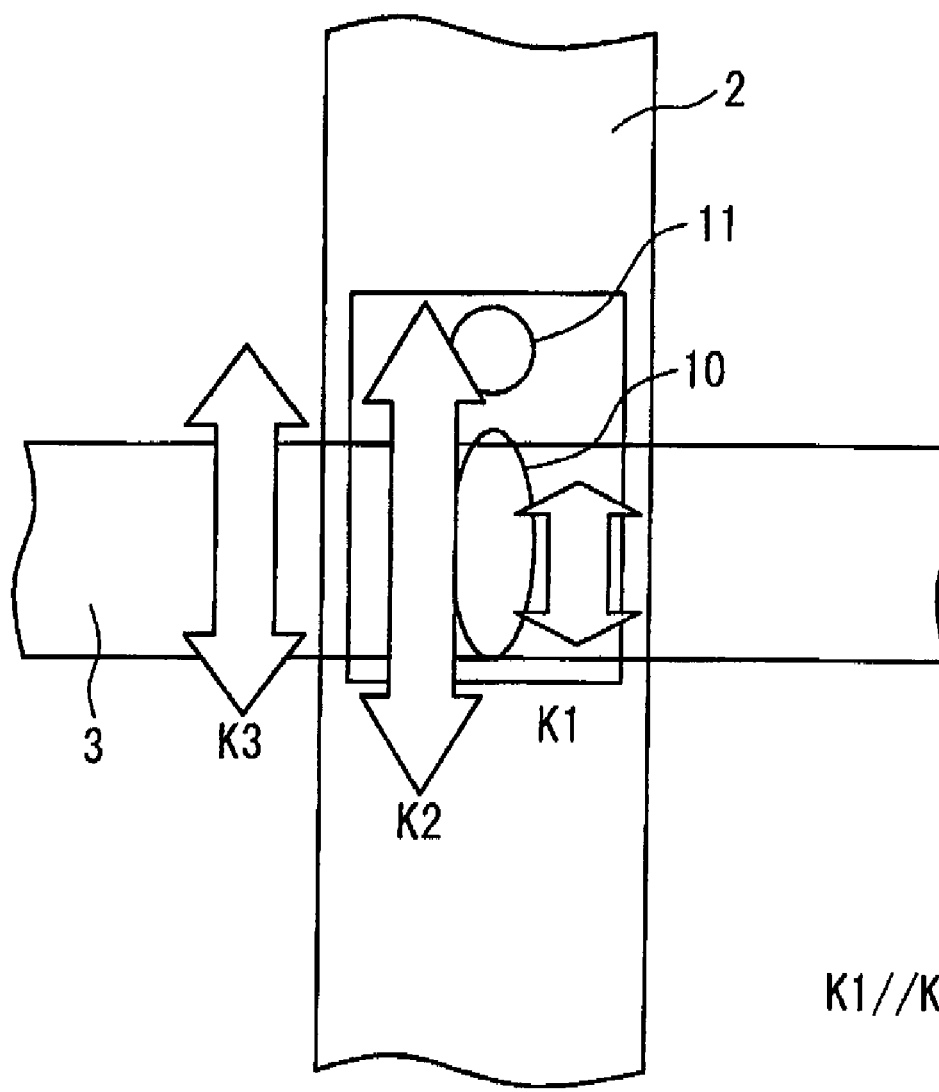
FIG. 33 is a plan view illustrating a relation between crystalline, shape-induced, and stress induced anisotropies.

As shown in FIG. 33, the aforementioned structure allows the stress-induced and shape-induced magnetization anisotropy to exhibit the easy axes in the same direction, and thereby stabilizes the characteristics of the free ferromagnetic layer 10. The bottom interconnection 2, which extends in the y-axis direction, exerts a tensile stress in the y-axis direction (that is, the direction of the major axis of the free ferromagnetic layer 10), and a compressive stress in the x-axis direction (that is, the direction of the minor axis of the free ferromagnetic layer 10). It should be noted that the inventors' investigation has depicted that the stress generated by the top interconnection 3 causes less influences on the free ferromagnetic layer 10. Since the magnetostriction constant $\lambda$ of the free ferromagnetic layer 10 is positive, the compressive stress in the x-axis direction and the tensile stress in the y-axis direction, which are generated by the bottom interconnection 2, develop the stress-induced magnetic anisotropy with the easy axis in the y-axis direction, and thereby coincide the direction of the easy axis of the stress-induced magnetic anisotropy with that of the shape-induced magnetic anisotropy. The fact that the stress-induced and shape-induced magnetic anisotropies exhibit the easy axis in the same direction provides the free ferromagnetic layer 10 with large uniaxiality, and thereby allows the free ferromagnetic layer 10 to exhibit a single domain structure. This effectively stabilizes the characteristics of the free ferromagnetic layer 10. Specifically, the coincidence of the directions of the easy axes, resulting from the stress-induced and shape-induced magnetic anisotropy, improves the rectangularity of the field magnetization curve of the free ferromagnetic layer 10, and additionally reduces the variation in the coercive force. An MRAM structure that does not allow the easy axes of the stress-induced and shape-induced magnetic anisotropy to be directed in the same direction causes variation in the direction of the easy axis of total anisotropy toward the write interconnection, and thereby undesirably destabilizes the characteristics of the free ferromagnetic layer 10.

In order to further stabilize the characteristics of the free ferromagnetic layer 10, the free ferromagnetic layer 10 is formed to allow the crystalline magnetic anisotropy thereof to exhibit the easy axis in the same direction as those of the stress-induced and shape-induced magnetic anisotropy. The coincidence of the easy axis of the crystalline magnetic anisotropy with those of the stress-induced and shape-induced magnetic anisotropy enhances the uniaxiality of the magnetic anisotropy of the free ferromagnetic layer 10, and thereby stabilizes the characteristics of the free ferromagnetic layer 10.

Figure 34:
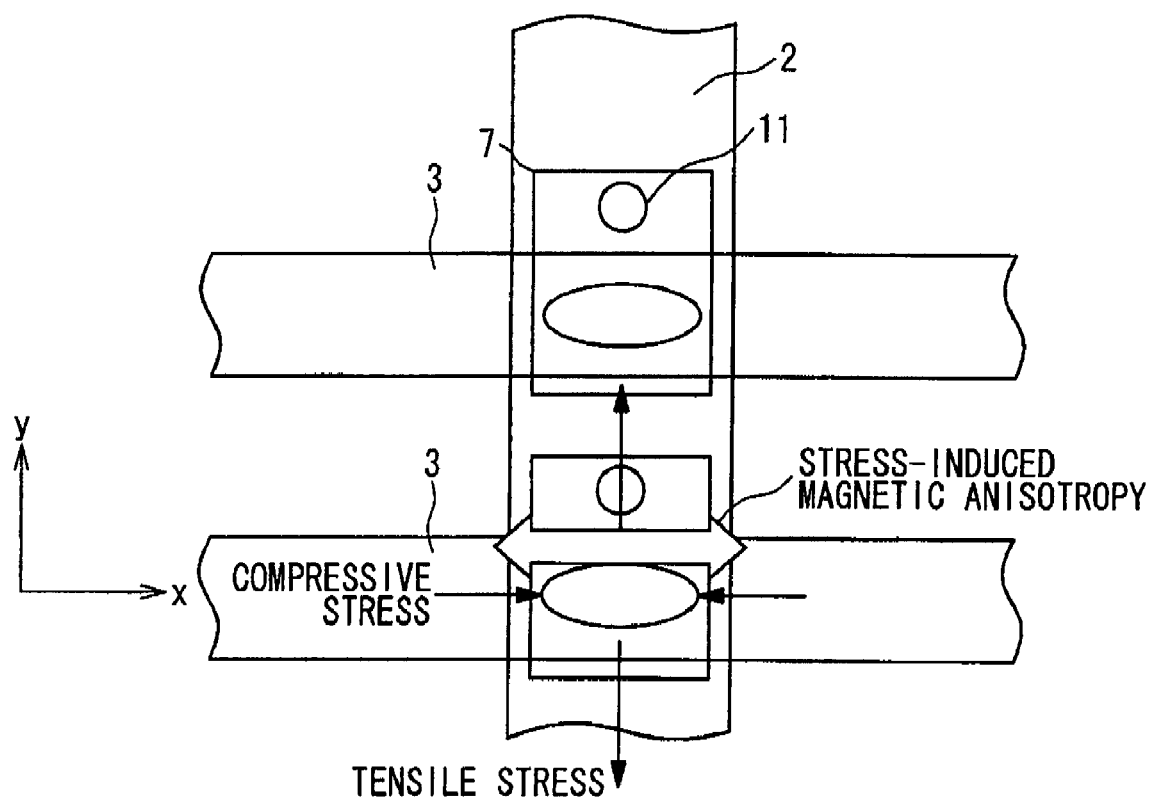
FIG. 34 is a plan view illustrating another MRAM structure for allowing shape-induced and stress-induced magnetic anisotropies to exhibit axes of easy magnetization in the same direction.

FIG. 34 illustrates another MRAM structure for achieving the control of the stress-induced magnetic anisotropy. The bottom interconnection 2 extends in the y-axis direction, while the top interconnection 3 extends in the x-axis direction. The magnetoresistance element 4 is formed so that the free ferromagnetic layer 10 has the major axis in the x-axis direction and the minor axis in the y-axis direction. It should be noted that the structure shown in FIG. 34 involves that the major and minor axes of the free ferromagnetic layer 10 are different by 90° from those shown in FIG. 32. Such shape provides the free ferromagnetic layer 10 having a shape-induced magnetic anisotropy with the easy axis in the x-axis direction. The composition of the free ferromagnetic layer 10 is selected so that the free ferromagnetic layer 10 has a negative magnetostriction constant $\lambda$. In the case that the free ferromagnetic layer 10 is formed with $Ni_xFe_{1-x}$, the magnetostriction constant $\lambda$ is adjusted to a negative value through controlling the parameter x over 0.82.

As is the case of the structure shown in FIGS. 31 and 32, the structure shown in FIG. 34 coincides the direction of easy axis of the stress-induced magnetic anisotropy (K2) with that of the shape-induced magnetic anisotropy (K3), and thereby stabilizes the characteristics of the free ferromagnetic layer 10. As described above, the bottom interconnection 2, which extends in the y-axis direction, exerts a tensile stress in the y-axis direction (that is, the direction of the minor axis of the free ferromagnetic layer 10), and a compressive stress in the x-axis direction (that is, the direction of the major axis of the free ferromagnetic layer 10). Since the magnetostriction constant λ of the free ferromagnetic layer 10 is negative, the compressive stress in the x-axis direction and the tensile stress in the y-axis direction, which are generated by the bottom interconnection 2, develop the stress-induced magnetic anisotropy with the easy axis in the x-axis direction, and thereby coincide the direction of the easy axis of the stress-induced magnetic anisotropy with that of the shape-induced magnetic anisotropy.

Figure 35:
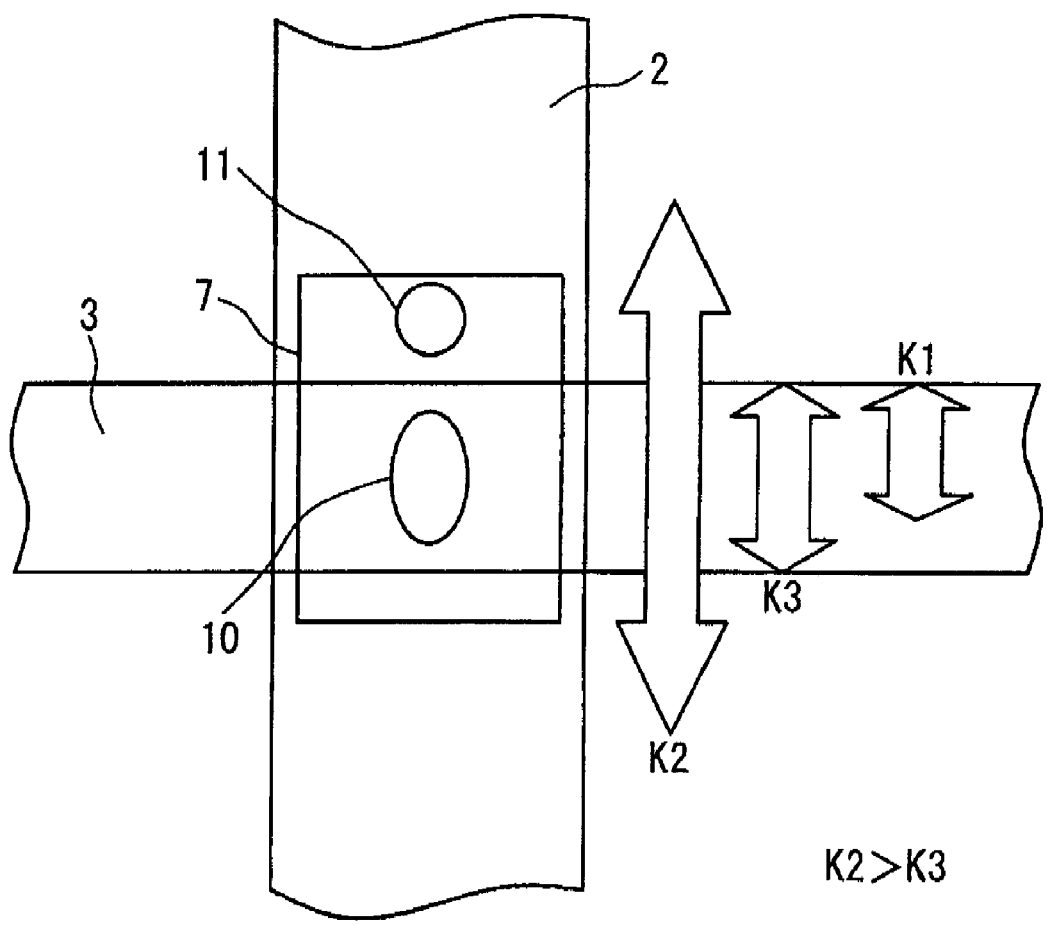
FIG. 35 is a plan view illustrating a preferable relation between shape-included and stress-induced anisotropies.

In the case that the MRAM is formed to coincide the easy axis of the stress-induced magnetic anisotropy with that of the shape-induced magnetic anisotropy, as shown in FIG. 35, the free ferromagnetic layer 10 is preferably formed so that the stress-induced magnetic anisotropy is larger than the shape-induced magnetic anisotropy. Achieving such properties allows the aspect ratio of the free ferromagnetic layer 10 (that is, the ratio of the major axis to the minor axis) to be close to 1, and thereby reduces the area of the magnetoresistance element 4. In general, adjusting the aspect ratio of the free ferromagnetic layer 10 to a value close to 1.0 weakens the uniaxiality of the magnetic anisotropy of the free ferromagnetic layer 10, and thus may cause the formation of closure domains within the free ferromagnetic layer 10. The formation of closure domains deteriorates the rectangularity of the field magnetization curve of free ferromagnetic layer 10, and increases the variation in the coercive field. Nevertheless, forming the free ferromagnetic layer 10 so as to have the stress-induced magnetic anisotropy larger than the shape-induced magnetic anisotropy improves the uniaxiality of the free ferromagnetic layer 10, and thereby compensates the decrease in the uniaxiality caused by the reduced aspect ratio. Specifically, the technique for adjusting the stress-induced magnetic anisotropy to be larger than the shape-induced magnetic anisotropy is preferably applied to the free ferromagnetic layer 10 having an aspect ratio of 1.0 to 2.0, especially the free ferromagnetic layer 10 having an aspect ratio of 1.25 to 2.0. Adjusting the stress-induced magnetic anisotropy to be larger than the shape-induced magnetic anisotropy may be achieved by controlling the magnetostriction constant λ to a desired value through appropriately selecting the composition of the free ferromagnetic layer 10. Disposing the oxide layer 10 (or the nitride or oxynitride layer) is of importance because it enables an appropriate control of the composition of the free ferromagnetic layer 10.

The technique for adjusting the stress-induced magnetic anisotropy to be larger than the shape-induced magnetic anisotropy is also preferable because it enables the formation of the magnetoresistance element 4 which is less sensitive to the variation of the dimension inevitably caused by the fabrication process of the MRAM. Conventional magnetoresistance elements, which are based on the shape-induced magnetic anisotropy, are sensitive to the dimension variation caused by the processes of the elements, (including exposure and etching), and thus experience large variations of the coercive forces. The technique for adjusting the stress-induced magnetic anisotropy to be larger than the shape-induced magnetic anisotropy reduces the influence of the inevitable dimension variation, and thereby effectively reduces the variation in the coercive force.

Figure 2:
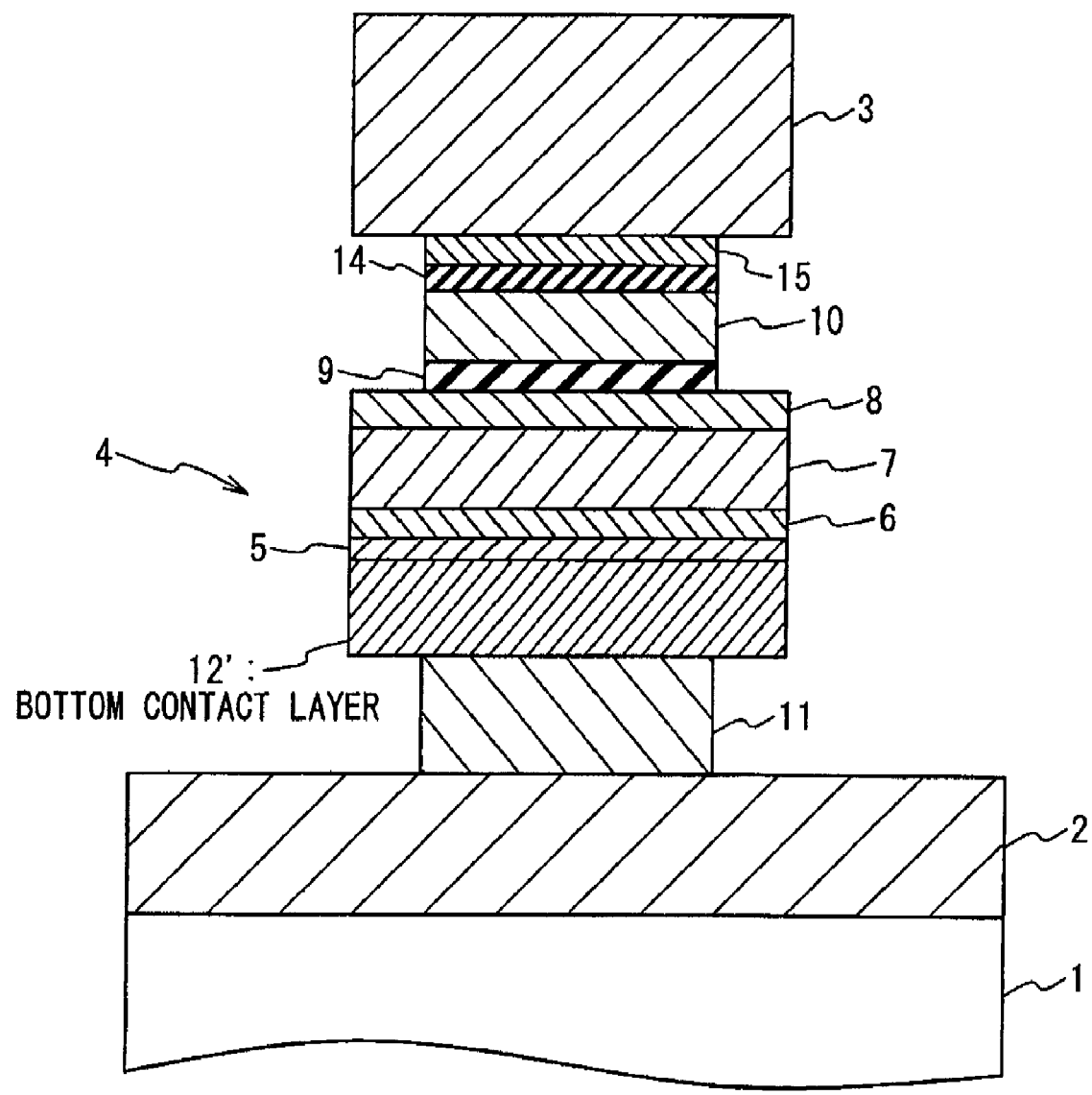
FIG. 2 is a cross sectional view illustrating a first modification of the magnetoresistance device in this embodiment, including a thick bottom contact layer 12'.
Figure 3:
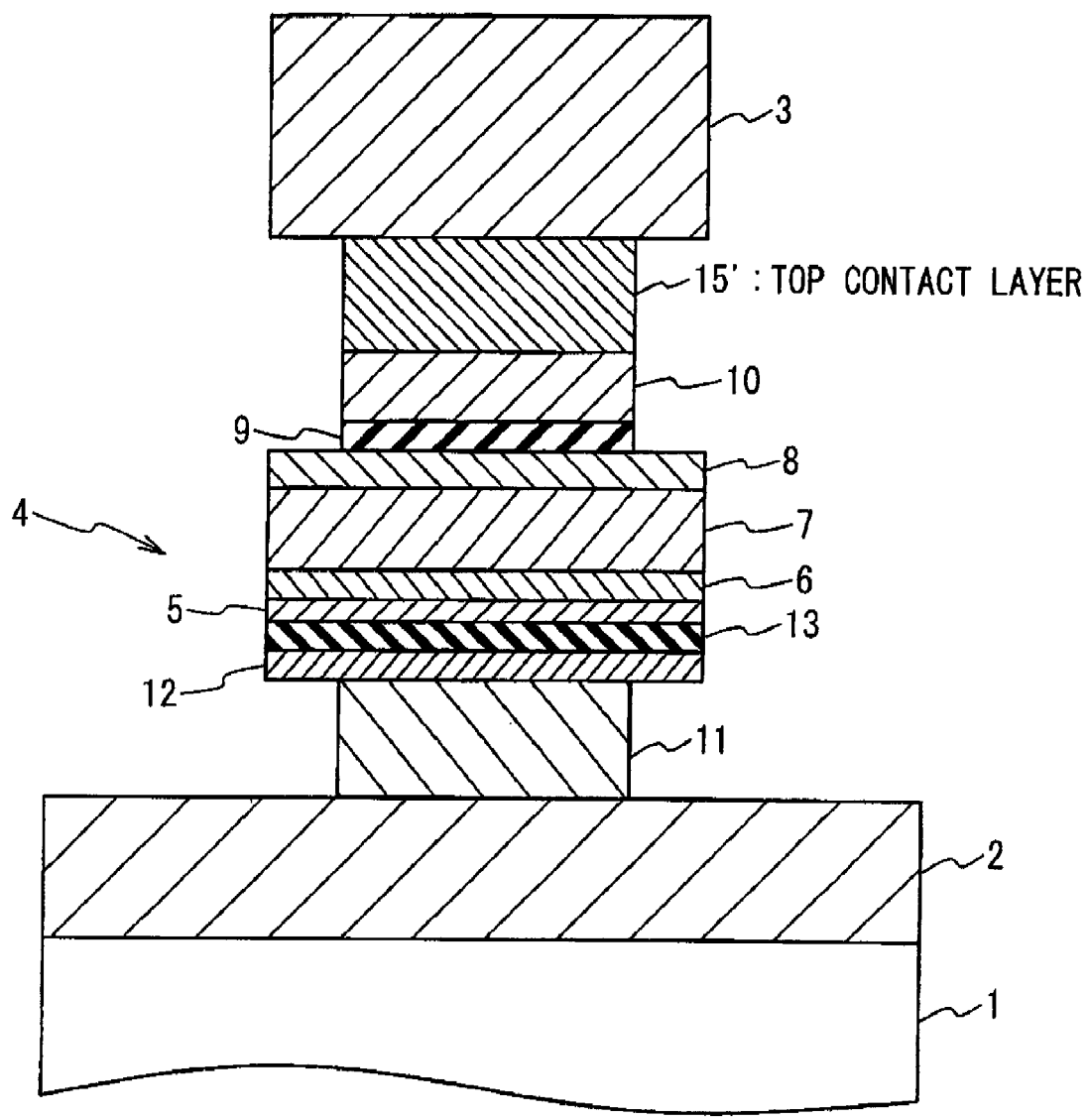
FIG. 3 is a cross sectional view illustrating a second modification of the magnetoresistance device in this embodiment, including a thick top contact layer 15'.

In terms of prevention of the interdiffusion, as shown in FIG. 2, a bottom contact layer 12' having a sufficiently increased thickness may be disposed between the magnetoresistance element 4 and the via contact 11 in place of the oxide layer 13. This allows the seed layer 5 to be omitted. Correspondingly, as shown in FIG. 3, a top contact layer 15' having a sufficiently increased thickness may be disposed between the free ferromagnetic layer 10 and the top interconnection 3 in place of the oxide layer 13. The bottom and top contact layers 12' and 15' are typically formed with TiN, Ta, Ru, W, Zr, or Mo. The sufficiently increased thicknesses of the bottom and top contact layers 12' and 15' prevent the magnetoresistance element 4 from being diffused with aluminum and copper included in the bottom and top interconnections 2 and 3, and also prevent the bottom and top interconnections 2 and 3 from being diffused with manganese included in the antiferromagnetic layer 5 and nickel included in the buffer layer 6 and the free ferromagnetic layer 10.

The use of both of the oxide layers 13 and 14, however, is preferable as shown in FIG. 1. The oxide layers 13 and 14 formed with oxide, which exhibits superior interdiffusion-resistance, are allowed to have extremely reduced thicknesses. The reduced thicknesses of the oxide layers 13 and 14 allow the bottom and top interconnections 2 and 3 to be positioned near the free ferromagnetic layer 10. The arrangement in which the bottom and top interconnections 2 and 3 are positioned near the free ferromagnetic layer 10 desirably reduces the intensity of the current required for inverting the spontaneous magnetization of the free ferromagnetic layer 10 (that is, the intensity of the current required for achieving write operation).

Furthermore, although the structure of FIG. 2, including the thick bottom contact layer 12', prevents the interdiffusion within the bottom interconnection 2, the via contact 11 and the magnetoresistance elements 4, this structure does not prevent the interdiffusion between the bottom contact layer 12' and the magnetoresistance element 4. Correspondingly, although the structure of FIG. 3, including the thick top contact layer 15', prevents the interdiffusion between the top interconnection 3 and the magnetoresistance elements 4, this structure does not prevent interdiffusion between the top contact layer 15' and the magnetoresistance element 4. Therefore, the use of the oxide layer 13 is more preferable than that of the thick contact layer 12', and the use of the oxide layer 14 is more preferable than that of the thick contact layer 15'.

Figure 4:
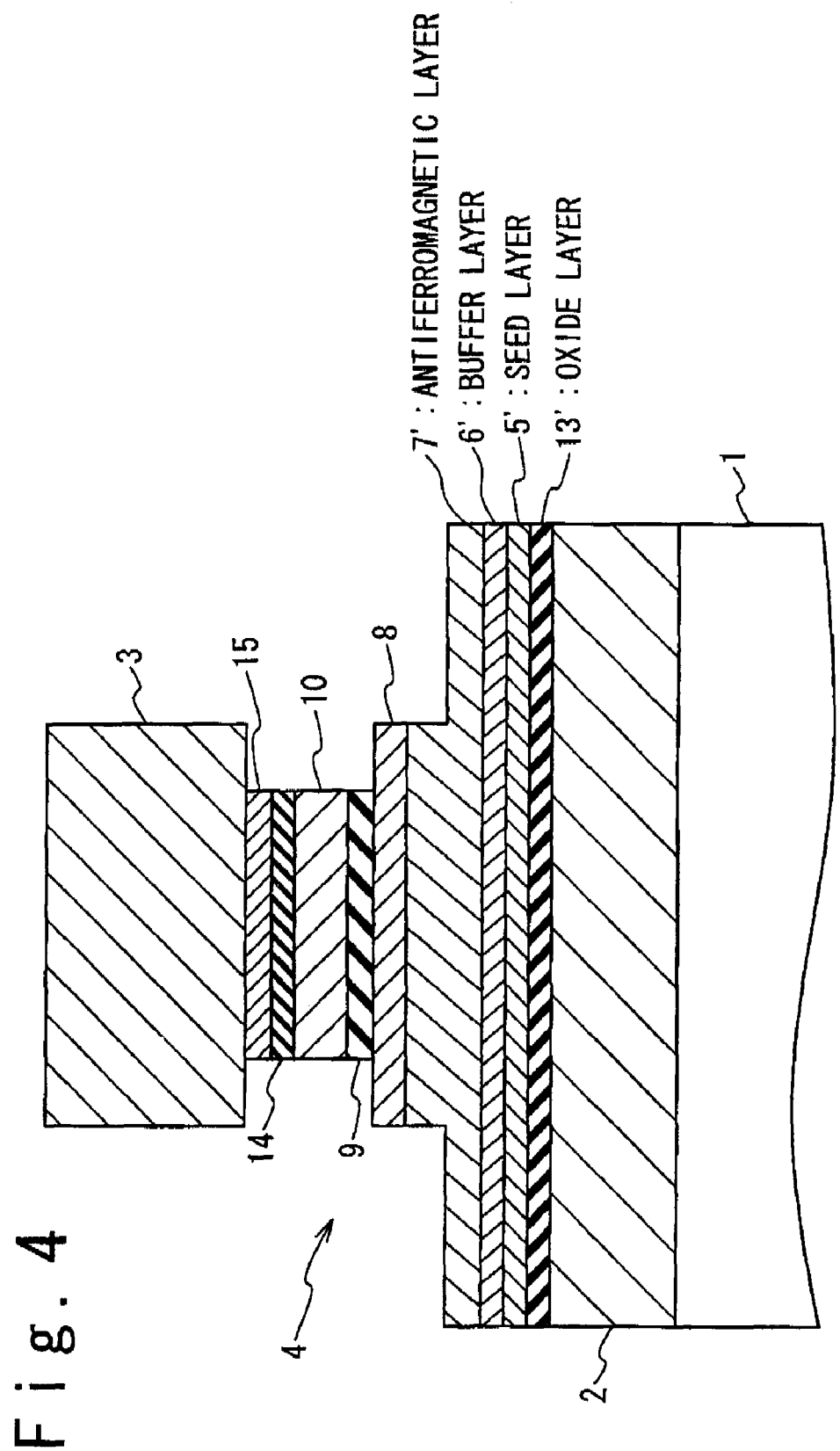
FIG. 4 is a cross sectional view illustrating a third modification of the magnetoresistance device in this embodiment, in which an antiferromagnetic layer 7', a buffer layer 6', and a seed layer 5' are incorporated within an interconnection.

In order to place the bottom interconnection 2 closer to the free ferromagnetic layer 10, as shown in FIG. 4, the oxide layer 13, the seed layer 5, the buffer layer 6, and the antiferromagnetic layer 7 are formed to substantially entirely cover the upper surface of the bottom interconnection 2. Such structure allows the seed layer 5, the buffer layer 6, and the antiferromagnetic layer 7 to be incorporated in the interconnection to which a write current is applied for inverting the spontaneous magnetization of the free ferromagnetic layer 10, and thereby positions the interconnection closer to the free ferromagnetic layer 10.

As described in the description of the related art, it is undesirable that the tunnel dielectric layer 9 is diffused with manganese included in the antiferromagnetic layer 7; this deteriorates the MR ratio of the magnetic tunnel junction. In order to prevent the tunnel dielectric layer 9 from being diffused with manganese included in the antiferromagnetic layer 7, the fixed ferromagnetic layer 8 preferably includes a composite magnetic layer 8a and a metal ferromagnetic layer 8b. The composite magnetic layer 8a is disposed on the antiferromagnetic layer 7, and prevents manganese of the antiferromagnetic layer 7 from being diffused into the tunnel dielectric layer 9, as described later. The metal ferromagnetic layer 8b is preferably formed with metal ferromagnetic alloy including as the main material cobalt, which has an increased spin polarization ratio, and is thermally stable and hard to be diffused. The use of the metal ferromagnetic alloy including cobalt as the main material makes the metal ferromagnetic layer 8b magnetically hard; "including cobalt as the main material" means that the material having the maximum atomic percent out of the materials included in the metal magnetic alloy is cobalt.

The composite magnetic layer 8a is formed with a composite thin film of mixture including non-oxidized metal ferromagnetic material as main material and oxide material as sub material, the oxide material being oxide of non-magnetic element more reactive to oxygen than the metal ferromagnetic material. Such composite magnetic layer 8a exhibits a structure achieving prevention of the diffusion of manganese with metallic conductivity and ferromagnetic properties. The metal ferromagnetic material used for the composite magnetic layer 8a is typically exemplified by CoFe, and the oxide is exemplified by $TaO_x$, $HfO_x$, $NbO_x$, $ZrO_x$, $CeO_x$, $AlO_x$, $MgO_x$, $SiO_x$, and $TiO_x$. These non-magnetic elements have free energies of oxide formation smaller than those of ferromagnetic elements: Fe, Co, and Ni; therefore these non-magnetic elements are more easily oxidized. Cobalt or metal ferromagnetic alloy including cobalt as main material is preferably used as the ferromagnetic material of the composite magnetic layer 8a. Cobalt and the metal ferromagnetic alloy including cobalt as main material have a high spin polarization ratio and exhibits high oxidization-resistance, while being hard to be diffused because of its thermally stability.

It is important that the composite magnetic layer 8a mainly includes non-oxidized metal ferromagnetic material for the composite magnetic layer 8a to exhibit conductive and ferromagnetic properties. The metallic conductivity of the composite magnetic layer 8 improves the SN ratio of read operations. The ferromagnetic properties of the composite magnetic layer 8a allows exchange interaction from the antiferromagnetic layer 7 to provide the metal ferromagnetic layer 8b, and thereby allows both of the composite magnetic layer 8a and the metal ferromagnetic layer 8b to function as a fixed ferromagnetic layer. In order to avoid the oxidization of the metal ferromagnetic material of the composite magnetic layer 8a, the oxide included in the composite magnetic layer 8a consists of oxide of non-magnetic element(s) more easily oxidized than the metal ferromagnetic material.

Figure 6A:
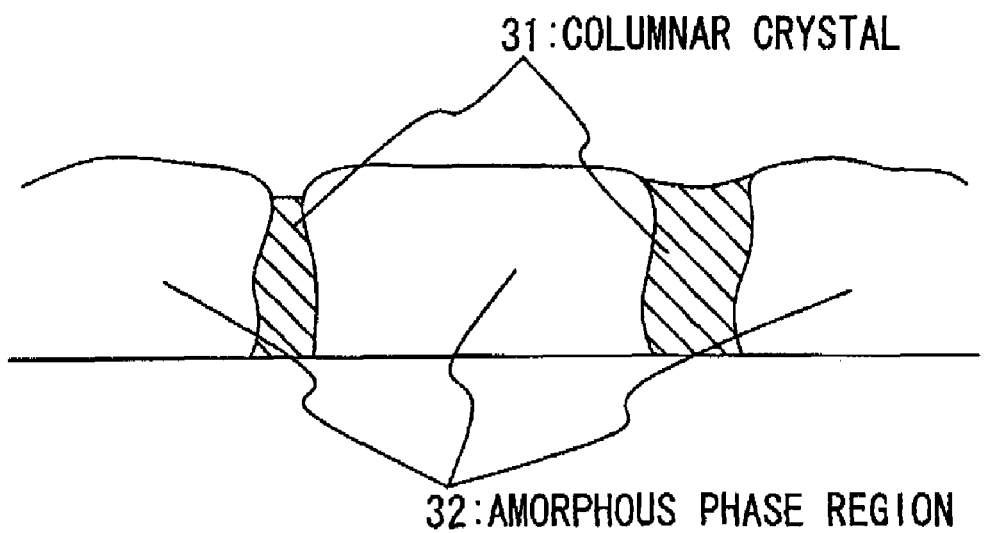
Figure 6B:
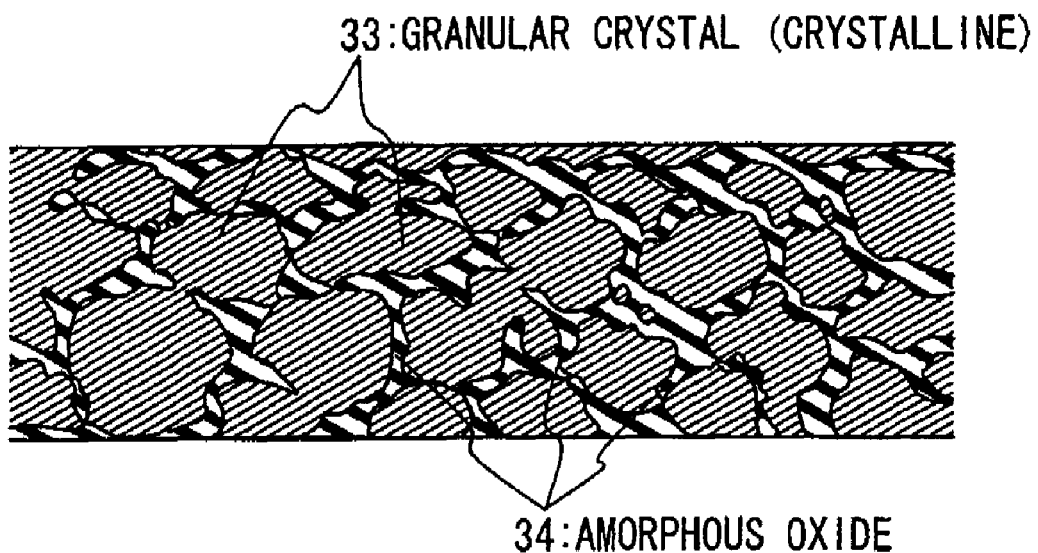

The composite magnetic layer 8a exhibits either a structure shown in FIG. 6A or shown in FIG. 6B depending on the atomic radiuses of the element(s) composing the metal ferromagnetic material, and the non-magnetic element(s) composing the oxide. When the atomic radius (radii) of the element(s) composing the metal ferromagnetic material is larger than that of the non-magnetic element(s) composing the oxide, as shown in FIG. 6A, the composite magnetic layer 8a is composed of columnar crystals 31 of the metal ferromagnetic material, and amorphous phase regions 32 which consists of mixture of the metal ferromagnetic material and oxide of the non-magnetic element(s). The reason why the composite magnetic layer 8a exhibits such structure may be that the non-magnetic element(s), which has a large atomic radius, inhibits crystallization of the metal ferromagnetic material. In the case that CoFe is used as the metal ferromagnetic material of the composite magnetic layer 8a, the composite magnetic layer 8a exhibits the structure shown in FIG. 6A when $TaO_x$, $HfO_x$, $NbO_x$, or $CeO_x$ is used as the oxide of the composite magnetic layer 8a.

When the atomic radius (radii) of the element(s) composing the metal ferromagnetic material is smaller than that of the non-magnetic element(s) composing the oxide, as shown in FIG. 6B, the composite magnetic layer 8a is composed of granular crystals 33 of the metal ferromagnetic material, and amorphous oxide 34 which is formed through segregation of the oxide at the grain boundaries of the granular crystals 33. Material exhibiting such structure is sometimes called as granular alloy. It should be noted that the granular crystals 33 are not totally isolated from one another; some of the granular crystals 33 are in direct contact with other adjacent granular crystals 33, or through pinholes disposed through the non-magnetic oxide 34. Such structure allows the composite magnetic layer 8a to exhibit soft ferromagnetism because of the magnetic coupling among the granular crystals 33, and also to exhibit metallic conductivity. In the case that CoFe is used as the metal ferromagnetic material of the composite magnetic layer 8a, the composite magnetic layer 8a exhibits the structure shown in FIG. 6B when $AlO_x$, $MgO_x$, $SiO_x$, or $TiO_x$ is used as the oxide.

For both of the structures shown in FIGS. 6A and 6B, the composite magnetic layer 8a exhibits the structure that prevents the diffusion using fineness of the non-magnetic oxide included therein. Additionally, the composite magnetic layer 8a, which includes oxide, functions as a trap for manganese, which is reactive to oxygen. When manganese is diffused into the composite magnetic layer 8a, the diffused manganese is stabilized through reaction to oxygen, and trapped in the composite magnetic layer 8a. Additionally, the composite magnetic layer 8a exhibits superior diffusion-resistance because it is almost free from the grain boundaries in contrast to usual metal ferromagnetic layers, and thus the high-speed diffusion route is eliminated. Because of these effects, the composite magnetic layer 8a enjoys diffusion-resistance for achieving effective suppression of the diffusion of manganese into the tunnel dielectric layer 9 without blocking the magnetic and electric coupling within the fixed ferromagnetic layer. Such characteristics cannot be obtained with conventional oxide diffusion barrier layers.

The composite magnetic layer 8a may be formed through a reactive sputtering technique with sputtering gas including oxygen gas. Gas mixture of oxygen gas and argon gas is typically used as the sputtering gas. An alloy target including metal ferromagnetic material and non-magnetic element(s) more easily oxidized than the metal ferromagnetic material is typically used as the sputtering target. Sputtering the alloy target with sputtering gas including oxygen gas causes oxygen to react the non-magnetic metal in preference to the metal ferromagnetic material. Therefore, appropriately adjusting the composition of oxygen of the sputtering gas achieves the formation of the composite magnetic layer 8a so that only the non-magnetic metal is oxidized without oxidizing the metal ferromagnetic material.

Figure 7:
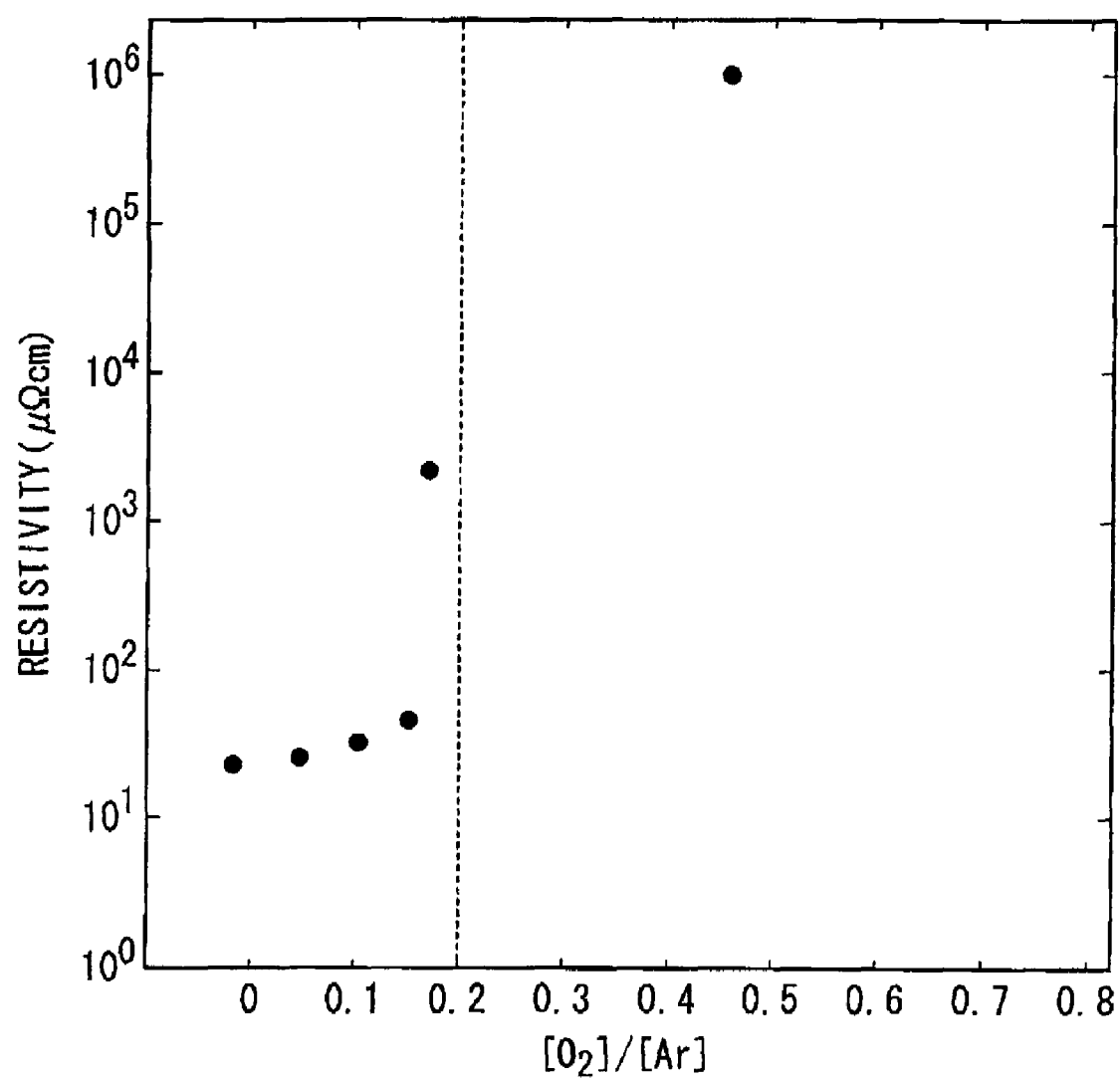
FIG. 7 is a graph illustrating a resistivity of a thin film formed through sputtering an alloy target consisting of ferromagnetic CoFe, and non-magnetic Ta with sputtering gas including oxygen gas.
Figure 8:
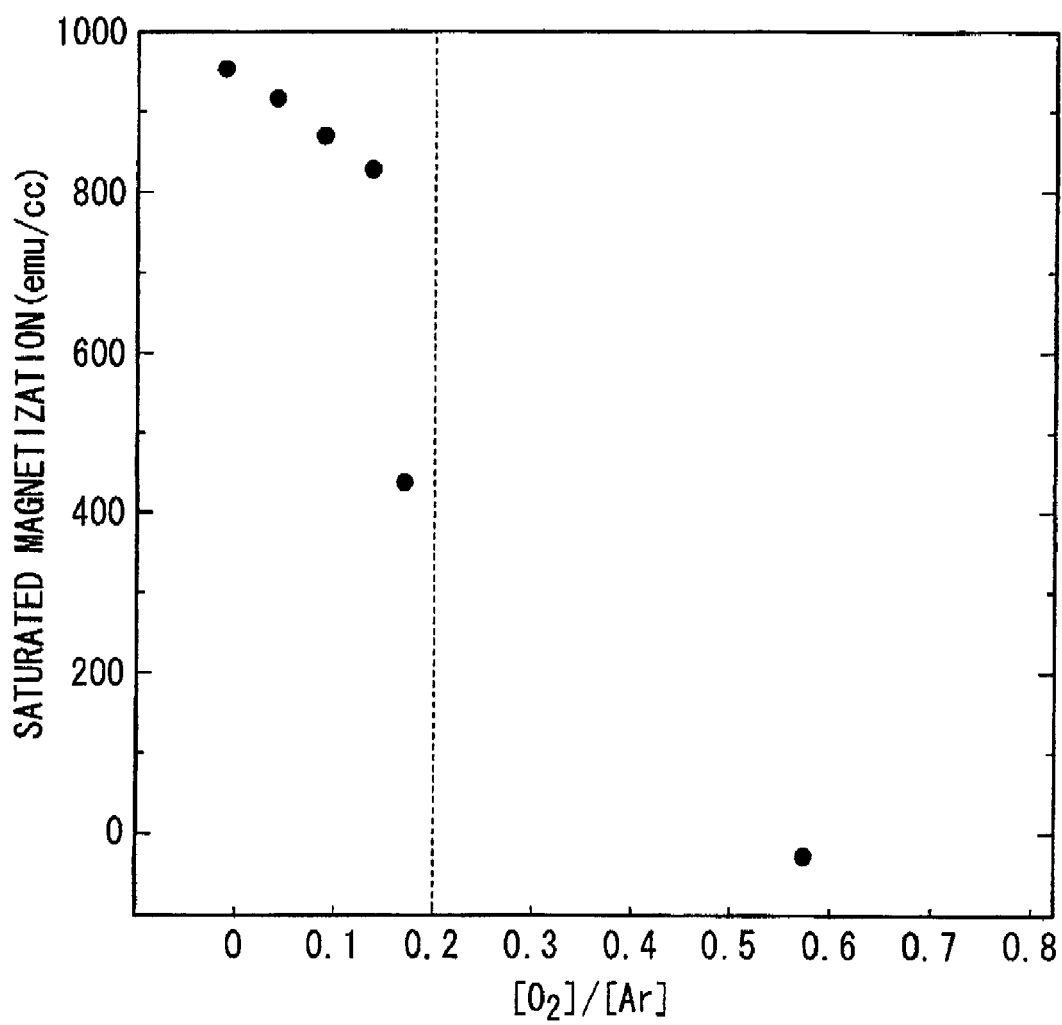
FIG. 8 is a graph illustrating a saturated magnetization of the thin film.

FIG. 7 is a graph illustrating resistivities of thin films obtained through sputtering a $(Co_{90}Fe_{10})Ta_{15}$ alloy target, which consists of ferromagnetic CoFe and non-magnetic Ta, with sputtering gas including oxygen gas, and FIG. 8 is a graph illustrating saturated magnetizations of these thin films. The horizontal axes of these graphs represent ratio $[O_2]/[Ar]$, where $[O_2]$ designates a flow rate of oxygen gas introduced to the sputtering chamber in the unit of sccm, and $[Ar]$ designates a flow rate of argon gas in the unit of sccm. The formed thin films exhibits the structure shown in FIG. 6A, that is, the structure mostly including amorphous oxide layer having a composition represented by the composition formula of $(CoFe)_zTa_{1-z}O_x$, and partially including columnar CoFe crystals. For reduced $[O_2]/[Ar]$ ratios, as shown in FIGS. 7 and 8, these thin films exhibits metallic conductivity, and large saturated magnetization. Increase in the $[O_2]/[Ar]$ ratio above 0.2 remarkably increases the resistivities of the thin films and decreases the saturated magnetizations.

Figure 9:
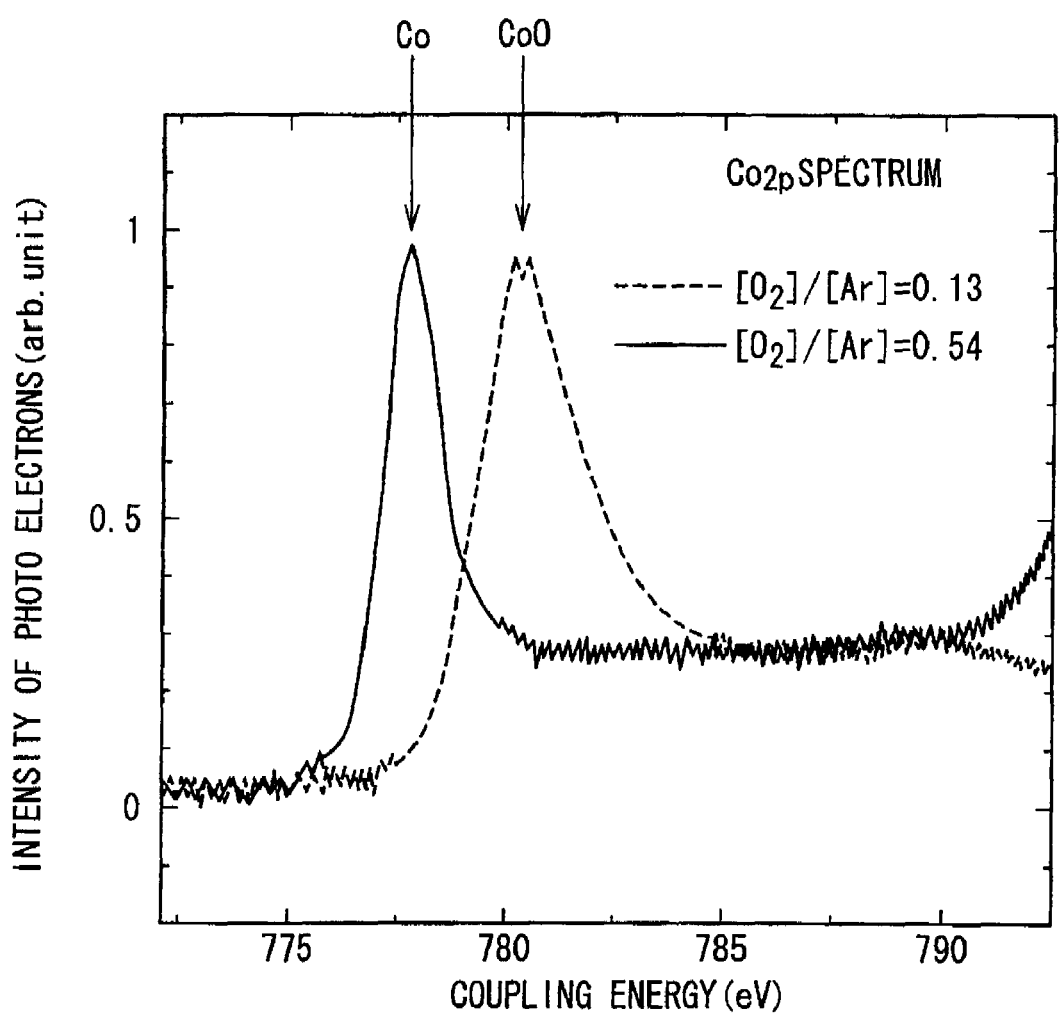
FIG. 9 is a $Co_{2p}$ spectrum obtained through an XPS analysis of the thin film.

These graphs proves that reduction in the [$O_2$]/[Ar] ratio below 0.2 is required for allowing CoFe of these thin films to exist in the metallic state. This fact is ensured by an XPS (X-ray photoelectron spectroscopy) analysis. FIG. 9 illustrates a $Co_{2p}$ spectrum obtained by the XPS analysis with respect to the thin films with the [$O_2$]/[Ar] ratios adjusted to 0.13 and 0.54, respectively. The $Co_{2p}$ spectrum illustrated in FIG. 9 depicts that 70 percents of cobalt within the thin film is metallic for the [$O_2$]/[Ar] ratio of 0.13, while cobalt within the thin film is oxidized for the [$O_2$]/[Ar] ratio of 0.54.

In the case that CoFe is used as the metal ferromagnetic material, and any of $TaO_x$, $HfO_x$, $NbO_x$, $ZrO_x$, $AlO_x$, $MgO_x$, and $SiO_x$ is used as the oxide of the non-magnetic metal, adjusting the [$O_2$]/[Ar] ratio below 0.2 enables the formation of the composite metallic layer 8a with CoFe remaining metallic.

The aforementioned composite thin film, which includes non-oxidized metal ferromagnetic material as main material and oxide of non-magnetic element(s) more reactive to oxygen than the metal ferromagnetic material as sub material, is relatively magnetically soft because it fails to exhibit a crystalline structure observed in metal ferromagnetic layers, including size-reduced ferromagnetic crystalline grains, and exhibiting reduced crystalline magnetic anisotropy. This characteristics can be used for excluding nickel from the free ferromagnetic layer 10. The diffusion of nickel into the tunnel dielectric layer 9 causes decrease in the MR ratio of the magnetoresistance element 4. Additionally, the diffusion of nickel into the top interconnection 3 increases the resistance of the top interconnection 3. In terms of nickel diffusion, nickel is preferably excluded from the free ferromagnetic layer 10.

Figure 10:
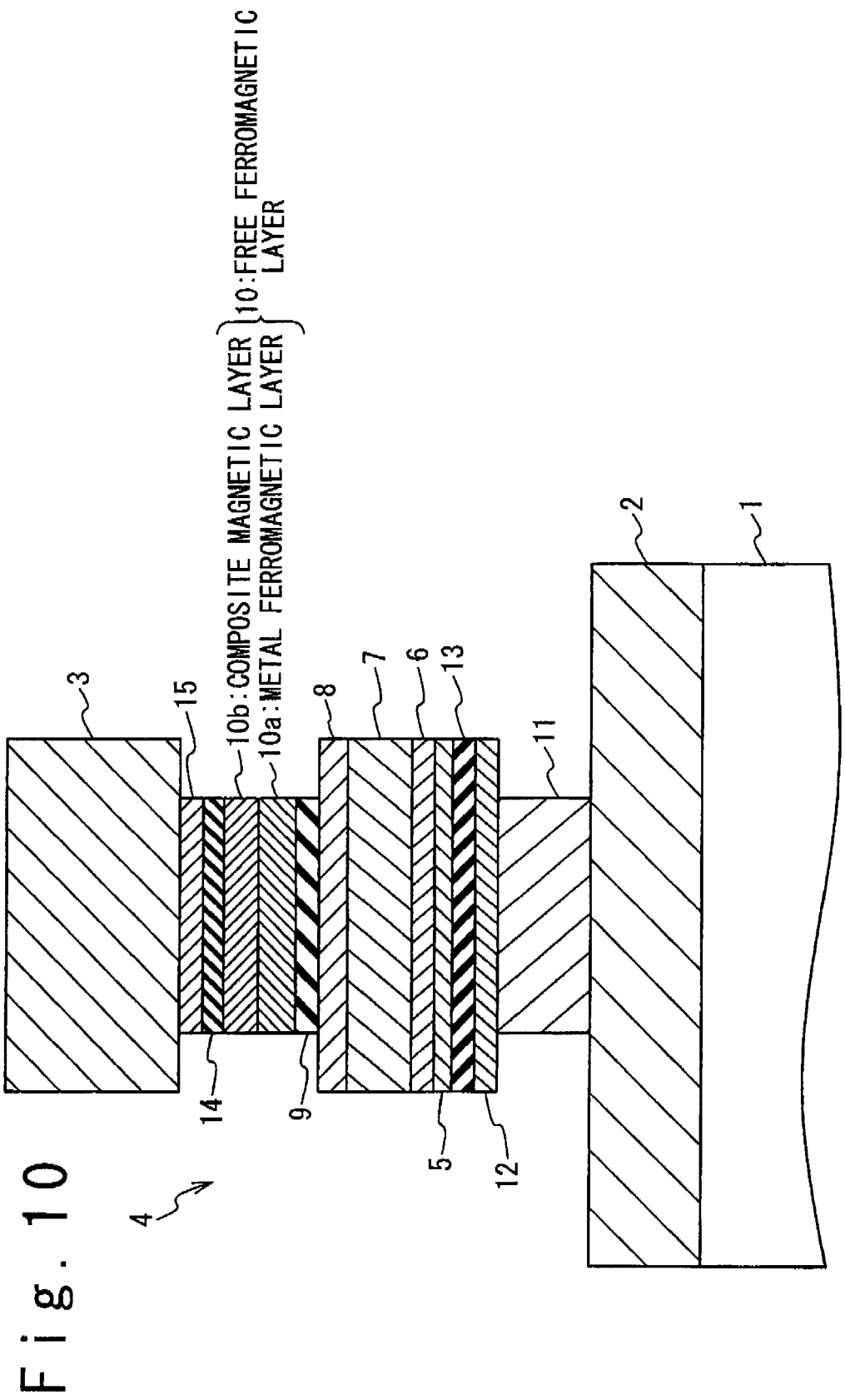
FIG. 10 is a cross sectional view of a fifth modification of the magnetoresistance device in this embodiment, in which a free ferromagnetic layer 10 includes a composite magnetic layer 10b.

FIG. 10 shows a structure for excluding nickel from the free ferromagnetic layer 10 with such composite thin film. The free ferromagnetic layer 10 is composed of a metal ferromagnetic layer 10 formed of material having an increased spin polarization with high thermal stability and diffusion-resistance, and a composite magnetic layer 10 formed of the aforementioned composite thin film. The metal ferromagnetic layer 10a is disposed on the tunnel dielectric layer 9, and the composite magnetic layer 10b is disposed on the metal ferromagnetic layer 10a. The metal ferromagnetic layer 10a is preferably formed with ferromagnetic material including cobalt as main material, typically formed with CoFe. The composite magnetic layer 10b is formed of a composite thin film including mixture of nickel-free ferromagnetic material (typically CoFe), and non-magnetic metal oxide. The free ferromagnetic layer 10 structured as thus described achieves high MR ratio because of the direct contact of the metal ferromagnetic layer 10a, which has an increased spin polarization and thermal stability, with the tunnel dielectric layer 9. Additionally, the magnetically soft composite magnetic layer 10b makes the metal ferromagnetic layer 10a magnetically soft through effecting exchange interaction on the metal ferromagnetic layer 10a, and thereby causes the whole of the free ferromagnetic layer 10 to be magnetically soft.

Figure 11:
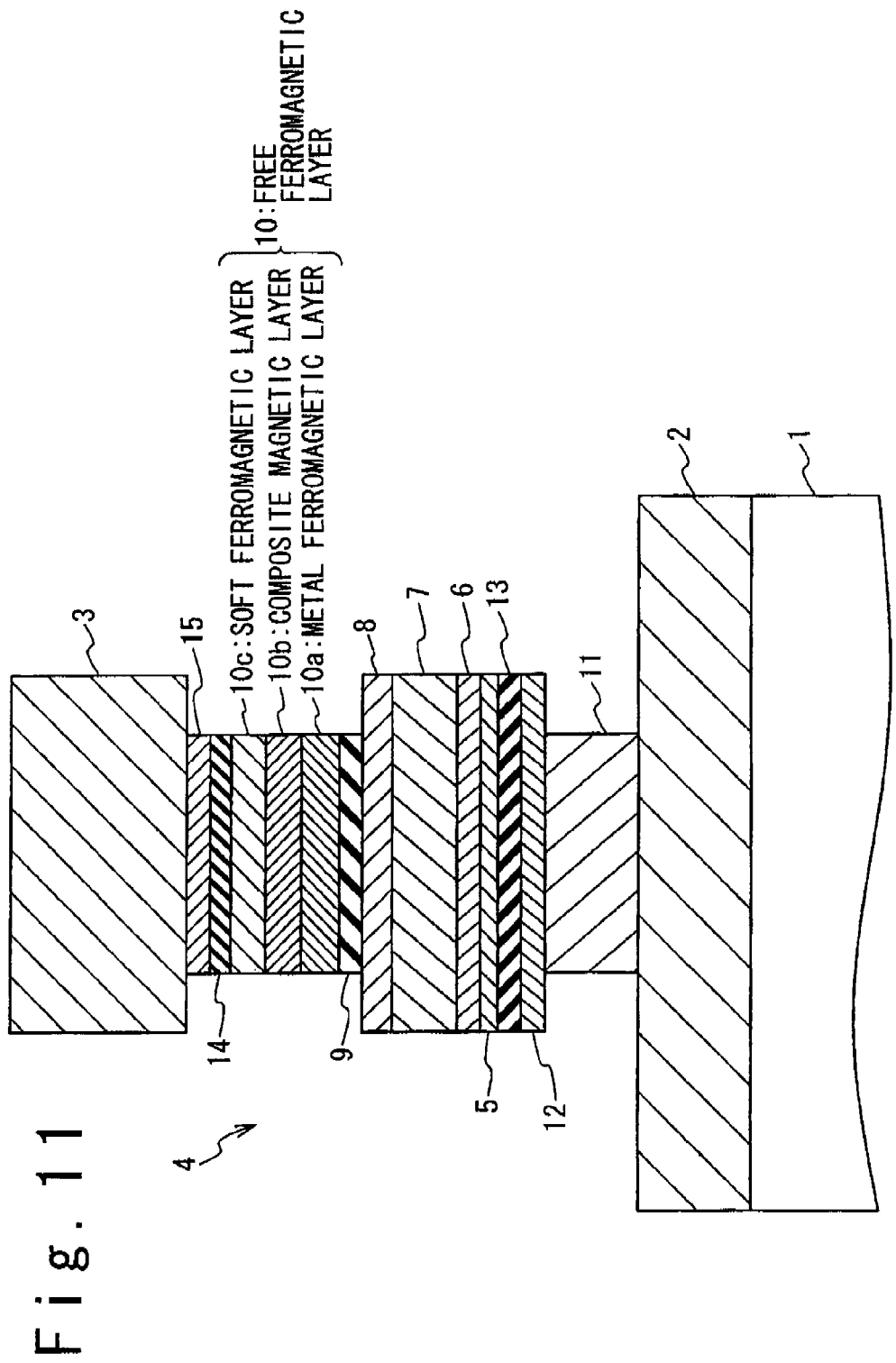
FIG. 11 is a cross sectional view of a sixth modification of the magnetoresistance device in this embodiment, including a composite magnetic layer 10b and a soft ferromagnetic layer 11b.

In order to obtain a free ferromagnetic layer magnetically softer than the free ferromagnetic layer shown in FIG. 10, a softer ferromagnetic layer 10c of nickel-including ferromagnetic material, typically NiFe, may be formed on the composite magnetic layer 10b as shown in FIG. 11. The composite magnetic layer 10b, which is formed with the aforementioned composite thin film, exhibits diffusion-resistance against nickel. Therefore, diffusion of nickel included in the soft ferromagnetic layer 10c into the tunnel dielectric layer 9 is prevented by the composite magnetic layer 10b. Additionally, nickel diffusion from the soft magnetic layer 10c to the top electrode layer 3 is prevented by the aforementioned oxide layer 14. The structure shown in FIG. 11 is preferable in terms of prevention of nickel diffusion into the tunnel dielectric layer 9 and the top electrode layer 3 with an improved MR ratio.

Figure 12:
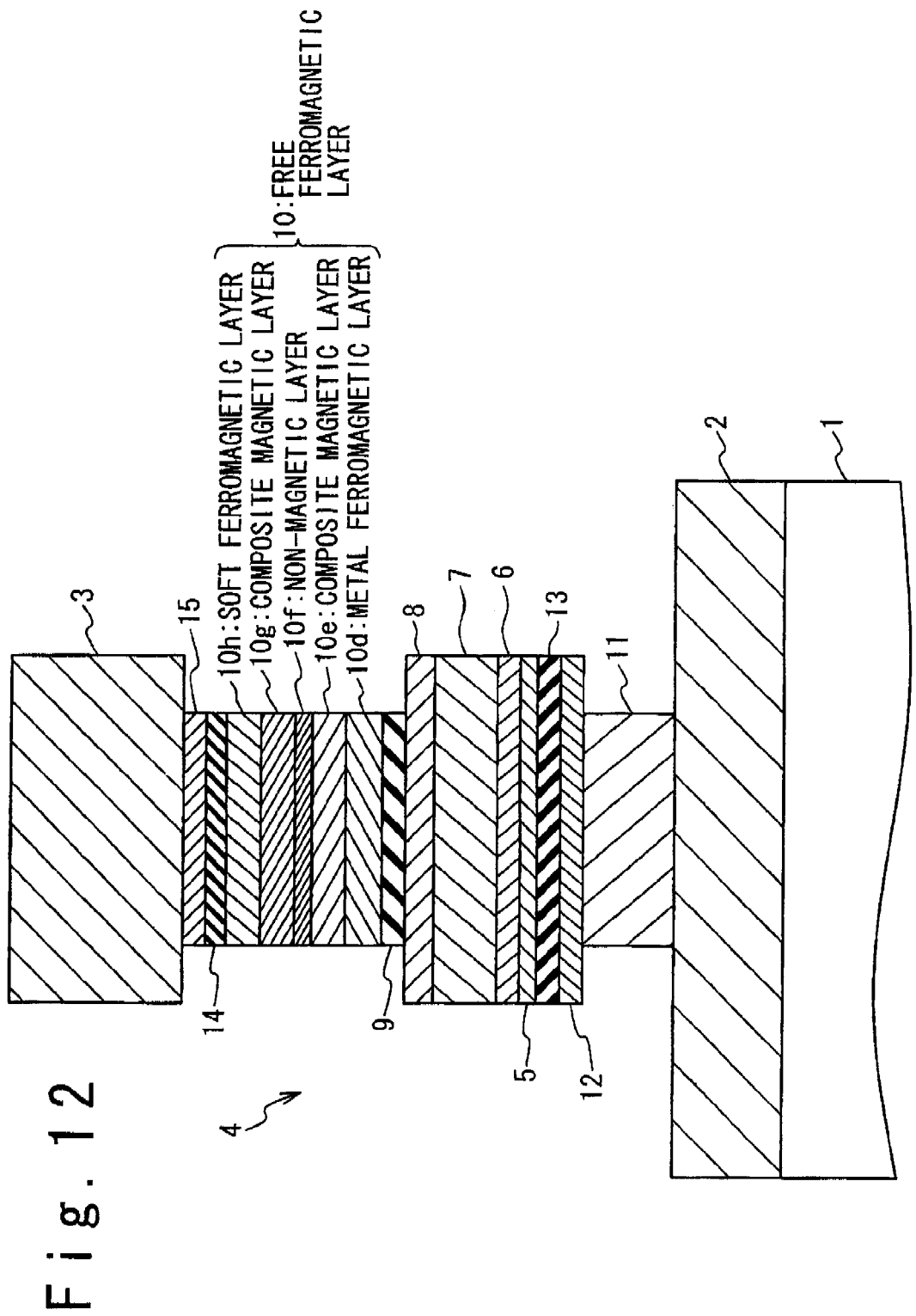
FIG. 12 is a cross sectional view illustrating seventh modification of the magnetoresistance device in this embodiment, in which a free ferromagnetic layer 10 includes a metal ferromagnetic layer 10d, a composite magnetic layer 10e, a non-magnetic layer 10f, a composite magnetic layer 10g and a soft ferromagnetic layer 10h.

The magnetoresistance elements 4 shown in FIGS. 10 and 11 suffer from a problem of an increased demagnetizing field caused by an increase in the total saturated magnetization of the free ferromagnetic layer 10, which is caused by incorporating the composite magnetic layer 10b in the free ferromagnetic layer 10. In order to reduce the demagnetizing field, as shown in FIG. 12, the free ferromagnetic layer 10 is preferably composed of a metal ferromagnetic layer 10d, a composite magnetic layer 10e, a non-magnetic layer 10f, a composite magnetic layer 10g, and a soft ferromagnetic layer 10h. The metal ferromagnetic layer 10d is formed with ferromagnetic material having a large spin polarization ratio, such as CoFe. The composite magnetic layers 10e and 10g are formed with the aforementioned composite thin film to exhibit soft ferromagnetism. The soft ferromagnetic layer 10h is formed with nickel-including ferromagnetic material, typically NiFe. The non-magnetic layer 10f is formed with material that provides strong antiferromagnetical coupling between the composite magnetic layers 10e and 10g, typically Cu, Cr, Rh, Ru, or $RuO_x$.

The non-magnetic layer 10f antiferromagnetically couples spontaneous magnetization of the metal ferromagnetic layer 10d and the composite magnetic layer 10e with that of the composite magnetic layer 10g and the soft ferromagnetic layer 10h to be antiparallel thereto. As disclosed in U.S. Pat. No. 5,408,377, forming the free ferromagnetic layer 4 with two ferromagnetic layers and non-magnetic layer which antiferromagnetically couples the ferromagnetic layers reduces the effective saturated magnetization of the free ferromagnetic layer 4, and thus reduces the demagnetization field. The reduced demagnetization field reduces the coercive field of the free ferromagnetic layer 4. Accordingly, the structure shown in FIG. 12 increases the MR ratio, prevents nickel diffusion into the tunnel dielectric layer 9 and the top electrode layer 3, and makes the free ferromagnetic layer 10 magnetically soft.

In the case that the free ferromagnetic layer 10 is sufficiently soft, the structure shown in FIG. 12 may fail to include the soft ferromagnetic layer 10h. Omitting the soft ferromagnetic layer 10h excludes nickel from the free ferromagnetic layer 10, and thereby fundamentally eliminates the undesirable influence caused by nickel diffusion.

Figure 13:
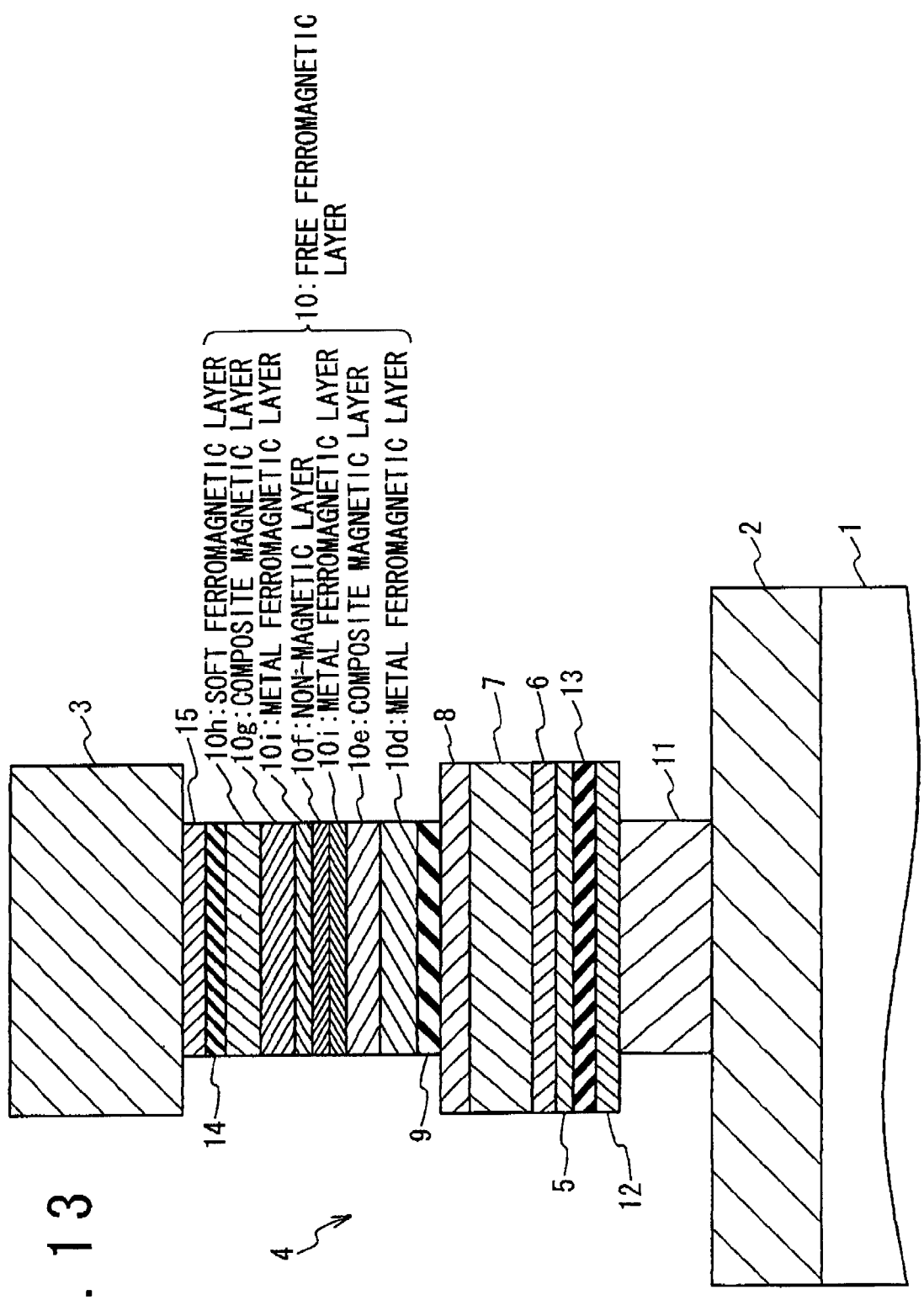
FIG. 13 is a cross sectional view illustrating the seventh modification of the magnetoresistance device in this embodiment, in which the free ferromagnetic layer 10 includes a metal ferromagnetic layer 10i.

As shown in FIG. 13, in order to provide enhanced antiferromagnetic coupling within the free ferromagnetic layer 10, the structure shown in FIG. 12 preferably includes metal ferromagnetic layers 10i on the both surfaces of the non-magnetic layer 10f. Forming the metal ferromagnetic layers 10i with nickel-free ferromagnetic alloy including cobalt as main material enhances the antiferromagnetic coupling. It is preferable that such metal ferromagnetic layers 10i. The metal ferromagnetic layers 10i preferably formed with Co or $Co_{90}Fe_{10}$.

Figure 14:
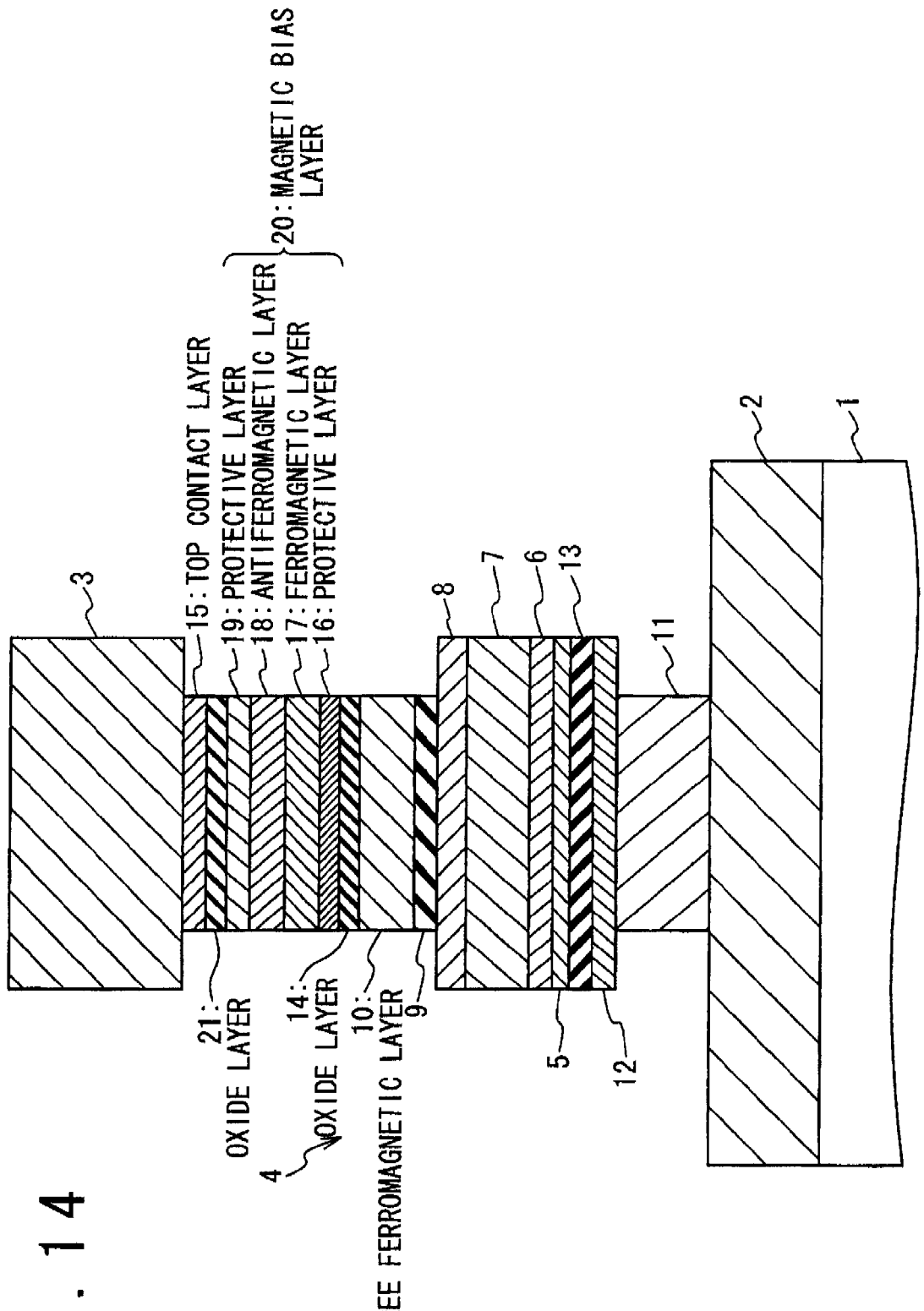
FIG. 14 is a cross sectional view illustrating a eighth modification of the magnetoresistance device in this embodiment, including a magnetic bias layer 20.

In order to improve the magnetoresistance element, as shown in FIG. 14, a magnetic bias layer 20 may be provided for the free ferromagnetic layer 10. Applying an appropriate bias magnetic field eliminates asymmetrically in the hysteresis curve of the free ferromagnetic layer 10 with respect to magnetic field directions.

The magnetic bias layer 20 includes a protective layer 16, a ferromagnetic layer 17 of ferromagnetic material, an antiferromagnetic layer 18 of antiferromagnetic material, and a protective layer 19. The protective layers 16 and 19 are typically formed with Ta or Zr. The ferromagnetic layer 17 is typically formed with CoFe. The antiferromagnetic layer 18 is formed with manganese-including antiferromagnetic material, typically PtMn, or IrMn. The positions of the ferromagnetic layer 17 and the antiferromagnetic layer 18 may be permutated.

As is the case of the antiferromagnetic layer 7, the antiferromagnetic layer 18 potentially causes manganese diffusion. In order to resolve the problem of the manganese diffusion, in the case that the magnetoresistance element includes the magnetic bias layer 20, the magnetic bias layer 20 is disposed on the oxide layer 14 and an oxide layer 21 is disposed between the magnetic bias layer 20 and the top contact layer 15. The oxide layer 14 prevents manganese diffusion into the tunnel dielectric layer 9, while the oxide layer 21 prevents manganese diffusion into the top interconnection 3.

Characteristics required for the oxide layer 21 are identical to those for the oxide layer 13, and thus preferred materials and structures for the oxide layer 13 are also preferable for the oxide layer 21. Firstly, in order for the oxide layer 21 to be fine-structured, thermally stable against high temperature, and to exhibit an increased resistance against the interdiffusion, the oxide layer 21 is preferably formed with oxide of aluminum, magnesium, silicon, hafnium, lithium, calcium, or titanium. Furthermore, the resistance of the oxide layer 21 in the thickness direction is preferably smaller than that of the tunnel dielectric layer 9. Additionally, the thickness of the oxide layer 21 is preferably reduced below 1 nm, to extremely reduce the resistance of the oxide layer 14, and to thereby improve the SN ratio of detecting the resistance of the tunnel dielectric layer 9. Finally, forming the oxide layer 21 with the same material as the tunnel dielectric layer 9 desirably allows the formation of the oxide layer 21 and the tunnel dielectric layer 9 with the same apparatus and material, and thereby reduces the fabrication cost of the MRAM.

The oxide layer 21 is preferably formed with oxide of material more reactive to oxygen than material included in layers in contact with the bottom and top surfaces thereof (that is, the bottom contact layer 12 and the seed layer 5), the bottom surface designating the surface on the side of the substrate 1. The use of oxide of material not satisfying this requirement undesirably allows the oxide diffusion into the layers in contact with the bottom and top surfaces of the oxide layer 21, and thus spoils the diffusion resistance of the oxide layer 21. In the case that tantalum is used for the top contact layer 15, and tantalum or chromium is used for the protective layer 19, the oxide layer 21 is preferably formed with oxide of aluminum, magnesium, silicon, hafnium, lithium, calcium, or tantalum, which have smaller free energies of oxide formation than those of tantalum and chromium.

Figure 5:
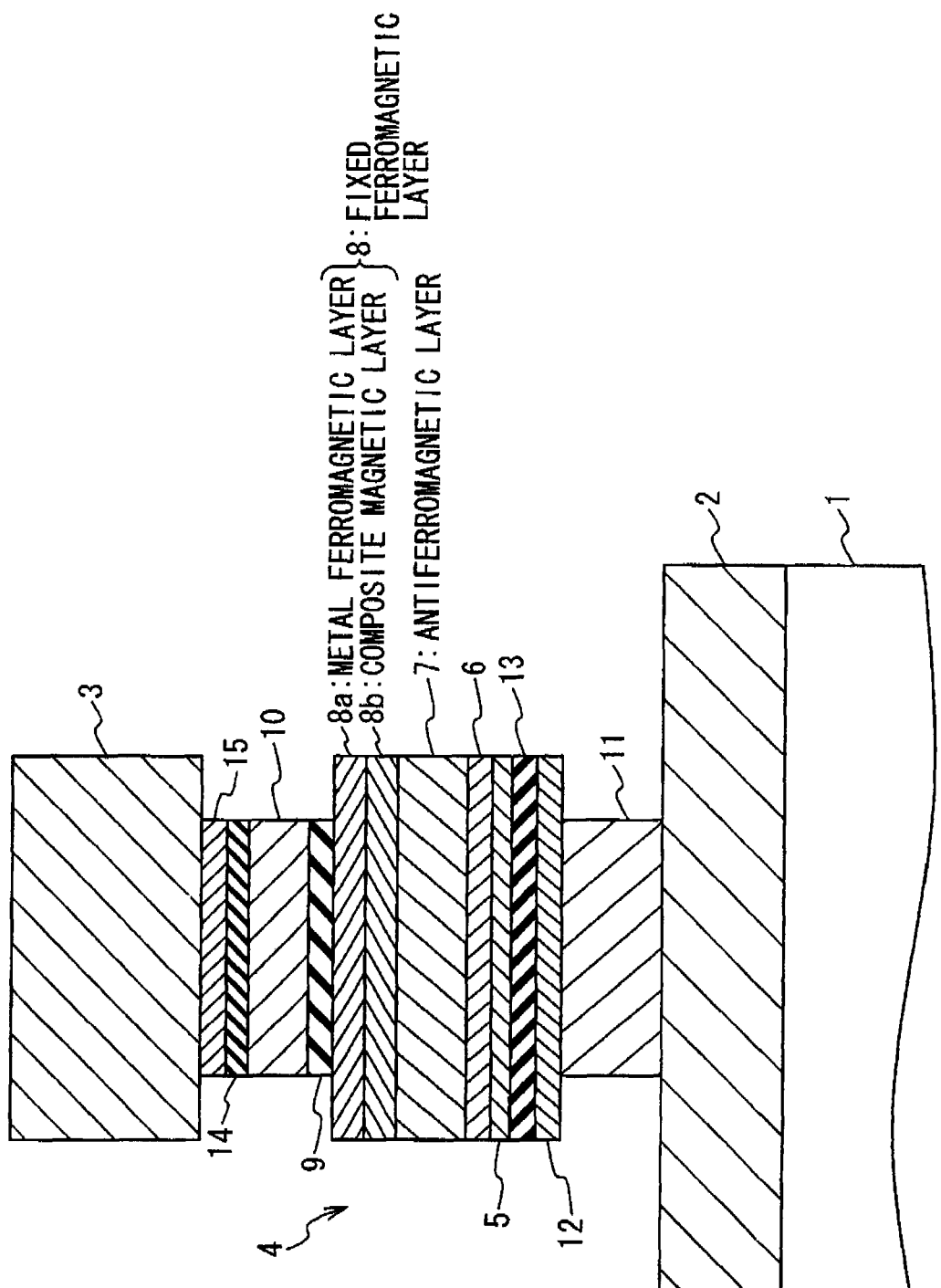
Figure 15:
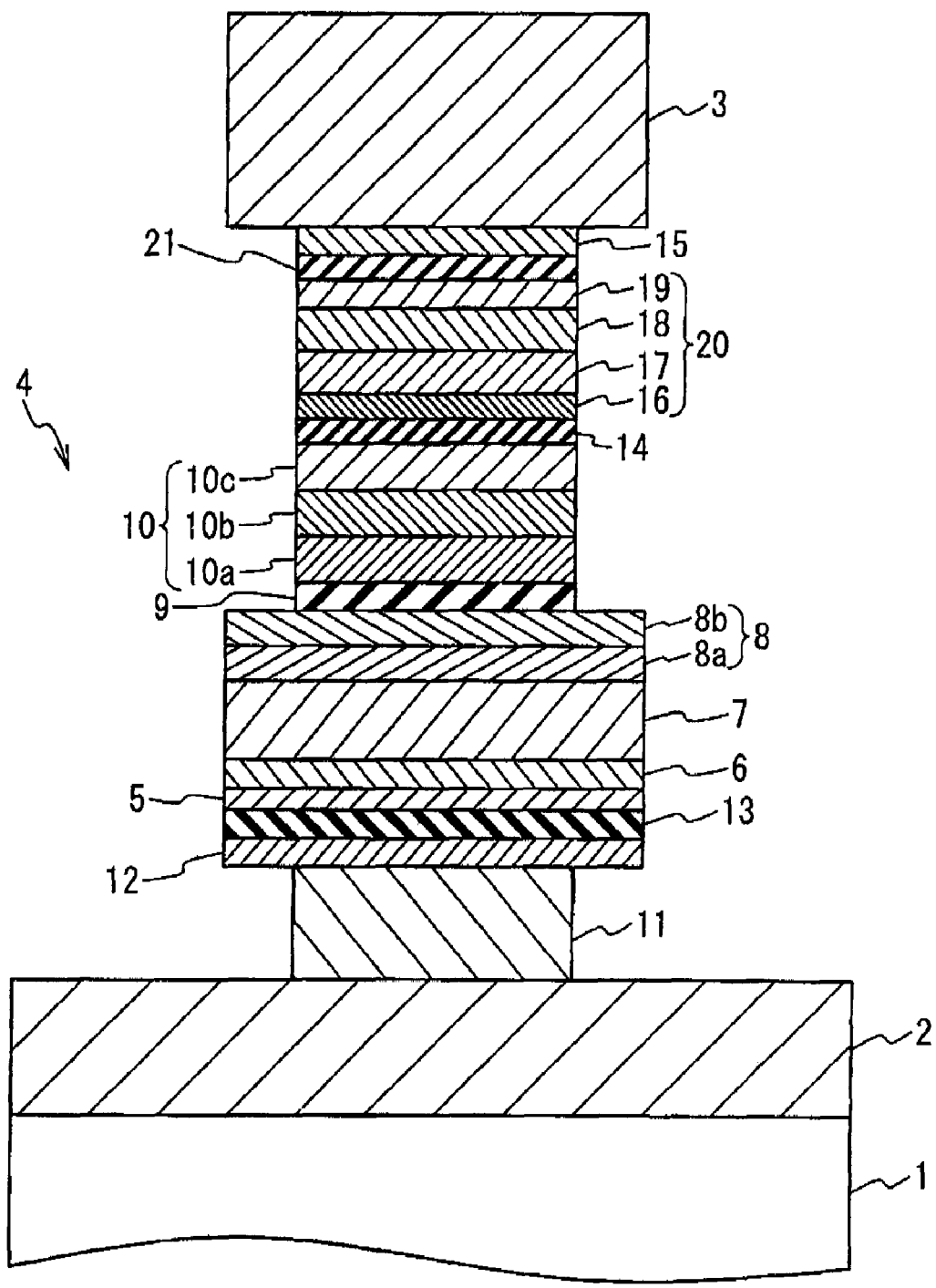
FIG. 15 is a cross sectional view illustrating a ninth modification of the magnetoresistance device in this embodiment, including a composite magnetic layer 8a, a composite magnetic layer 10b, a soft ferromagnetic layer 10c, a magnetic bias layer 20, and an oxide layer 21.

The structures of the bottom contact layer 12' shown in FIG. 2, the top contact layer 15' shown in FIG. 3, the fixed ferromagnetic layer 8 shown in FIG. 5, the free ferromagnetic layers 10 shown in FIGS. 10 through 14, the magnetic bias layer 20 shown in FIG. 14 may be combined. For example, a structure shown in FIG. 15 may be the case. The MRAM shown in FIG. 15 has the fixed ferromagnetic layer 8 composed of the composite magnetic layer 8a and the ferromagnetic layer 8b. Additionally, the MRAM has the free ferromagnetic layer 10 composed of the metal ferromagnetic layer 10a, the composite magnetic layer 10b and the soft ferromagnetic layer 10c. Furthermore, the magnetic bias layer 20 is disposed on the oxide layer 14, and the oxide layer 21 is disposed between the magnetic bias layer 20 and the top contact layer 15.

Figure 16:
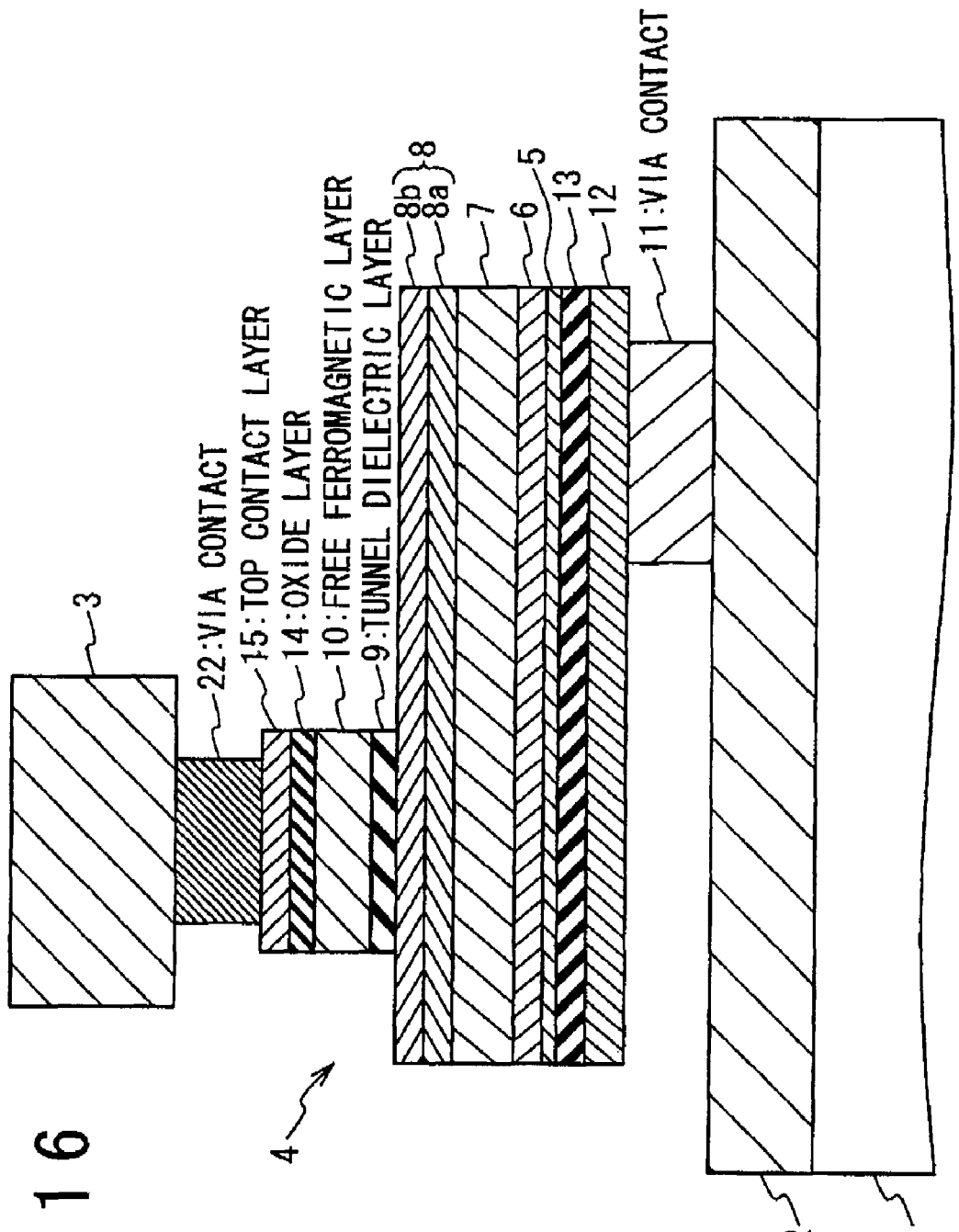
FIG. 16 is a cross sectional view illustrating a tenth modification of the magnetoresistance device in this embodiment, in which a via contact 11 and tunnel ferromagnetic layer 9 do not overlap in a direction perpendicular to a major surface of a substrate 1.

FIG. 16 shows a more practical structure of a magnetoresistance element. The top contact layer 15 and the top interconnection 3 is connected through a via contact 22. The via contact 22 is typically formed with Al, Cu, W, or TiN. Additionally in the magnetoresistance element shown in FIG. 16, the tunnel dielectric layer 9 is positioned so as not to overlap the via contact 11 in the direction perpendicular to the major surface of the substrate 1. Such arrangement of the tunnel dielectric layer 9 desirably reduces defections of the tunnel dielectric layer 9. The via contact 11, which is formed with metal, inevitably has an uneven surface thereon. Positioning the tunnel dielectric layer 9 so as to overlap the via contact 11 as shown in FIG. 1 develops an uneven surface thereon, and thus tends to generate defects within the tunnel dielectric layer 9. The arrangement in which the tunnel dielectric layer 9 does not overlap the via contact 11, as shown in FIG. 16, reduces defects in the tunnel dielectric layer 9.

Figure 17:
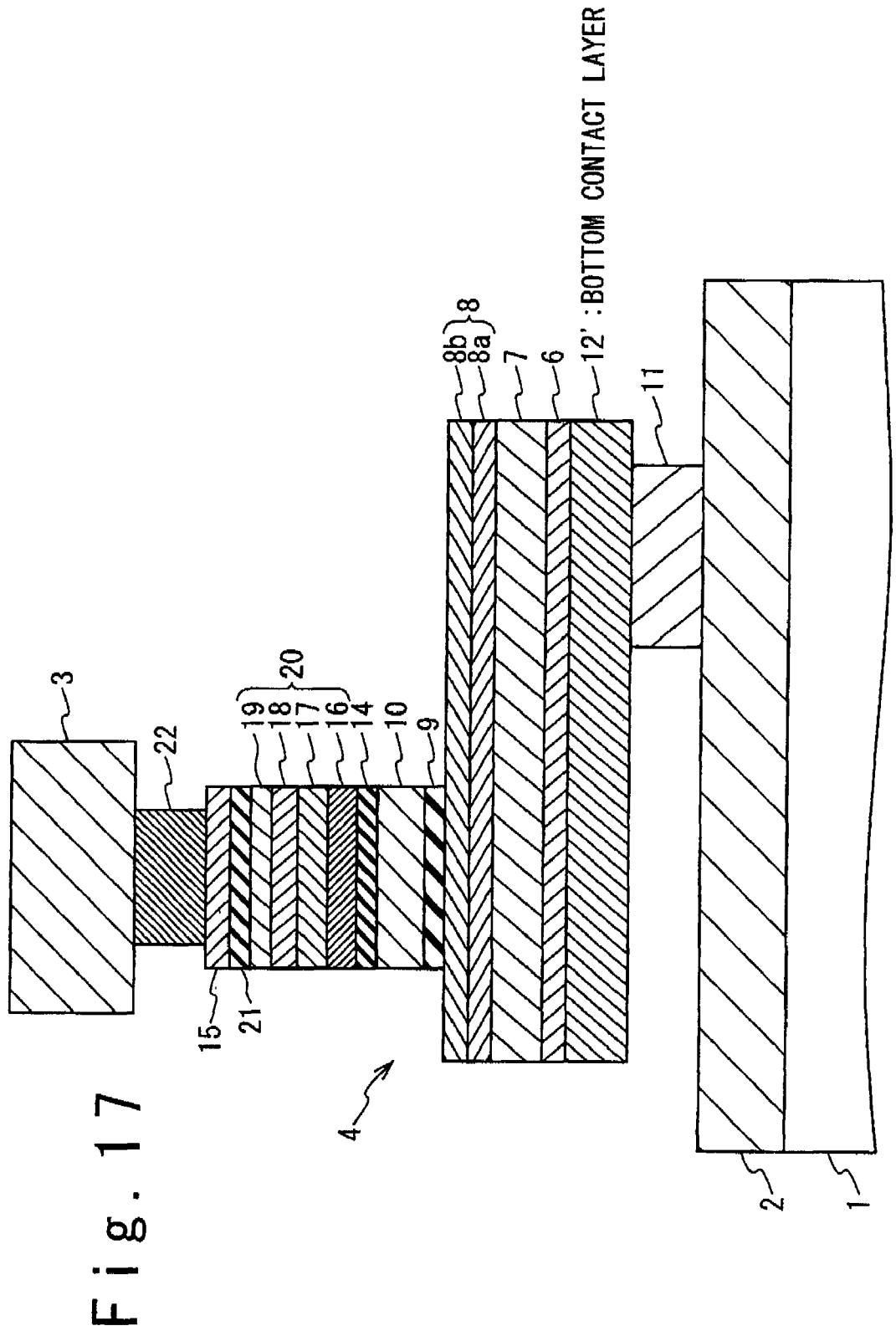
FIG. 17 is a cross sectional view illustrating an eleventh modification of the magnetoresistance device in this embodiment, in which a via contact 11 and tunnel ferromagnetic layer 9 do not overlap in a direction perpendicular to a major surface of a substrate 1.

In the case that such arrangement is adopted that tunnel dielectric layer 9 does not overlap the via contact 11, the structures of the bottom contact layer 12' shown in FIG. 2, the top contact layer 15' shown in FIG. 3, the fixed ferromagnetic layer 8 shown in FIG. 5, the free ferromagnetic layers 10 shown in FIGS. 10 through 14, the magnetic bias layer 20 shown in FIG. 14 may be also combined. For example, the structure shown in FIG. 17 may be the case. In an MRAM shown in FIG. 17, the magnetoresistance element 4 and the bottom interconnection 2 are electrically connected through the thick bottom contact layer 12'. Furthermore, the fixed ferromagnetic layer 8 is composed of the compound magnetic layer 8a and the ferromagnetic layer 8b. The magnetic bias layer 20 is disposed on the oxide layer 14, while the oxide layer 21 is disposed between the magnetic bias layer 20 and the top contact layer 15.

Figure 18:
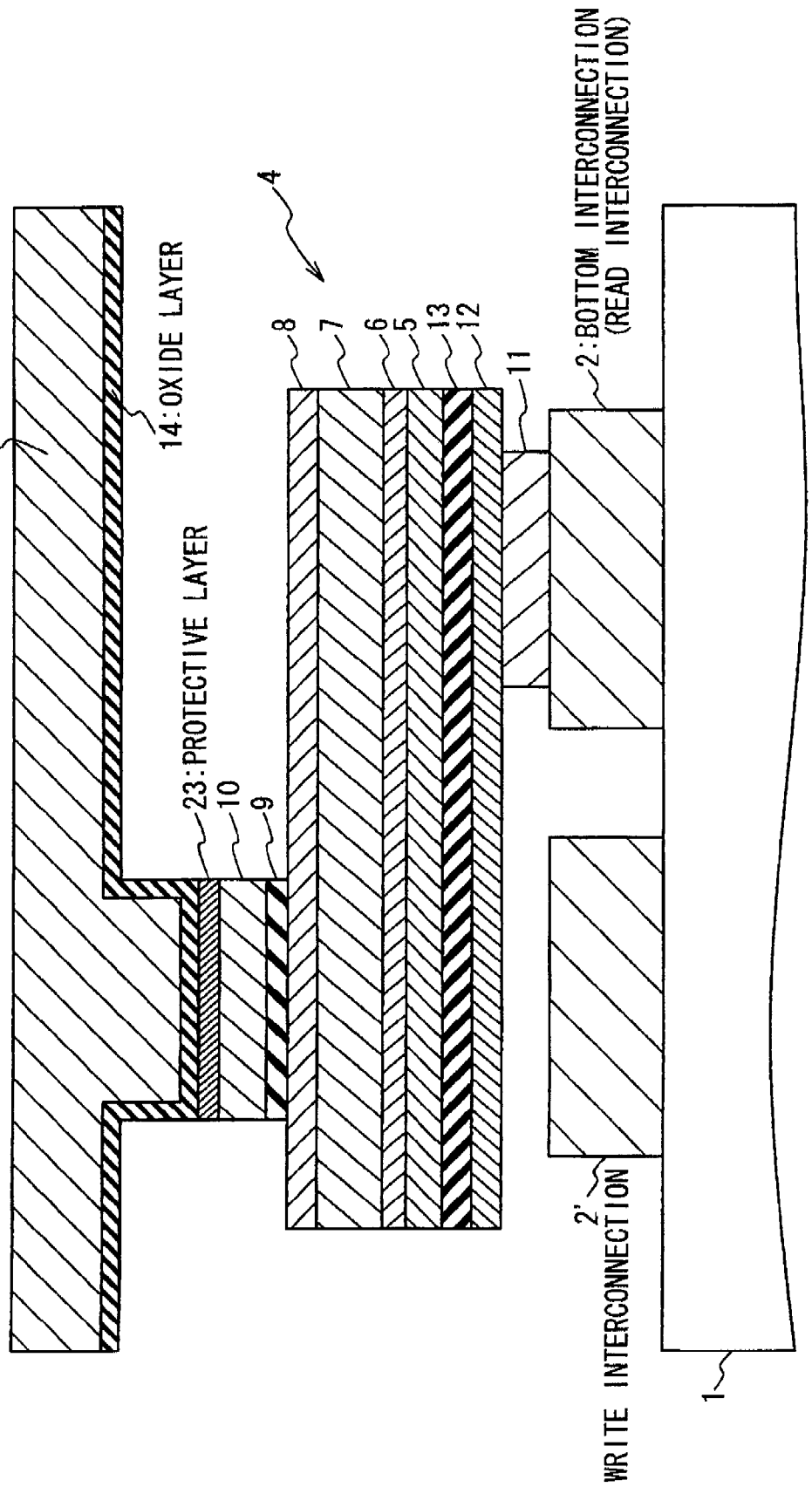
FIG. 18 is a cross sectional view illustrating a twelfth modification of the magnetoresistance device in this embodiment, including a write interconnection 2' in addition to a bottom interconnection 2, which is used for read operation.

Such arrangement that the tunnel dielectric layer 9 does not overlap the via contact 11 in the direction perpendicular to the major surface of the substrate 1, as shown in FIG. 18, is preferable for the case that the bottom interconnection 2, which is electrically connected to the via contact 11, is dedicated to read operations of the MRAM, and a write interconnection 2' is additionally disposed parallel to the interconnection 2; the write interconnection 2' is electrically isolated from the bottom interconnection 2. When this arrangement is adopted, determining the data stored in the free ferromagnetic layer 10 (that is, detecting the resistance of the tunnel dielectric layer 9) is achieved through detecting a current generated by a voltage applied between the top and bottom interconnections 3 and 2. The data write into the free ferromagnetic layer 10, on the other hand, is achieved by developing currents through the top interconnection 3 and the write interconnection 2'.

Furthermore, in the case that the top interconnection 3 is formed with a copper layer, as shown in FIG. 18, the oxide layer 14, which is disposed between the free ferromagnetic layer 10 and the top interconnection 3, is disposed to separate the top interconnection 3 from a interlayer dielectric (not denoted by numeral) covering the magnetoresistance element 4. In this case, the top contact layer 15 is omitted; instead, a protective layer 23 is disposed between the free ferromagnetic layer 10 and the oxide layer 14. The protective layer 23 is typically formed with tantalum or zirconium. This structure desirably prevents both the interdiffusion between the magnetoresistance element 4 and the top interconnection 3 and the diffusion of the interlayer dielectric with copper included in the top interconnection 3.

It is apparent that the structures of the magnetoresistance elements 4 described in this embodiment may be applied to magnetic read heads.

EXPERIMENTAL RESULTS

The improvement in the magnetoresistance element through disposing the oxide layers 13 and 14 has been investigated using two samples having the structures described below:

Comparative Example 1 substrate/Ta (3 nm)/AlCu (50 nm)/Ta (3 nm)/$Ni_{81}Fe_{19}$ (3 nm)/IrMn (10 nm)/$Co_{90}Fe_{10}$ (6 nm)/$AlO_x$ (2 nm)/$Co_{90}Fe_{10}$ (2.5 nm)/$Ni_{81}Fe_{19}$ (7.5 nm)/Ta (5 nm)/AlCu (300 nm), and

Example 1

The Present Invention substrate/Ta (3 nm)/AlCu (50 nm)/Ta (3 nm)/$Al_2O_3$ (1 nm)/Ta (3 nm)/$Ni_{81}Fe_{19}$ (3 nm)/IrMn (10 nm)/$Co_{90}Fe_{10}$ (6 nm)/$AlO_x$ (2 nm)/$Co_{90}Fe_{10}$ (2.5 nm)/$Ni_{81}Fe_{19}$ (7.5 nm)/$Al_2O_3$ (1 nm)/Ta (5 nm)/AlCu (300 nm).

Comparative Example 1 corresponds with the structure shown in FIG. 1 with the oxide layers 13 and 14 omitted. Example 1 corresponds with the structure shown in FIG. 1, having the oxide layers 13 and 14 formed with $Al_2O_3$ of 1 nm in thickness. The AlCu layer of 50 nm in thickness corresponds with the bottom interconnection 2, while the AlCu layer of 300 nm in thickness corresponds with the top interconnection 3.

Figure 19:
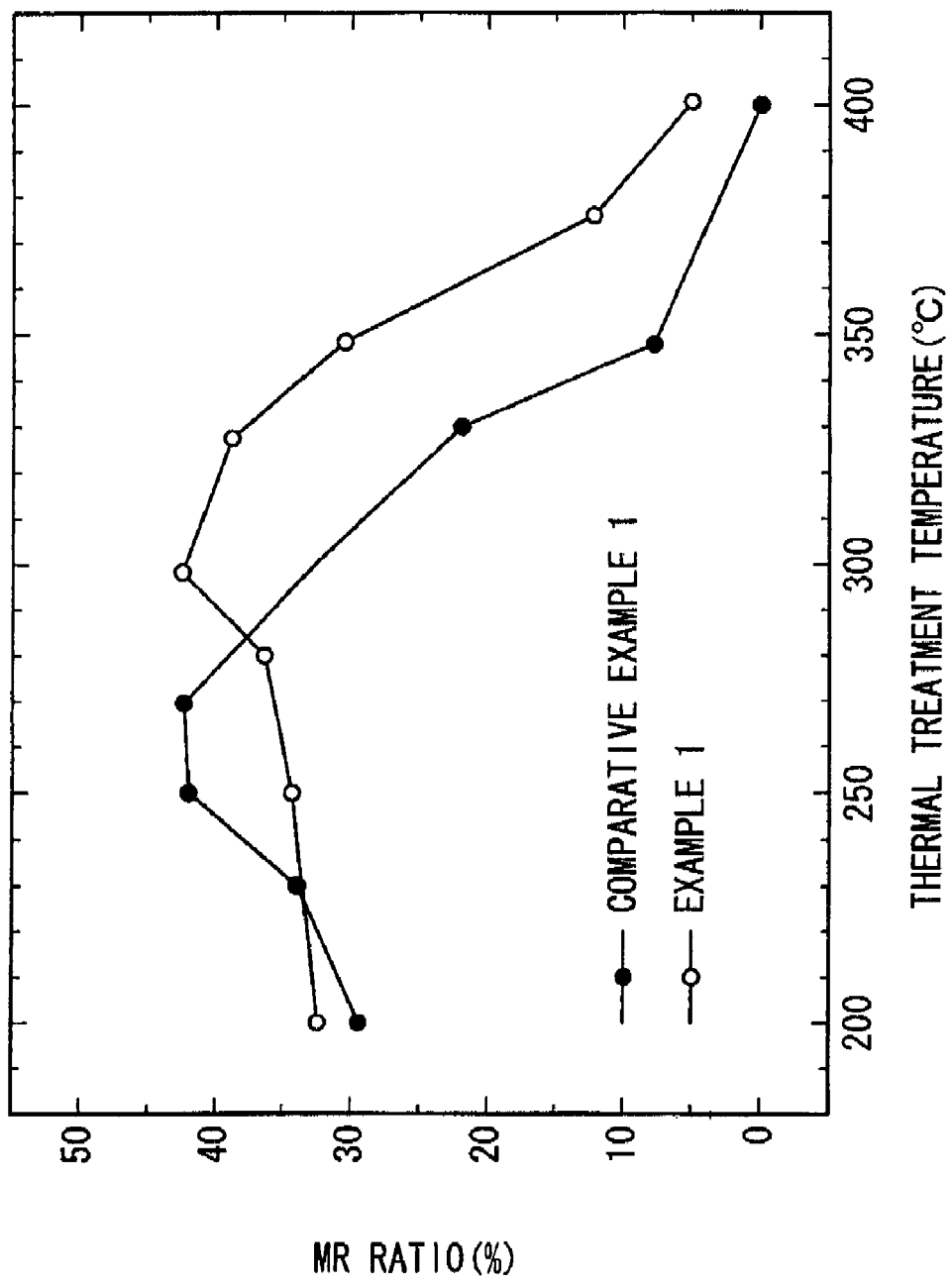
FIG. 19 is a graph illustrating dependencies of MR ratios of magnetic tunnel junctions on thermal treatment temperature obtained from Comparative Example 1 and Example 1.

FIG. 19 illustrates changes in MR ratios of Comparative Example 1 and Example 1 depending on the thermal treatment temperature. Comparative Example 1 experience reduction in the MR ratio after the thermal treatment at the temperatures over 300° C., while Example 1 is resistant to the thermal treatment at or below 300° C., and experiences minor reduction after the thermal treatment over 300° C. It is considered that this results from that the oxide layers 13 and 14, formed with $Al_2O_3$ of 1 nm in thickness, prevents the diffusion of aluminum and copper form the AlCu layer into the magnetic tunnel junction.

Next, the effect of the oxide layer 13 against the diffusion of nickel and manganese from the buffer layer 6 and the antiferromagnetic layer 7 into the bottom interconnection 2 has been investigated using three samples having the structures described below:

Comparative Example 2 substrate/Ta (3 nm)/AlCu (50 nm)/Ta (3 nm)/$Ni_{81}Fe_{19}$ (3 nm)/IrMn (10 nm)/$Co_{90}Fe_{10}$ (4 nm),

Example 2

The Present Invention substrate/Ta (3 nm)/AlCu (50 nm)/Ta (3 nm)/$Al_2O_3$ (1 nm)/Ta (3 nm)/$Ni_{81}Fe_{19}$ (3 nm)/IrMn (10 nm)/$Co_{90}Fe_{10}$ (4 nm), and

Example 3

The Present Invention substrate/Ta (3 nm)/AlCu (50 nm)/Ta (3 nm)/MgO (1 nm)/Ta (3 nm)/$Ni_{81}Fe_{19}$ (3 nm)/IrMn (10 nm)/$Co_{90}Fe_{10}$ (4 nm).

Comparative Example 2 corresponds with a portion of the structure of FIG. 1 between the tunnel dielectric layer 9 and the substrate 1 with the oxide layer 13 omitted. Example 2 corresponds a portion of the structure of FIG. 1 between the tunnel dielectric layer 9 and the substrate 1, having the oxide layer 13 formed with $Al_2O_3$ of 1 nm in thickness. Example 3 corresponds a portion of the structure of FIG. 1 between the tunnel dielectric layer 9 and the substrate 1, having the oxide layer 13 formed with MgO of 1 nm in thickness. For all the samples, the AlCu layers of 50 nm in thickness correspond with the bottom electrodes 2.

Figure 20:
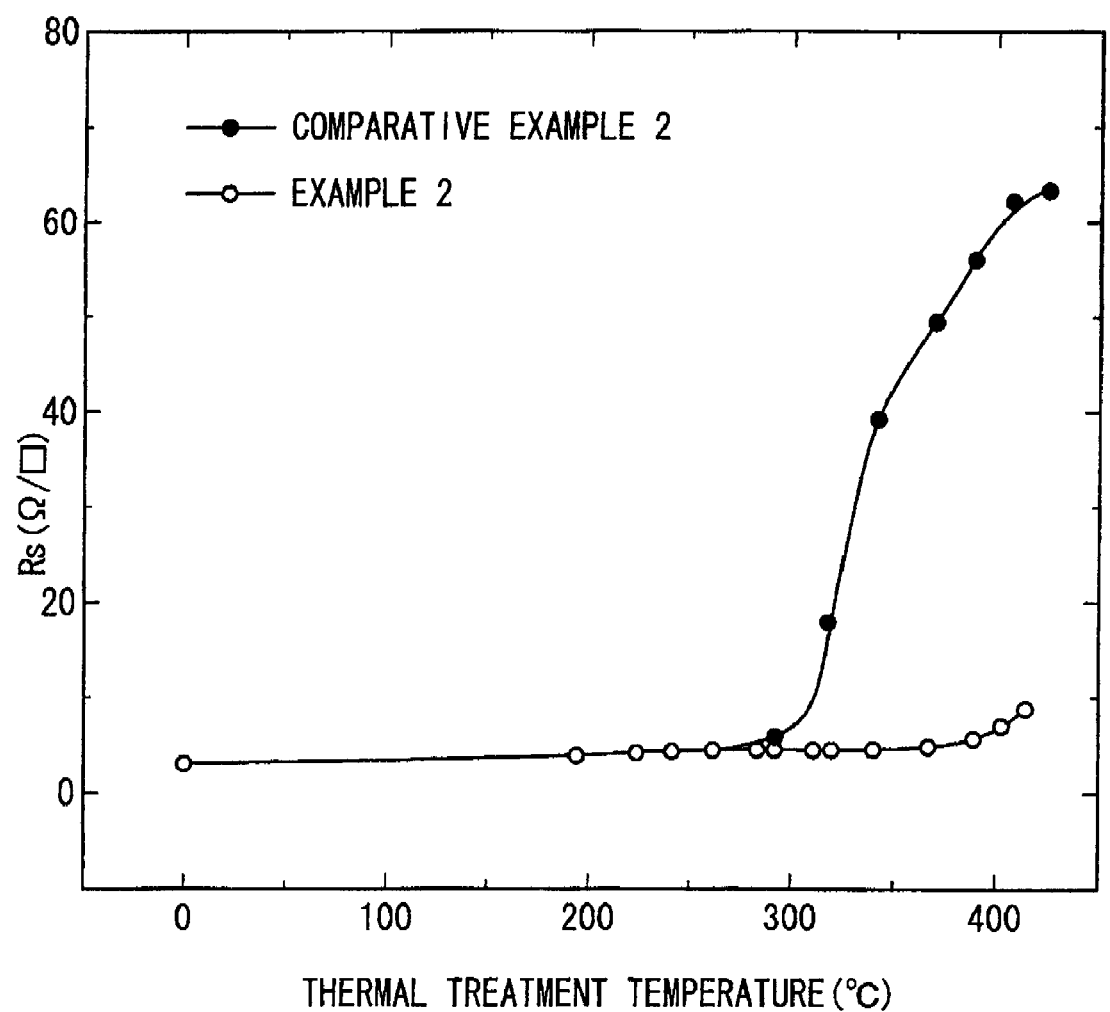
FIG. 20 is a graph illustrating changes in sheet resistances of AlCu layers depending on thermal treatment temperature obtained from Comparative Example 2 and Example 2.

FIG. 20 illustrates changes in sheet resistances of the AlCu layers depending on the thermal treatment temperature obtained from Comparative Example 2 and Example 2. Comparative Example 2, which does not include the oxide layer 13, suffers from a remarkable increase in the sheet resistance of the AlCu layer after the thermal treatment at the temperatures over 300° C. In contrast, Example 2, which includes the oxide layer 13 of $Al_2O_3$, exhibits no increase in the sheet resistance after the thermal treatment at 350° C., and experiences only a minor increase in the sheet resistance after the thermal treatment at about 400° C.

FIG. 21 illustrates sheet resistances of the AlCu layers of Comparative Example 2, and Example 2 and 3 after thermal treatment at various temperatures. As shown in FIG. 21, Comparative Example 2, which does not include the oxide layer 13, experiences an increase in the sheet resistance after the thermal treatment at the temperatures of 350° and 400° C. In contrast, Example 2, which has the oxide layer 13 formed with $Al_2O_3$, and Example 3, which has the oxide layer 13 formed with MgO, are not influenced by the thermal treatment at 350° C. Furthermore, Examples 2 and 3 experience only minor increases in the sheet resistance after the thermal treatment at 400° C.

Next, the effect of the oxide layer 14 against the interdiffusion between the top interconnection 3 and the free ferromagnetic layer 10 has been investigated using two samples having the following structures:

Comparative Example 3 substrate/Ta (1.5 nm)/$Co_{90}Fe_{10}$ (10 nm)/$AlO_x$ (2 nm)/$Co_{90}Fe_{10}$ (2.5 nm)/$Ni_{81}Fe_{19}$ (7.5 nm)/Ta (5 nm)/AlCu (300 nm), and

Example 4

The Present Invention substrate/Ta (1.5 nm)/$Co_{90}Fe_{19}$ (10 nm)/$AlO_x$ (2 nm)/$Co_{90}Fe_{10}$ (2.5 nm)/$Ni_{81}Fe_{19}$ (7.5 nm)/$Al_2O_3$ (1 nm)/Ta (5 nm)/AlCu (300 nm).

For both of Comparative Example 3 and Example 4, the $Co_{90}Fe_{10}$ layer of 2.5 nm in thickness and the $Ni_{81}Fe_{19}$ layer of 7.5 nm in thickness correspond with the free ferromagnetic layer 10, while the AlCu layer of 300 nm in thickness corresponds with the top interconnection 3. The $Al_2O_3$ layer incorporated within the Example 4 corresponds with the oxide layer 14. In order to exclude influences caused by manganese, Comparative Example 3 and Example 4 do not include the antiferromagnetic layer 7.

Figure 22:
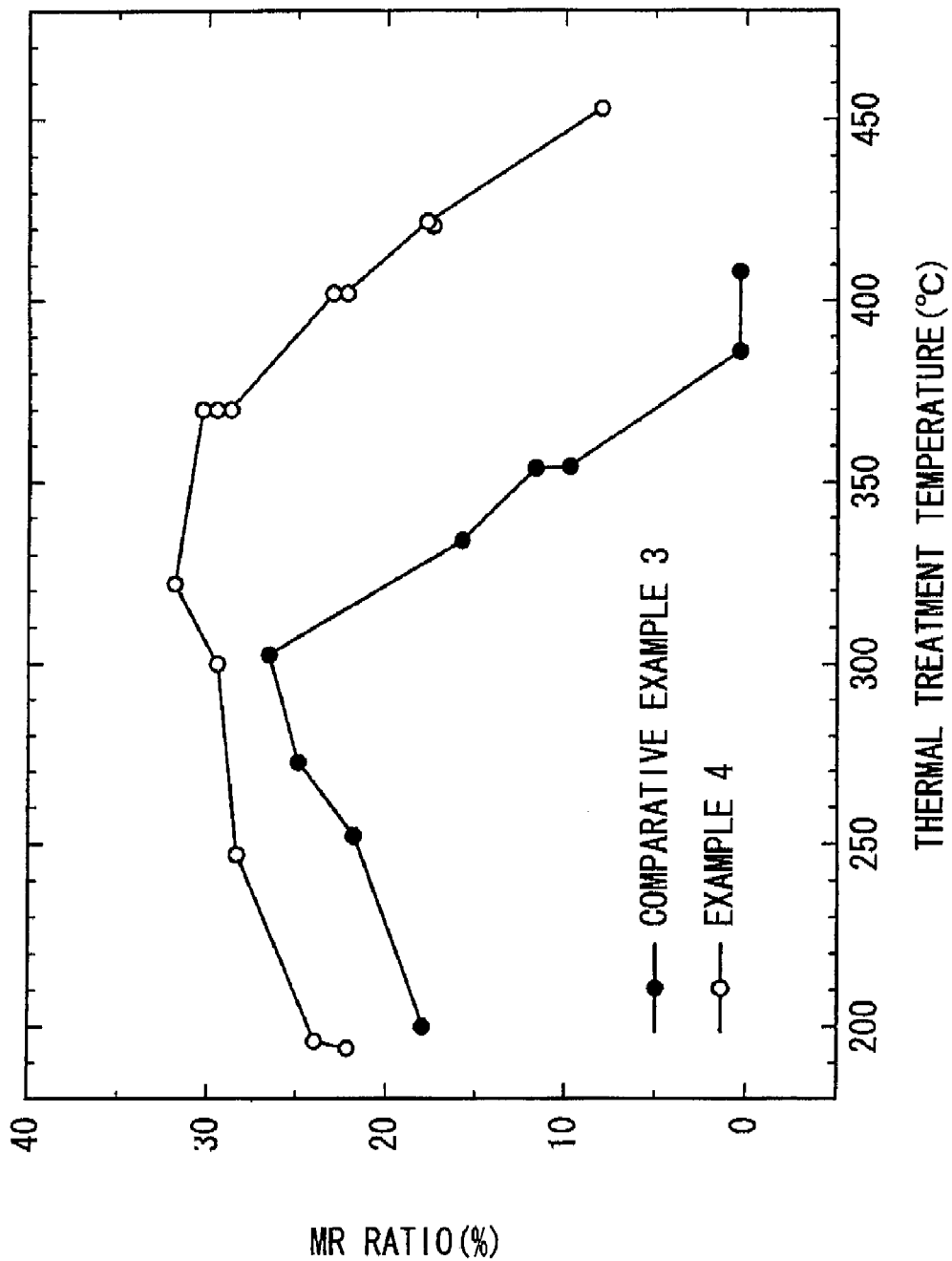
FIG. 22 is a graph illustrating changes in MR ratios of magnetic tunnel junctions depending on thermal treatment temperature obtained from Comparative Example 3 and Example 4.

FIG. 22 illustrates changes in the MR ratios of Comparative Example 3 and Example 4 depending on the thermal treatment temperature. Example 3 suffers from decrease in the MR ratio after the thermal treatment at or over 300° C., while Example 4 is resistant against the thermal treatment at relatively high temperature up to 370° C. Furthermore, Example 4 achieves an MR ratio of 20% after the thermal treatment at 400° C. It is considered that this results from that the oxide layer 14, formed with $Al_2O_3$ of 1 nm in thickness prevents the diffusion of aluminum and copper from the AlCu layer into the magnetic tunnel junction.

Figure 23:
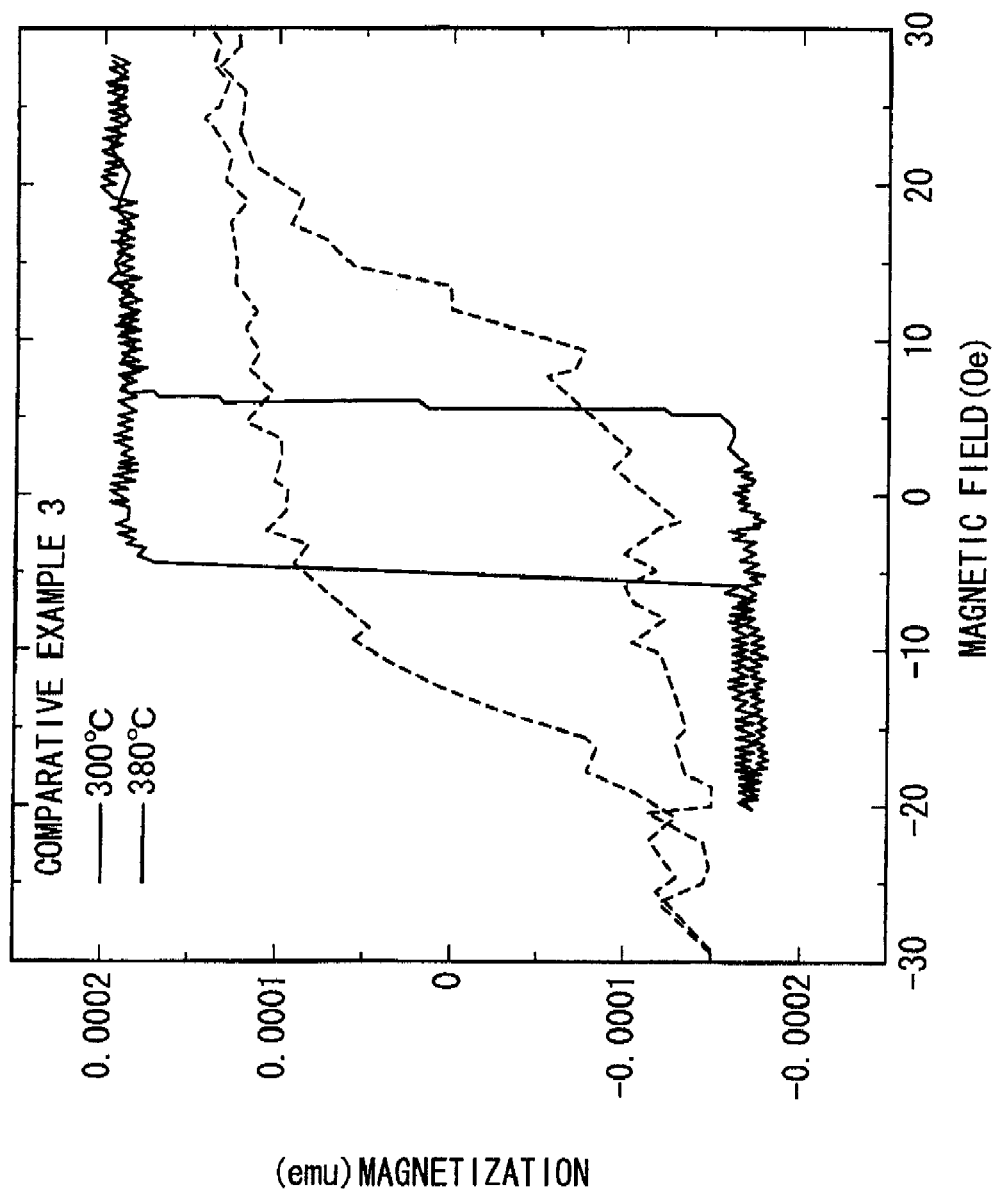
FIG. 23 is a graph illustrating magnetization curves obtained from Comparative Example 3.
Figure 24:
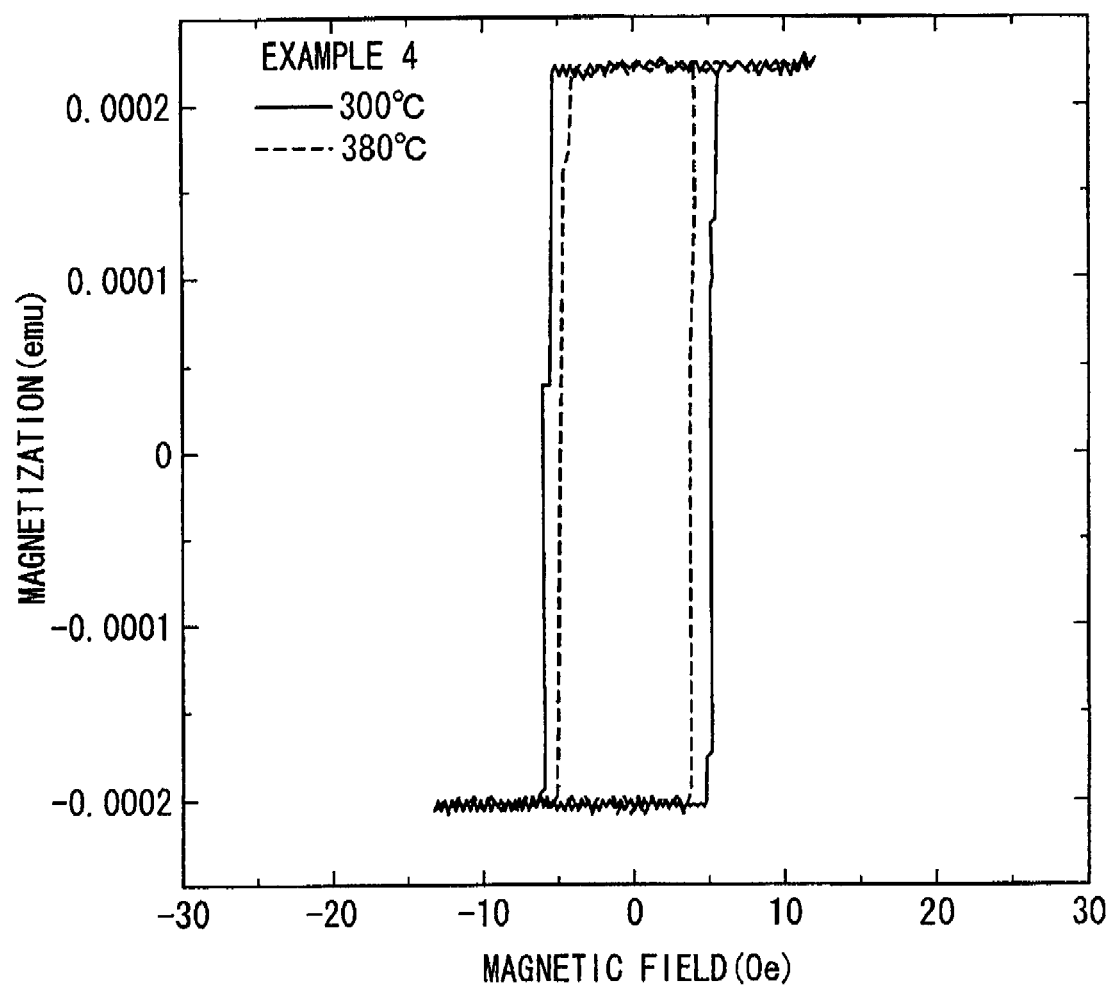
FIG. 24 is a graph illustrating magnetization curve obtained form Example 4.

FIG. 23 illustrates a magnetization curve of the $Ni_{81}Fe_{19}$ layer within Comparative Example 3, while FIG. 24 illustrates a magnetization curve of the $Ni_{81}Fe_{19}$ layer within Example 4. The magnetization curves are obtained with a vibrating magnetometer. As shown in FIG. 23, Example 3 experiences a decrease in the saturated magnetization, deterioration in the rectangularity of the hysteresis curve, and an increase in the coercive field after the thermal treatment at 380° C. This results from the interdiffusion between the AlCu layer and the $Ni_{81}Fe_{19}$ layer. In contrast, the magnetization curve of Example 4 is not influenced by the thermal treatment at 380° C. This results from that the $Al_2O_x$ prevents the interdiffusion between the AlCu layer and the $Ni_{81}Fe_{19}$ layer.

Next, the effect of the oxide layer 14 formed with $Al_2O_3$ or MgO against the interdiffusion between the top interconnection 3 and the free ferromagnetic layer 10 has been investigated with four samples described below:

Comparative Example 4 substrate/$Co_{90}Fe_{10}$ (2.5 nm)/$Ni_{81}Fe_{19}$ (7.5 nm)/Ta (6 nm)/AlCu (300 nm), Comparative Example 5 substrate/$Co_{90}Fe_{10}$ (2.5 nm)/$Ni_{81}Fe_{19}$ (7.5 nm)/Ta (50 nm)/AlCu (300 nm), Example 5

The Present Invention substrate/$Co_{90}Fe_{10}$ (2.5 nm)/$Ni_{81}Fe_{19}$ (7.5 nm)/$Al_2O_3$ (1 nm)/Ta (6 nm)/AlCu (300 nm), and Example 6

The Present Invention substrate/$Co_{90}Fe_{10}$ (2.5 nm)/$Ni_{81}Fe_{19}$ (7.5 nm)/MgO (1 nm)/Ta (6 nm)/AlCu (300 nm).

Comparative Example 4 corresponds a portion of the structure of FIG. 1 with the oxide layer 14 omitted, the portion being positioned over the tunnel dielectric layer 9 apart from the substrate 1. Comparative Example 5 is similar to Comparative Example 4 in the structure except for that the Ta layer, which corresponds with the top contact layer 15', is increased in thickness up to 50 nm, to prevents the diffusion from AlCu layer, which corresponds with the top interconnection 3. Example 5 corresponds with a portion of the structure shown in FIG. 1, the portion being positioned over the tunnel dielectric layer 9 apart from the substrate 1, with the oxide layer 14 formed with $Al_2O_3$ of 1 nm in thickness. Example 6 corresponds with a portion of the structure shown in FIG. 1, the portion being positioned over the tunnel dielectric layer 9 apart from the substrate 1, with the oxide layer 14 formed with MgO of 1 nm in thickness. For all of Comparative Examples 4 and 5, and Examples 5 and 6, the layered structure consisting of the $Co_{90}Fe_{10}$ layer and the $Ni_{81}Fe_{19}$ layer corresponds with the free ferromagnetic layer.

FIG. 25 illustrates changes in saturated magnetizations of the free ferromagnetic layers within Comparative Examples 4 and 5, and Examples 5 and 6 depending on the thermal treatment temperature. As shown in FIG. 25, Comparative Example 4 experiences reduction in the saturated magnetization and increase in the coercive force after the thermal treatment at 380° C.; the thermal treatment at 400° C. eliminates the saturated magnetization, and results in that the magnetization curve is resorted to exhibit paramagnetic properties. Although not exhibiting as severe increase of the coercive force as Comparative Example 4, Comparative Example 5 experiences decrease in the saturated magnetization as increase in the thermal treatment temperature. Furthermore, Comparative Example 4 experiences severe interdiffusion between the AlCu layer and the $Co_{90}Fe_{10}/Ni_{81}Fe_{91}$ layers, where the AlCu layer corresponds to the top interconnection, and the $Co_{90}Fe_{10}/Ni_{81}Fe_{91}$ layers correspond to the free ferromagnetic layer 10. Although preventing the interdiffusion between the Al layer and the layered structure of the $Co_{90}Fe_{10}$ layer, and the $Ni_{81}Fe_{19}$ layer, Comparative Example 5 exhibits the interdiffusion between the Ta layer of 50 nm in thickness and the structure consisting of the Al layer, the $Co_{90}Fe_{10}$ layer and the $Ni_{81}Fe_{19}$ layer, where the Ta layer corresponds with the top contact layer 15'. In contrast, Examples 5 and 6 do not exhibit changes in the saturated magnetizations for all the tested thermal treatment temperatures; this depicts that Examples 5 and 6 are resistant against the thermal treatment at relatively high temperatures up to 400° C.

Next, it has been investigated that the oxide layer 14 formed with $AlO_x$ layer achieves reduction in the thickness of the free ferromagnetic layer 10 down to or below 3 nm, using samples described below:

Example 7

The Present Invention substrate/Ta (10 nm)/$AlO_x$/$Ni_{81}Fe_{19}$/$AlO_x$/Ta (10 nm).

Figure 26:
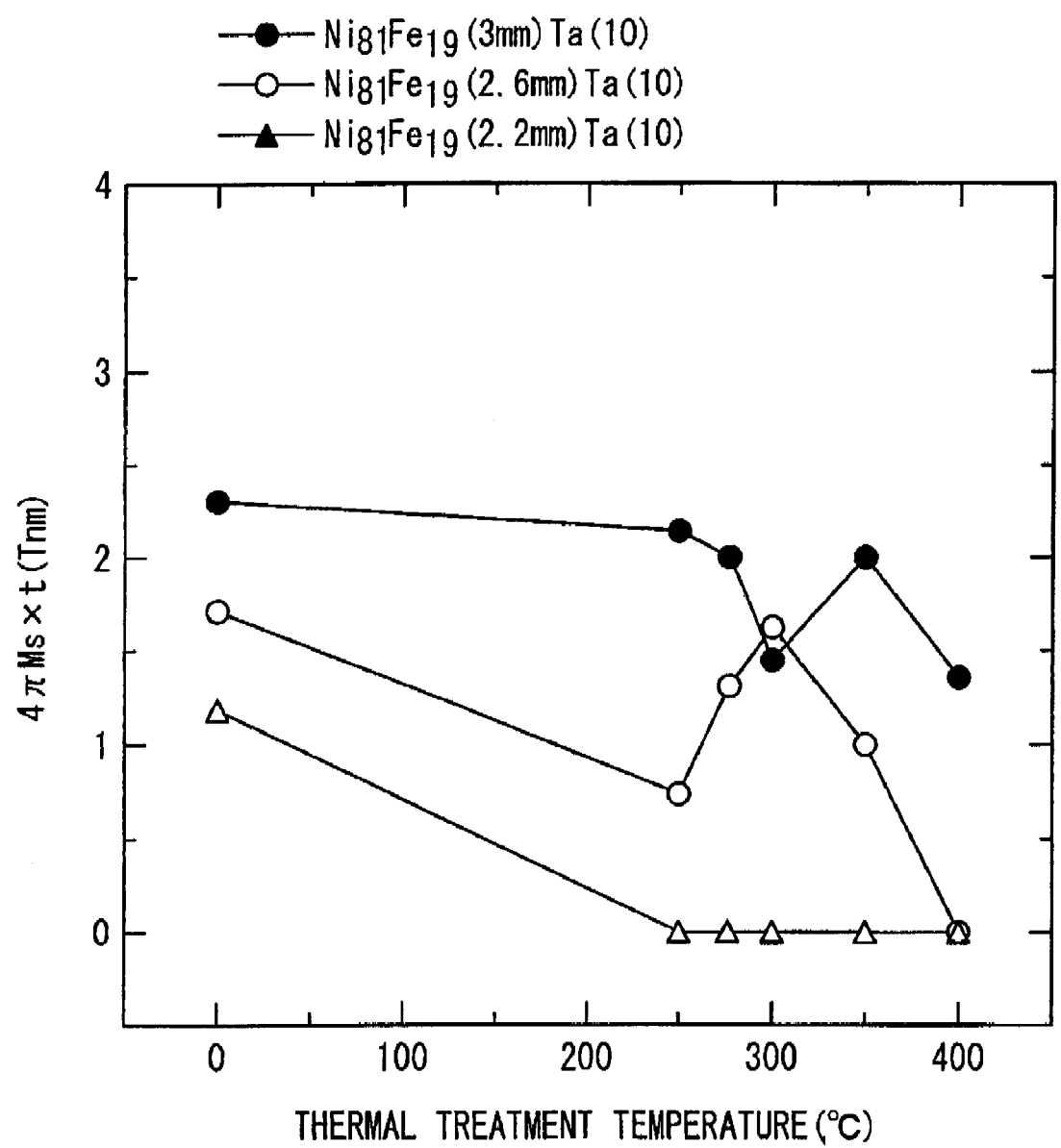
FIG. 26 is a graph illustrating influences on $4\pi M_s \cdot t$ of a free ferromagnetic layer having a thin film thickness t, caused by thermal treatment.

The $AlO_x$ layer relatively close to the substrate corresponds with the tunnel dielectric layer 9, and the $Ni_{81}Fe_{19}$ layer corresponds with the free ferromagnetic layer 10. Additionally, the $AlO_x$ layer relatively far from the substrate corresponds with the oxide layer 14, and the tantalum layer far from the substrate corresponds with the top contact layer 15. The $AlO_x$ layer corresponding with the tunnel dielectric layer 9 is formed through oxidization of an aluminum film of 1.5 nm in thickness with oxygen plasma, while the $AlO_x$ layer corresponding with the oxide layer 14 is formed through oxidization of an aluminum film of 0.65 nm in thickness with oxygen plasma. The thicknesses of the $Ni_{81}Fe_{19}$ layers are selected out of 3.0 nm, 2.6 nm, 2.2 nm, 1.4 nm and 1.0 nm. The $Ni_{81}Fe_{19}$ layers are formed through sputtering. The thermal treatment and measurement of magnetizations are implemented under the same conditions used for the samples in connection with FIG. 26. That is, the thermal treatment temperature ranges between 250° and 400° C., and the duration is 30 minutes. The magnetizations $M_s$ is measured with a vibrating magnetometer.

Figure 36:
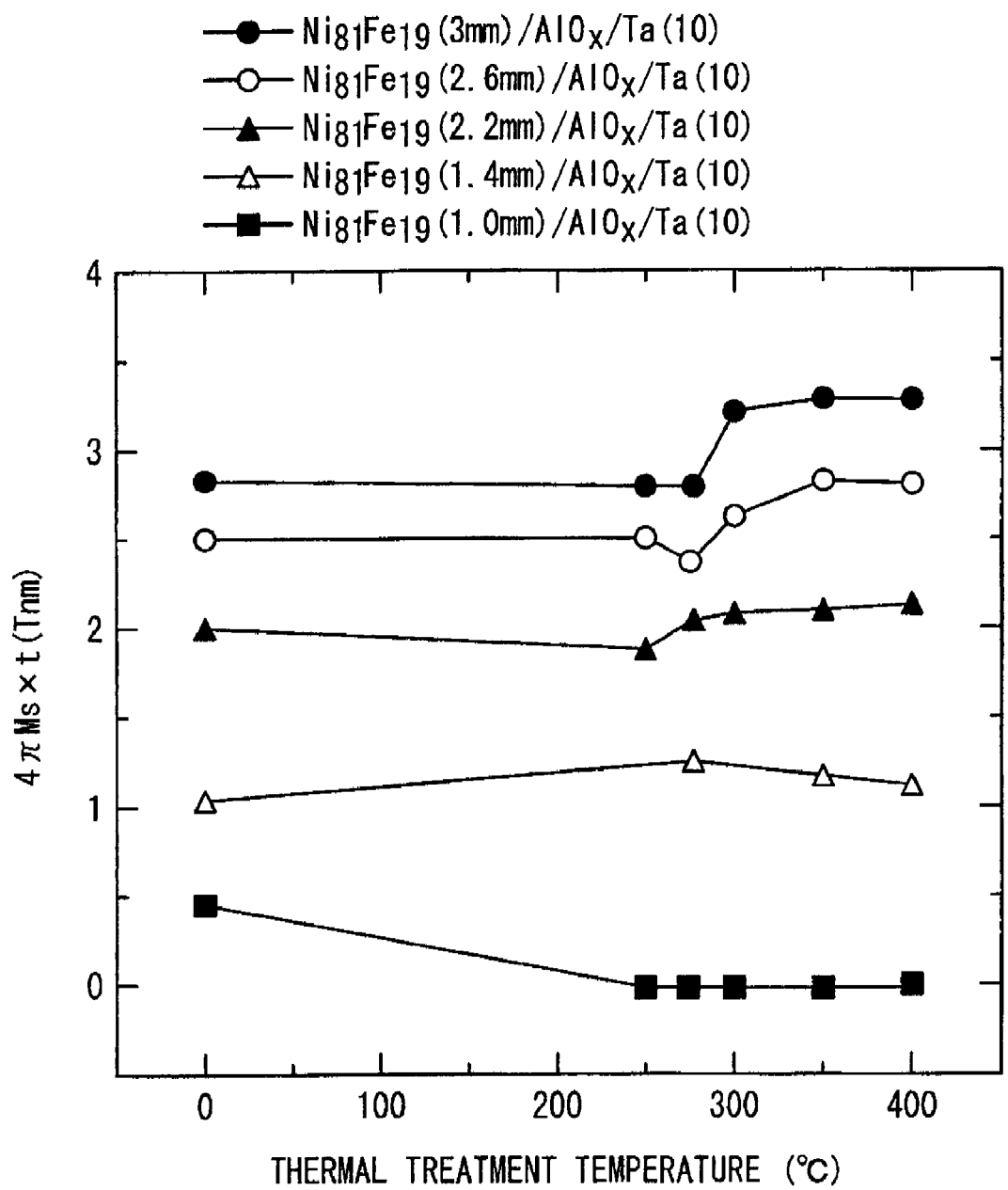
FIG. 36 is a graph illustrating an influence on $4\pi M_s \cdot t$ caused by thermal treatment obtained from Example 7.

As shown in FIG. 36, Example 7 exhibits stable $4\pi M_s \cdot t$ against the thermal treatment up to 400° C. even if the thickness thereof is reduced down to 1.4 nm. Example 7 achieves reduction in $4\pi M_s \cdot t$ down to 1.2 (T·nm) from the conventional value 2.2 (T·nm). The coercive force of the free ferromagnetic layers within Example 7 is stable, ranging between 0.5 and 1.5 (Oe). This implies that disposing the oxide layer 14 achieves the reduction in the free ferromagnetic layer 14, and thereby reduces the coercive force sufficiently and stably.

Next, the effect of the reduction in the product $M_s \cdot t$, which is allowed by forming the free ferromagnetic layer 10 with the ferromagnetic layer 31 and the diffusion layer 32, has been investigated with samples described below:

Example 8

The Present Invention substrate/Ta (10 nm)/AlO$_x$/Ni$_{81}$Fe$_{19}$ (1.6 nm)/non-magnetic metal layer/AlO$_x$/Ta (10 nm).

The AlO$_x$ film relatively close to the substrate corresponds with the tunnel dielectric layer 9. The Ni$_{81}$Fe$_{19}$ film corresponds with the ferromagnetic layer 31 within the free ferromagnetic layer 10, and the non-magnetic metal layer corresponds with the diffusion layer 32. The AlO$_x$ film relatively far from the substrate corresponds with the oxide layer 14, and the Ta film corresponds with the top contact layer 15. The AlO$_x$ film corresponding with the tunnel dielectric layer 9 is formed through oxidization of an aluminum film of 1.5 nm in thickness with oxygen plasma, while the AlO$_x$ film corresponding with the oxide layer 14 is formed through oxidization of an aluminum film of 0.65 nm in thickness with oxygen plasma. A tantalum films having thickness of 0.6 and 0.3 nm, a ruthenium film having a thickness of 0.3 nm, and a copper film having a thickness of 0.3 nm are used as the non-magnetic metal layer.

Figure 37:
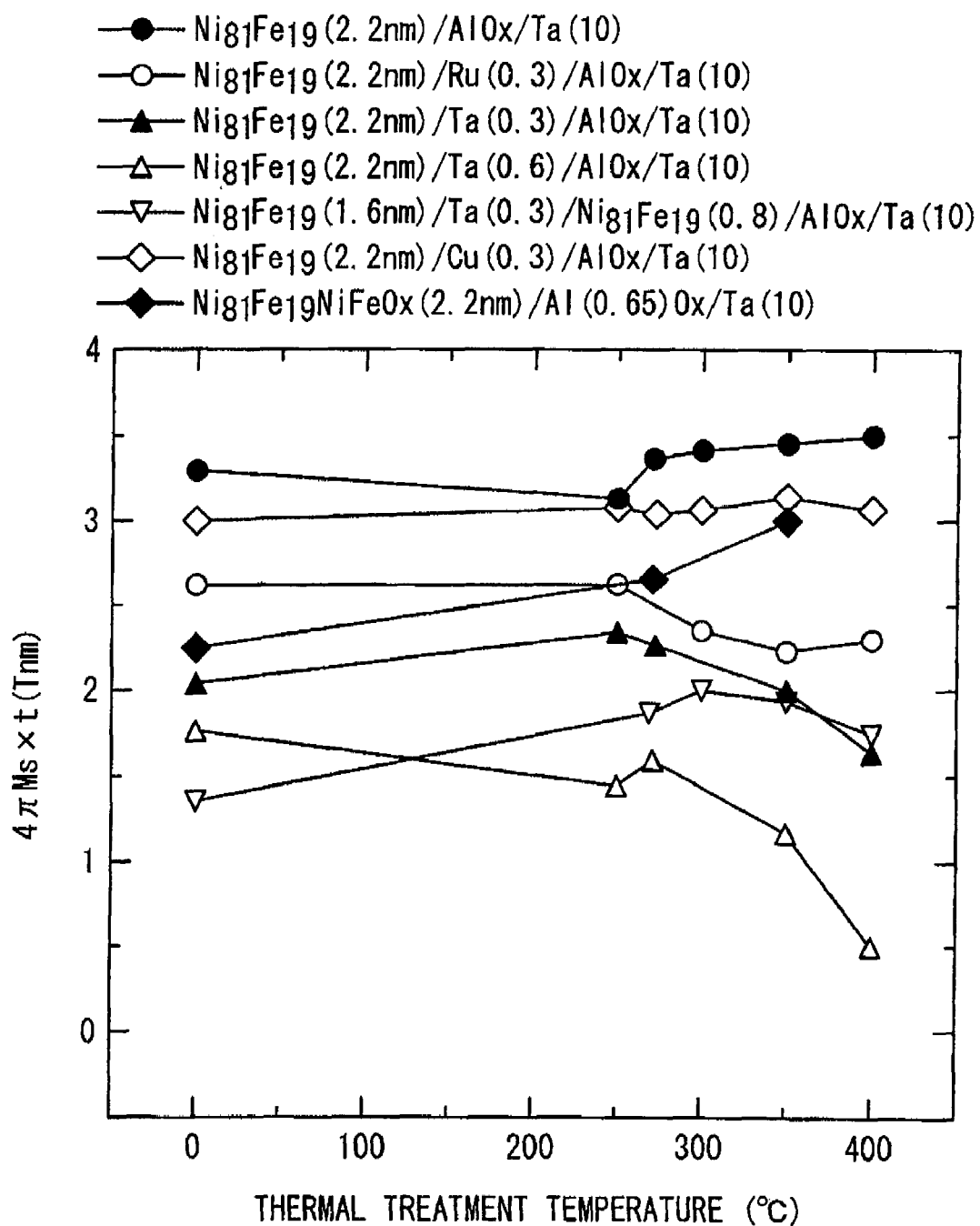
FIG. 37 is a graph illustrating influences on $4\pi M_s \cdot t$ caused by thermal treatment obtained from Comparative Example 7 and Examples 8, 9, and 10.

As illustrated in FIG. 37, the structure of Example 8 achieves reduction in 4πM$_s$·t of the Ni$_{81}$Fe$_{19}$ film down to or below 1 (T·nm). Additionally, 4 πM$_s$·t of the Ni$_{81}$Fe$_{19}$ film within Example 8 is stable against the thermal treatment at 400° C. The coercive forces of the Ni$_{81}$Fe$_{19}$ film of Example 8 are reduced below 1.5 (Oe); this implies that Example 8 achieves the sufficiently reduced coercive force.

Next, it has been investigated that disposing a non-magnetic metal layer in the free ferromagnetic layer 10 achieves the reduction in the product M$_s$·t using samples described below:

Example 9

The Present Invention substrate/Ta (10 nm)/AlO$_x$/Ni$_{81}$Fe$_{19}$ (1.6 nm)/non-magnetic metal layer/Ni$_{81}$Fe$_{19}$ (0.8 nm)/AlO$_x$/Ta (10 nm).

The AlO$_x$ film relatively close to the substrate corresponds with the tunnel dielectric layer 9, and the pair of the two Ni$_{81}$Fe$_{19}$ films, which sandwiches the non-magnetic metal layer, corresponds with the ferromagnetic layers 31 and 33, respectively. The non-magnetic metal layer corresponds with the diffusion layer 32. Additionally, the AlO$_x$ film relatively apart from the substrate corresponds with the oxide layer 14, and the Ta film relatively apart from the substrate corresponds with the top contact layer 15. The AlO$_x$ film corresponding with the tunnel dielectric layer 9 is formed through oxidization of an aluminum film of 1.5 nm in thickness with oxygen plasma, and the AlO$_x$ film corresponding with the oxide layer 14 is formed through oxidization of an aluminum film of 0.65 nm in thickness with oxygen plasma. A tantalum film of 0.3 nm is used as the non-magnetic metal film.

As illustrated in FIG. 37, Example 9 achieves reduction in 4πM$_s$·t of the free ferromagnetic layer 10 down to or below 1 (T·nm), and the 4πM$_s$ ·t is stable against the thermal treatment at 400° C. This proves that optimizing material, the thickness, and the position of the non-magnetic metal layer enables reduction and stabilization of the product 4πM$_s$·t of the free ferromagnetic layer 10.

Next, it has been investigated that oxidizing a portion of the free ferromagnetic layer 10 achieves reduction in the product M$_s$·t using samples described below:

Comparative Example 6 substrate/Ta (10 nm)/AlO$_x$/Ni$_{81}$Fe$_{19}$ (2.2 nm)/AlO$_x$/Ta (10 nm), and

Example 10

The Present Invention substrate/Ta (10 nm)/AlO$_x$/Ni$_{81}$Fe$_{19}$/NiFeO$_x$/AlO$_x$/Ta (10 nm).

The AlO$_x$ films relatively close to the substrates correspond with the tunnel dielectric layer, and the Ni$_{81}$Fe$_{19}$ layers correspond with the free ferromagnetic layer. In addition, the AlO$_x$ films relatively apart from the substrates correspond with the oxide layer 14, and the Ta films relatively apart from the substrates correspond with the top contact layer 15. The AlO$_x$ films corresponding with the tunnel dielectric layer 9 is formed through oxidization of an aluminum film of 1.5 nm in thickness. The Ni$_{81}$Fe$_{19}$ films, the NiFeO$_x$ film and the AlO$_x$ films corresponding with the oxide layer 14 are formed through processes described below; a Ni$_{81}$Fe$_{19}$ film of 2.2 nm in thickness is firstly deposited on the AlO$_x$ film corresponding with the tunnel dielectric layer 9. An aluminum film of 0.65 nm in thickness is deposited on the Ni$_{81}$Fe$_{19}$ film. After the deposition of the aluminum film, the surface of the aluminum film is subjected to oxygen plasma. Through subjecting to oxygen plasma, the aluminum film and a portion of the Ni$_{81}$Fe$_{19}$ film are oxidized to form the NiFeO$_x$ film and the AlO$_x$ film corresponding with the oxide layer 14.

As shown in FIG. 37, Example 10 exhibits 4πM$_s$·t of the free ferromagnetic layer 10 smaller than that of Comparative Example 6. This implies that partially oxidizing the free ferromagnetic layer 10 achieves the reduction in the product M$_s$·t.

In order to prove that the reduction in the produce M$_s$·t reduces the coercive force of the free ferromagnetic layer 10 having a size less than 1 micron, magnetizations of dot-patterned samples has been evaluated. Magnetoresistance elements have been patterned into samples of oval dots having the size of 0.5×1.0 μm, and the processed samples have been evaluated. Patterning the structure into dots is achieved by photolithography and ion milling techniques. The sectional structures of the processed samples are as follows:

Comparative Example 7 substrate/Ta (30 nm)/Ni$_{81}$Fe$_{19}$ (2 nm)/Ir$_{20}$Mn$_{80}$/Co$_{90}$Fe$_{10}$/AlO$_x$/Ni$_{81}$Fe$_{19}$ (3 nm)/Ta (10 nm), and

Example 11

The Present Invention substrate/Ta (30 nm)/Ni$_{81}$Fe$_{19}$ (2 nm)/Ir$_{20}$Mn$_{80}$/Co$_{90}$Fe$_{10}$/AlO$_x$/Ni$_{81}$Fe$_{19}$ (1.6 nm)/AlO$_x$/Ta (10 nm).

The AlO$_x$ film relatively close to the substrate corresponds with the tunnel dielectric layer 9, and the Ni$_{81}$Fe$_{19}$ layer disposed on the AlO$_x$ film corresponding with the tunnel dielectric layer 9 corresponds with the free ferromagnetic layer 10. Additionally, the AlO$_x$ film relatively apart from the substrate corresponds with the oxide layer 14, and the Ta film relatively apart from the substrate corresponds with the top contact layer 15. The AlO$_x$ film corresponding with the tunnel dielectric layer 9 is formed through oxidization of an aluminum film of 1.5 nm in thickness with oxygen plasma, and the AlO$_x$ film corresponding with the oxide layer 14 is formed through oxidization of an aluminum film of 0.65 nm in thickness with oxygen plasma. A Ta film of 0.3 nm in thickness is used as the non-magnetic layer. The free ferromagnetic layer 10 of Comparative Example 7 has a thickness of 3.0 nm, which is the minimum value achieved by the conventional technique. The product $4\pi M_s \cdot t$ of Comparative Example 7 is 2.2 (T·nm), while the product $4\pi M_s \cdot t$ of Example 11 is 1.5 (T·nm).

FIG. 38 illustrates magnetization curves of the free ferromagnetic layers of Comparative Example 7 and Example 11. It should be noted that the offset magnetic fields are cancelled to appropriately compare the coercive forces. The free ferromagnetic layer of Example 11 exhibits a coercive force of 10 (Oe), which is smaller than that of Example 7; Example 7 exhibits a coercive force of 18 (Oe). As thus described, Example 11, which exhibits reduction in $4\pi M_s \cdot t$, also exhibits reduction in the coercive force.

Next, it has been investigated that disposing the oxide layer 14 improves rectangularity of the magnetoresistance curve of the free ferromagnetic layer, and also reduces variation in the coercive force, using samples of magnetoresistance elements having layered structures as described below:

Comparative Example 8 substrate/Ta (30 nm)/NiFe(2 nm)/Ir$_{20}$Mn$_{80}$ (10 nm)/Co$_{90}$Fe$_{10}$ (1.5 nm)/AlO$_x$/NiFe (3 nm)/Ta (30 nm), Comparative Example 9 substrate/Ta (30 nm)/NiFe (2 nm)/Ir$_{20}$Mn$_{80}$ (10 nm)/Co$_{90}$Fe$_{10}$ (1.5 nm)/AlO$_x$/NiFe (4 nm)/Ta (30 nm), and Example 12

The Present Invention substrate/Ta (30 nm)/NiFe (2 nm)/Ir$_{20}$Mn$_{80}$ (10 nm)/Co$_{90}$Fe$_{10}$ (1.5 nm)/AlO$_x$/NiFe (2 nm)/AlO$_x$/Ta (30 nm).

The AlO$_x$ films relatively close to the substrate correspond with the tunnel dielectric layer 9, and the Ni$_{81}$Fe$_{19}$ layers disposed on the AlO$_x$ films corresponding with the tunnel dielectric layer 9 correspond with the free ferromagnetic layer 10. All of the NiFe layers of Comparative Examples 8 and 9, and Example 12 have nickel concentrations less than 82%; therefore, all the magnetostriction constants of these NiFe layers are positive. It should be noted that the nickel concentrations of the NiFe layers are different from one another, and thus the magnetostriction constants are different from one another. The magnetostriction constants of the NiFe layers of Comparative Examples 8 and 9, and Example 12 are approximately $2 \times 10^{-5}$, $9 \times 10^{-7}$, and $5 \times 10^{-6}$, respectively.

The magnetoresistance elements are fabricated through processes as described below; after forming word lines of AlCu interconnections (which correspond with the bottom interconnection 2), the word lines are covered with SiO$_x$ films, which functions as interlayer dielectrics. After the SiO$_x$ films are planarized with a CMP (chemical mechanical polishing) technique, stacks of layers for forming the magnetoresistance elements are disposed on the planarized SiO$_x$ films. The stacks are formed through a magnetron sputtering technique. After subjecting the stacks to a thermal treatment at 275° C. with a magnetic field of 5 kOe applied thereto, the stacks are processed through photolithography and ion milling techniques into ovals having a size of 0.7×1.4 μm to obtain the magnetoresistance elements. The aspect ratio of the magnetoresistance elements is two. The contact interfaces between the free ferromagnetic layers and the tunnel dielectric layers within the magnetoresistance elements are positioned over the word lines. The magnetoresistance elements are not directly connected to the word lines. The distance of the contact interfaces from the word lines in the magnetoresistance elements is approximately 200 nm. And the width of the word lines is 1 μm. The major axes of the magnetoresistance elements are directed in the word line direction, and the crystalline magnetic anisotropy of the magnetoresistance elements has its easy axis directed in the major axis direction through thermal treatment and sputtering with a magnetic field applied thereto. The width of the word lines is approximately sized to be as large as the width of the magnetoresistance elements in the minor axis direction. SiO$_x$ films are additionally deposited as interlayer dielectrics to cover the magnetoresistance elements. After forming via holes through the deposited SiO$_x$ films to expose the upper surfaces of the magnetoresistance elements, AlCu alloy films are then deposited to entirely cover the SiO$_x$ films. This followed by forming bit lines (which correspond with the top interconnection 3) through pattering the AlCu alloy films with photolithography and etching techniques. The bit lines and the word lines are perpendicular. The word lines exert strong compressive stress in the minor axis direction of the magnetoresistance elements. Since the magnetostriction constants of the free ferromagnetic layers within the fabricated magnetoresistance elements are positive, stress-induced magnetic anisotropy with the easy axis in the major axis direction of the magnetoresistance elements is induced. Therefore, the crystalline, shape-induced and stress-induced magnetic anisotropy are approximately directed in the same direction, and thus, the magnetoresistance elements exhibit uniaxial magnetic anisotropy having the easy axis directed in the major axis direction.

Figure 39A:
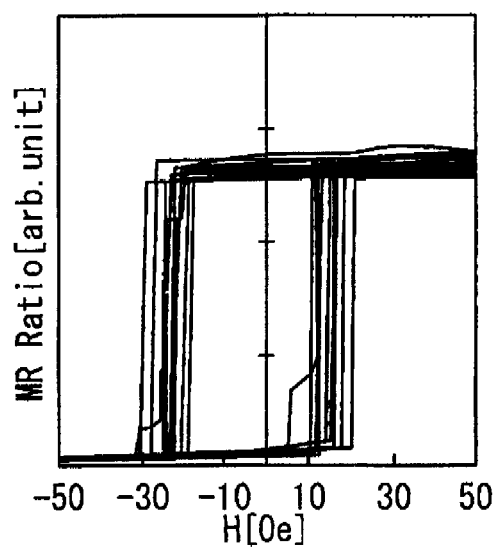
FIG. 39A illustrates a magnetization curve of a free ferromagnetic layer of Comparative Example 8.
Figure 39B:
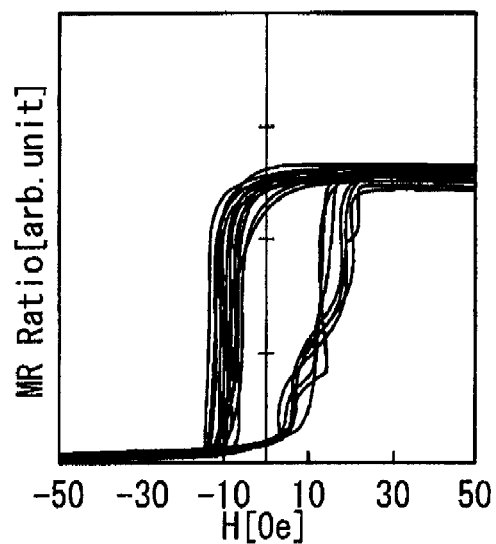
FIG. 39B illustrates a magnetization curve of a free ferromagnetic layer of Comparative Example 9.
Figure 39C:
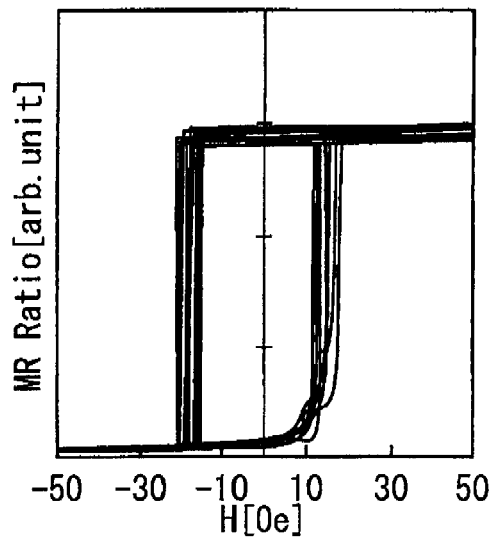
FIG. 39C illustrates a magnetization curve of a free ferromagnetic layer of Example 12.

A set of ten samples are selected out of the magnetoresistance elements for each of Comparative Examples 8 and 9 and Example 12, and magnetoresistance curves of the free ferromagnetic layers of the selected samples have been measured. FIGS. 39A through 39C illustrate the measured magnetoresistance curves. As shown in FIG. 39A, the free ferromagnetic layer of Comparative Example 8 exhibits a reduced $4\pi M_s \cdot t$ value of 2.2 (T·nm). Although the shape-induced magnetic anisotropy thereof is small, the free ferromagnetic layer of Comparative Example 8 exhibits a coercive force of 21 (Oe), which is the largest value. It is considered that the increase in the coercive field results from an increase in the stress-induced magnetic anisotropy caused by the increased magnetostriction constant thereof. Additionally, although exhibiting an improved rectangularity of the magnetoresistance curves, Comparative Example 8 suffers from the variation of the magnetoresistance curves. This implies that a severe interdiffusion occurs between the Ta film and the NiFe film, and thereby leads to the variation in the magnetostriction constants caused by the composition variation; these result from that the free ferromagnetic layer has a reduced thickness of 3 nm, which is close to the conventional lower limit.

As shown in FIG. 39B, although having the smallest coercive force of 13 (Oe), the magnetoresistance elements of Comparative Example 9 experience deterioration of the rectangularity of the magnetoresistance curves; the loops thereof are slanting. Additionally, Comparative Example 9 suffers from Barkhausen noise. It is considered that this reflects the fact that the coercive force is decreased due to the reduction of the uniaxiality caused by the substantially eliminated stress-induced magnetic anisotropy, which is caused by the extremely reduced magnetostriction constant thereof, and that the influence of the demagnetizing field is enhanced by an increase in $4\pi M_s \cdot t$ of the free ferromagnetic layer up to 3.2 (T·nm) and a reduction in the aspect ratio of the elements down to 2. With respect to the magnetoresistance elements of Comparative Example 9, reducing the demagnetizing field and enhancing the shape-induced magnetic anisotropy through increasing the aspect ratio are required to improve the rectangularity and variation of the magnetoresistance curves. This faces problems of an increase in the element size and coercive force.

As shown in FIG. 39C, the magnetoresistance elements of Example 12 exhibit superior characteristics; the coercive force of the free ferromagnetic layer is reduced down to 16 (Oe), the rectangularity of the magnetoresistance curves improved, and the variation in the coercive force is most reduced. It is considered that this results from that the magnetoresistance elements in accordance with the present invention achieve reduction in the variation of the magnetostriction constant, and thereby exhibits stable stress-induced magnetic anisotropy of appropriate strength, and also reduce the demagnetizing field and shape-induced magnetic anisotropy through minimizing $4\pi M_s \cdot t$ of the free ferromagnetic layer approximately down to 2 (T·nm).

An experiment described below has proved that the magnetoresistance element in accordance with the present invention, which have the stress-induced magnetic anisotropy controlled appropriately, achieves both a reduced aspect ratio and stabilized properties. Magnetoresistance elements having various aspect ratios in accordance with Comparative Example 9 and Example 10 have been fabricated. The lengths of the minor axes of the magnetoresistance elements are 0.5 or 0.7 μm, and the aspect ratios thereof are in the range between 1.0 and 3.5. The samples according to Example 12, which have an increased magnetostriction constant, exhibit an increased ratio of the stress-induced magnetic anisotropy to the shape-induced magnetic anisotropy, denoted by K2/K3; the ratio K2/K3 is increased up to or above 0.6 for all the tested aspect ratio. It should be noted that ones having the aspect ratio less than 1.6 out of the samples of Example 12 exhibit the stress-induced magnetic anisotropy larger than the shape-induced magnetic anisotropy, that is, exhibit the ratio K2/K3 more than 1.0. 30 magnetoresistance elements are fabricated for each condition, and magnetoresistance curves of the fabricated magnetoresistance elements have been evaluated. This followed by the calculation of yields. In calculating the yields, magnetoresistance elements exhibiting abnormal magnetoresistance curves, such as those exhibiting Barkhausen noise and tilt loops in the magnetoresistance curves, are defined as being defective samples.

FIG. 40 is a graph illustrating the yields of the magnetoresistance elements. The magnetoresistance elements according to Comparative Example 9, which have reduced magnetostriction constants (that is, exhibit reduced stress-induced magnetic anisotropy), achieves sufficiently large yield only for the samples of 3.5 in aspect ratio. This implies that the samples of Comparative Example 9 require stabilization of the characteristics using the shape-induced magnetic anisotropy. In contrast, the magnetoresistance elements according to Example 12, which enjoy sufficiently large stress-induced magnetic anisotropy, achieve sufficiently large yields for the entire range between 1.0 and 3.5. This indicates that enhancing the stress-induced magnetic anisotropy beyond the shape-induced magnetic anisotropy achieves a sufficiently large yield for the aspect ratio below 2.0.

What is claimed is:

1. A magnetoresistance device comprising:
   a magnetoresistance element including:
   a free ferromagnetic layer having reversible spontaneous magnetization,
   a fixed ferromagnetic layer having fixed spontaneous magnetization, and
   a tunnel dielectric layer disposed between said free and fixed ferroelectric layer;
   a non-magnetic conductor electrically connected to said fixed ferromagnetic layer without involving said tunnel dielectric layer to provide electrical connection between said magnetoresistance element to another element; and
   a diffusion barrier structure connected between said non-magnetic conductor and said fixed ferromagnetic layer,
   wherein said diffusion barrier structure is formed of material selected from the group consisting of: $MgO_x$, $CaO_x$, $LiO_x$, and $HfO_x$,
   said magnetoresistance element further includes a manganese-including antiferromagnetic layer, and
   said antiferromagnetic layer is positioned between said fixed ferromagnetic layer and said diffusion barrier layer.

2. The magnetoresistance device according to claim 1, wherein said fixed ferromagnetic layer comprises:
   a ferromagnetic layer directly contacted with said tunnel dielectric layer, and
   a composite magnetic layer disposed between said ferromagnetic layer and said antiferromagnetic layer, and
   wherein said composite magnet layer is made of mixture including non-oxidized metal ferromagnetic material as main material, and oxide material as sub material, said oxide material being oxide of non-magnetic element more reactive to oxygen than said metal ferromagnetic material.

3. The magnetoresistance device according to claim 2, wherein said ferromagnetic layer and said metal ferromagnetic material included in said composite magnetic layer is made of a metal ferromagnetic alloy including cobalt as main material.

4. The magnetoresistance device according to claim 1, wherein a through-thickness resistance of said diffusion barrier structure is smaller than that of said tunnel dielectric layer.

5. The magnetoresistance device according to claim 4, wherein said diffusion barrier structure is a film having a thickness less than 5 nm.

6. The magnetoresistance device according to claim 1, wherein said diffusion barrier structure is made of oxide of element having a free energy of oxide formation less than those of elements included in layers connected on top and bottom surfaces of said diffusion barrier structure.

7. The magnetoresistance device according to claim 1, said diffusion barrier structure is an oxide layer and made of a same material as said tunnel dielectric layer.

8. The magnetoresistance device according to claim 7, wherein said oxide layer is thinner than said tunnel dielectric layer.

* * * * *

UNITED STATES PATENT AND TRADEMARK OFFICE
CERTIFICATE OF CORRECTION

PATENT NO. : 7,742,263 B2
APPLICATION NO. : 12/138158
DATED : June 22, 2010
INVENTOR(S) : Yoshiyuki Fukumoto, Ken-ichi Shimura and Atsushi Kamijo It is certified that error appears in the above-identified patent and that said Letters Patent is hereby corrected as shown below:

Column 17, Line 56, delete "diffusion layer 31" and insert --diffusion layer 32--.

Column 30, Line 48, delete "$Co_{90}Fe_{19}$" and insert --$Co_{90}Fe_{10}$--.

Signed and Sealed this

Twenty-third Day of November, 2010

David J. Kappos
*Director of the United States Patent and Trademark Office*